(12) United States Patent
Ohto et al.

(10) Patent No.: US 7,687,917 B2
(45) Date of Patent: Mar. 30, 2010

(54) SINGLE DAMASCENE STRUCTURE SEMICONDUCTOR DEVICE HAVING SILICON-DIFFUSED METAL WIRING LAYER

(75) Inventors: Koichi Ohto, Kanagawa (JP); Toshiyuki Takewaki, Kanagawa (JP); Tatsuya Usami, Kanagawa (JP); Nobuyuki Yamanishi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/650,193

(22) Filed: Aug. 28, 2003

(65) Prior Publication Data

US 2004/0046261 A1    Mar. 11, 2004

Related U.S. Application Data

(63) Continuation-in-part of application No. 10/281,321, filed on Oct. 28, 2002, now abandoned.

(30) Foreign Application Priority Data

| May 8, 2002 | (JP) | .............................. | 2002-132780 |
| Oct. 17, 2002 | (JP) | .............................. | 2002-302841 |
| May 5, 2003 | (JP) | .............................. | 2003-130484 |

(51) Int. Cl.
*H01L 23/48* (2006.01)
(52) U.S. Cl. .............................. 257/774; 257/E23.144; 257/E23.167; 257/E23.145; 257/750; 257/759; 257/635; 257/636; 257/751; 257/758; 257/762
(58) Field of Classification Search .......... 257/E23.144, 257/E23.167, E23.145, 774, 750, 758, 257, 257/762, 759, 636, 635, 751, 752, E21.262, 257/E21.311, E21.576, E21.577, E21.579, 257/E21.582, E21.591, E23.171; 438/622, 438/627, 629, 687
See application file for complete search history.

(56) References Cited

U.S. PATENT DOCUMENTS

| 6,251,775 | B1 | | 6/2001 | Armbrust et al. | |
| 6,518,184 | B1 | * | 2/2003 | Chambers et al. | ............ 438/687 |
| 6,627,554 | B1 | * | 9/2003 | Komada | ...................... 438/710 |
| 6,737,728 | B1 | * | 5/2004 | Block et al. | .................. 257/532 |
| 6,787,480 | B2 | * | 9/2004 | Aoki et al. | ................... 438/775 |
| 2002/0140101 | A1 | * | 10/2002 | Yang et al. | ................... 257/762 |
| 2002/0155702 | A1 | * | 10/2002 | Aoki et al. | ................... 438/653 |
| 2002/0192937 | A1 | * | 12/2002 | Ting et al. | ................... 438/618 |
| 2003/0068582 | A1 | * | 4/2003 | Komada et al. | ............. 430/317 |
| 2003/0111730 | A1 | * | 6/2003 | Takeda et al. | ................ 257/758 |
| 2003/0137050 | A1 | * | 7/2003 | Chambers et al. | ........... 257/750 |
| 2004/0147117 | A1 | * | 7/2004 | Ngo et al. | .................... 438/687 |
| 2004/0150113 | A1 | * | 8/2004 | Tonegawa | .................... 257/758 |
| 2004/0266171 | A1 | * | 12/2004 | Aoki et al. | ................... 438/622 |
| JP | 06-177128 | | 6/1994 | | |
| JP | 11-186273 | | 7/1999 | | |
| JP | 11-204523 | | 7/1999 | | |
| JP | 2000-058544 | | 2/2000 | | |
| JP | 2000-150517 | | 5/2000 | | |
| JP | 2000-349085 | | 12/2000 | | |
| JP | 2001-291720 | | 10/2001 | | |
| JP | 2003-347299 | | 12/2003 | | |
| KR | 1998-084723 | | 1/1998 | | |
| KR | 1999-005857 | | 1/1999 | | |

* cited by examiner

FOREIGN PATENT DOCUMENTS

JP          03-262125 A      11/1991

(Continued)

*Primary Examiner*—Alexander Oscar Williams
(74) *Attorney, Agent, or Firm*—Sughrue Mion, PLLC

(57) ABSTRACT

In a semiconductor device, an insulating interlayer having a groove is formed on an insulating underlayer. A silicon-diffused metal layer including no metal silicide is buried in the groove. A metal diffusion barrier layer is formed on the silicon-diffused metal layer and the insulating interlayer.

13 Claims, 87 Drawing Sheets

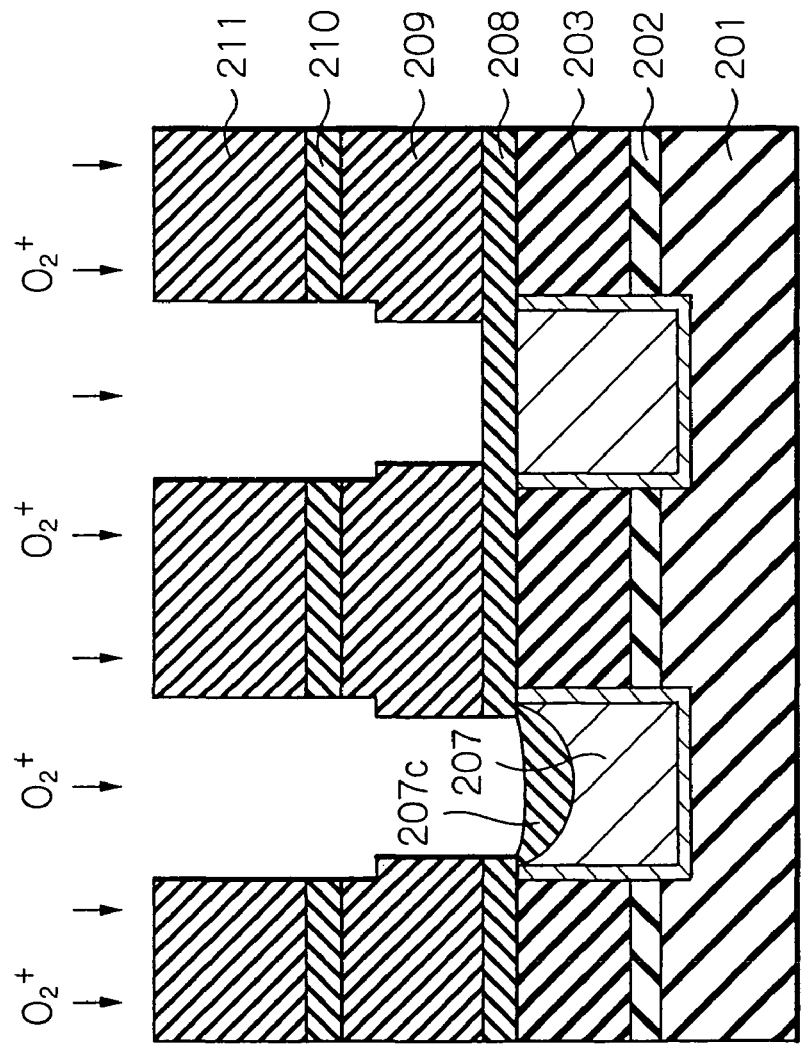

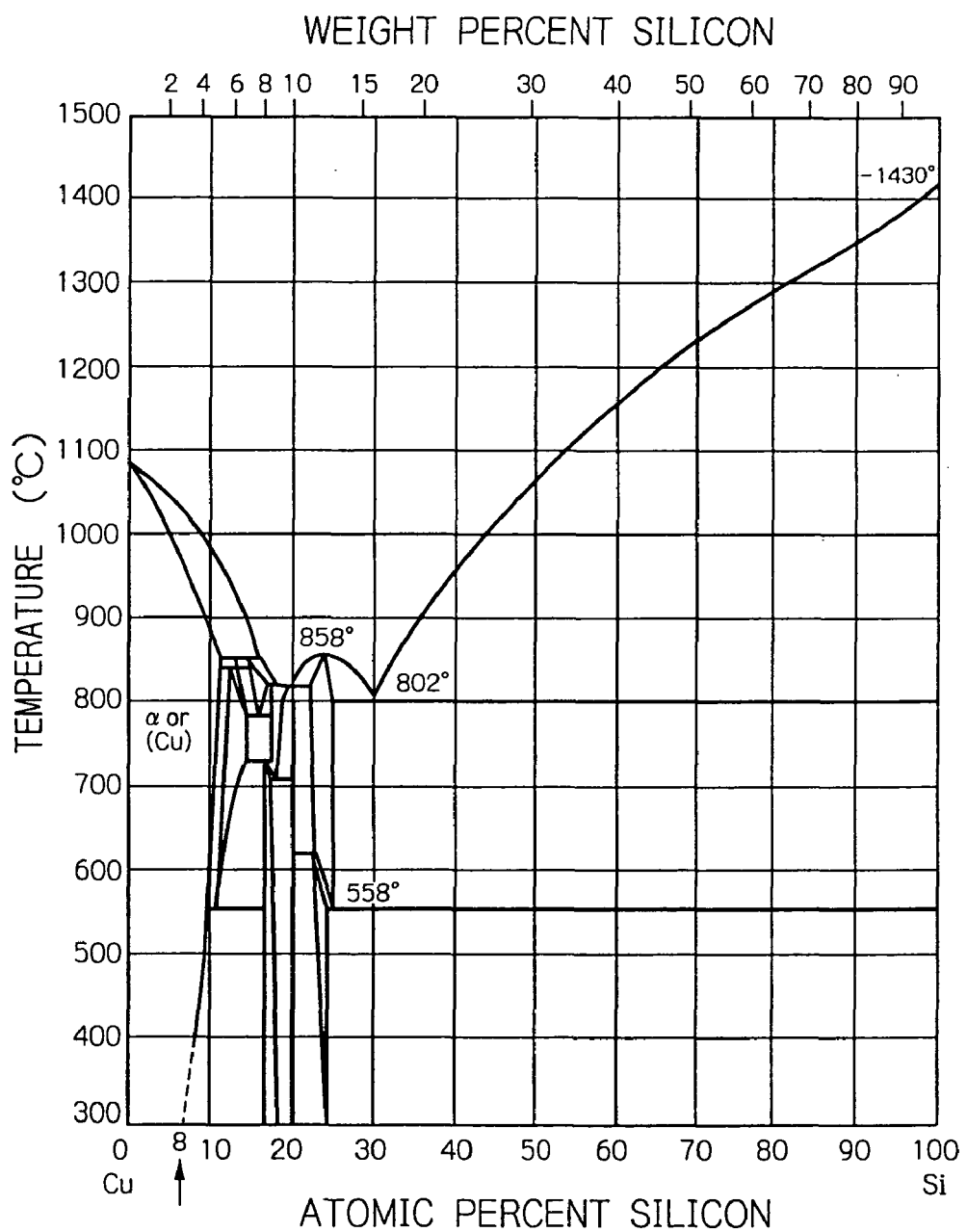

Fig. 8C

| TEMPERATURE (°C) | 200 | 225 | 250 | 300 | 350 | 400 |
|---|---|---|---|---|---|---|
| LAYER 111 | ABSENCE OF Si | ABSENCE OF Si | PRESENCE OF Si | PRESENCE OF Si | PRESENCE OF Si | PRESENCE OF Si |

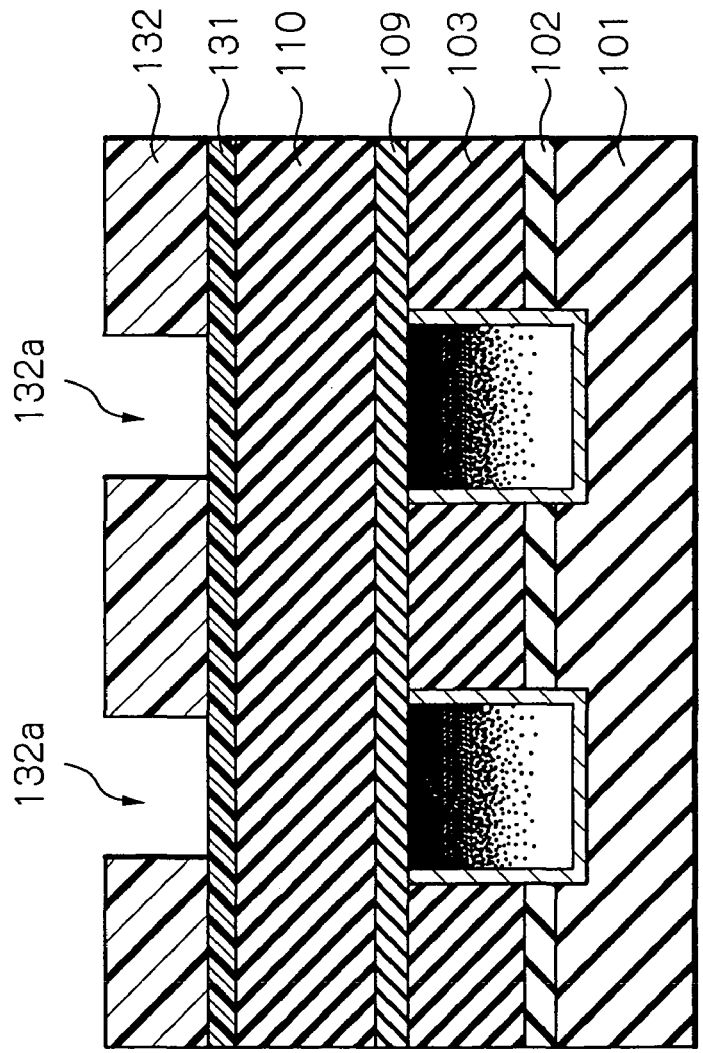

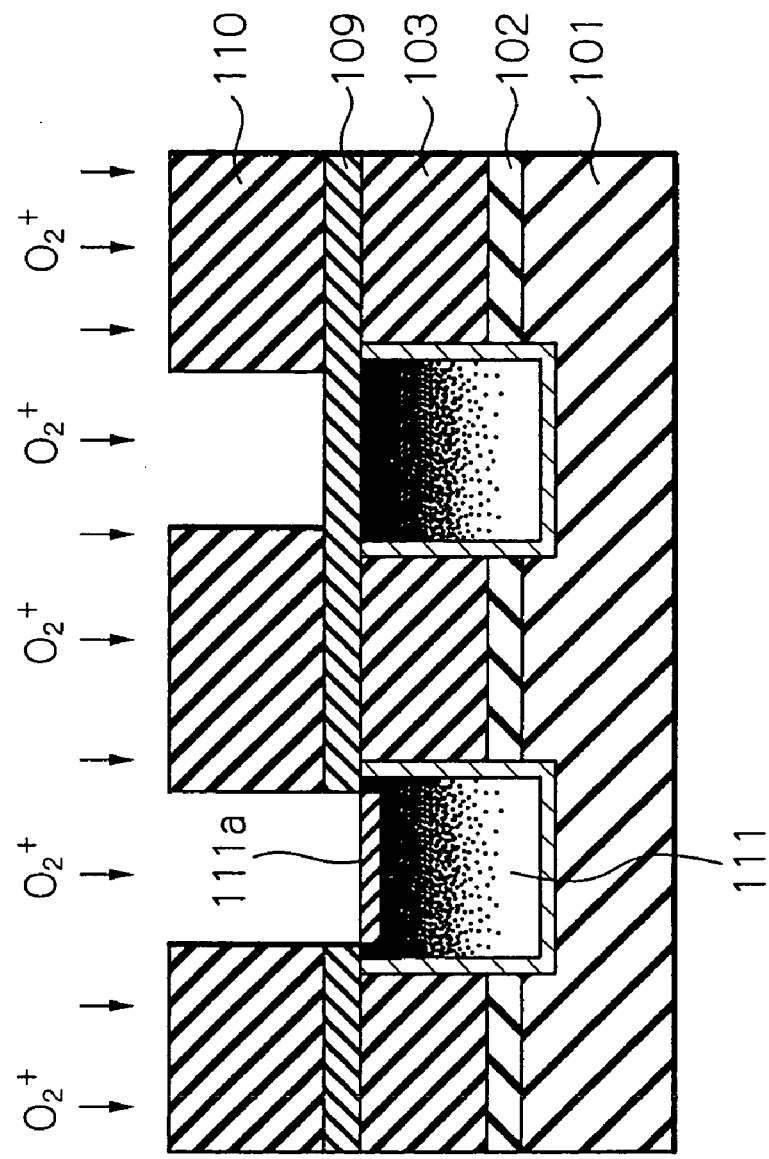

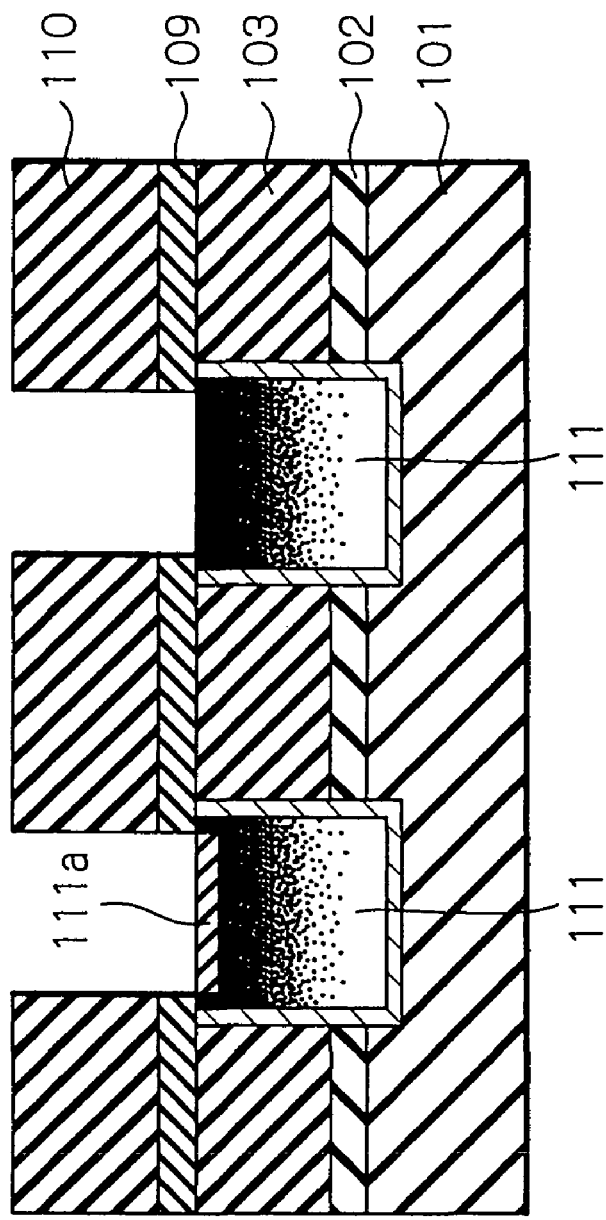

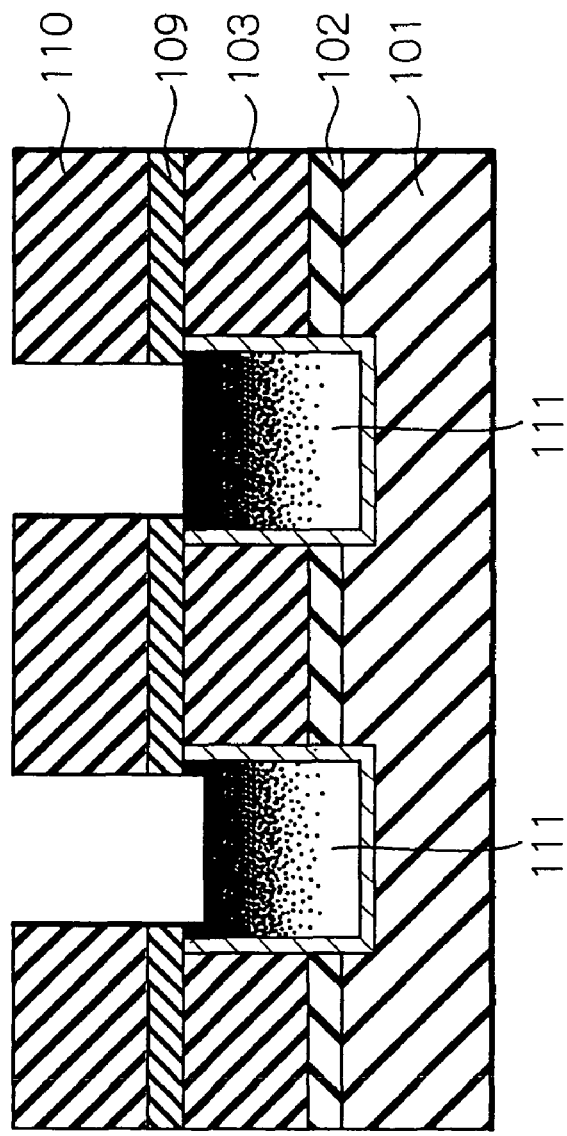

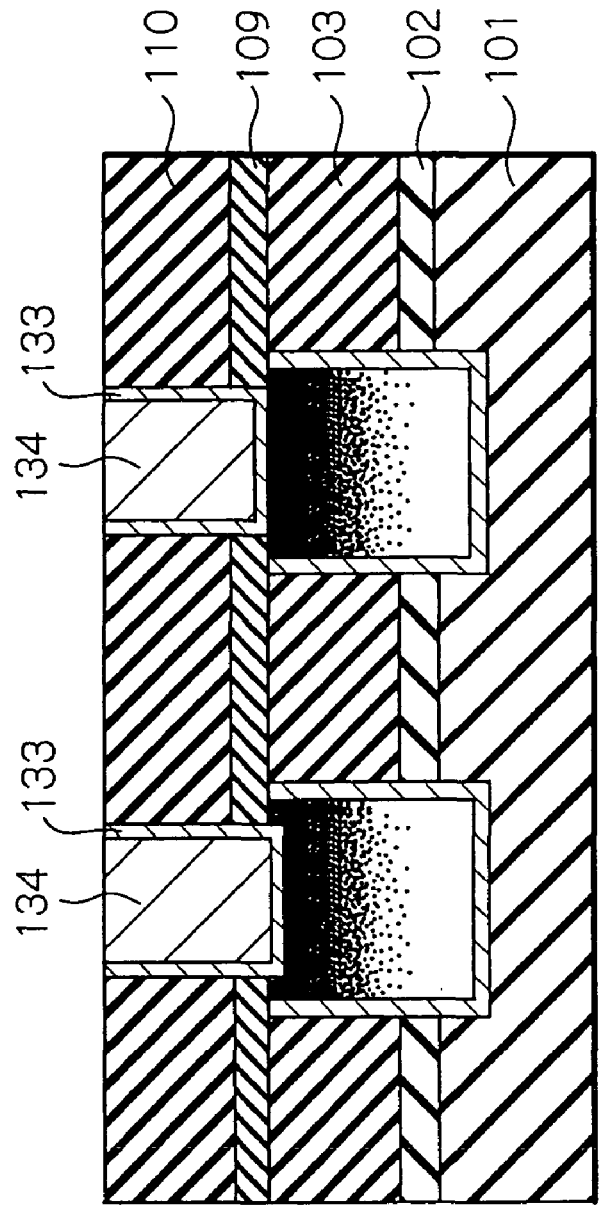

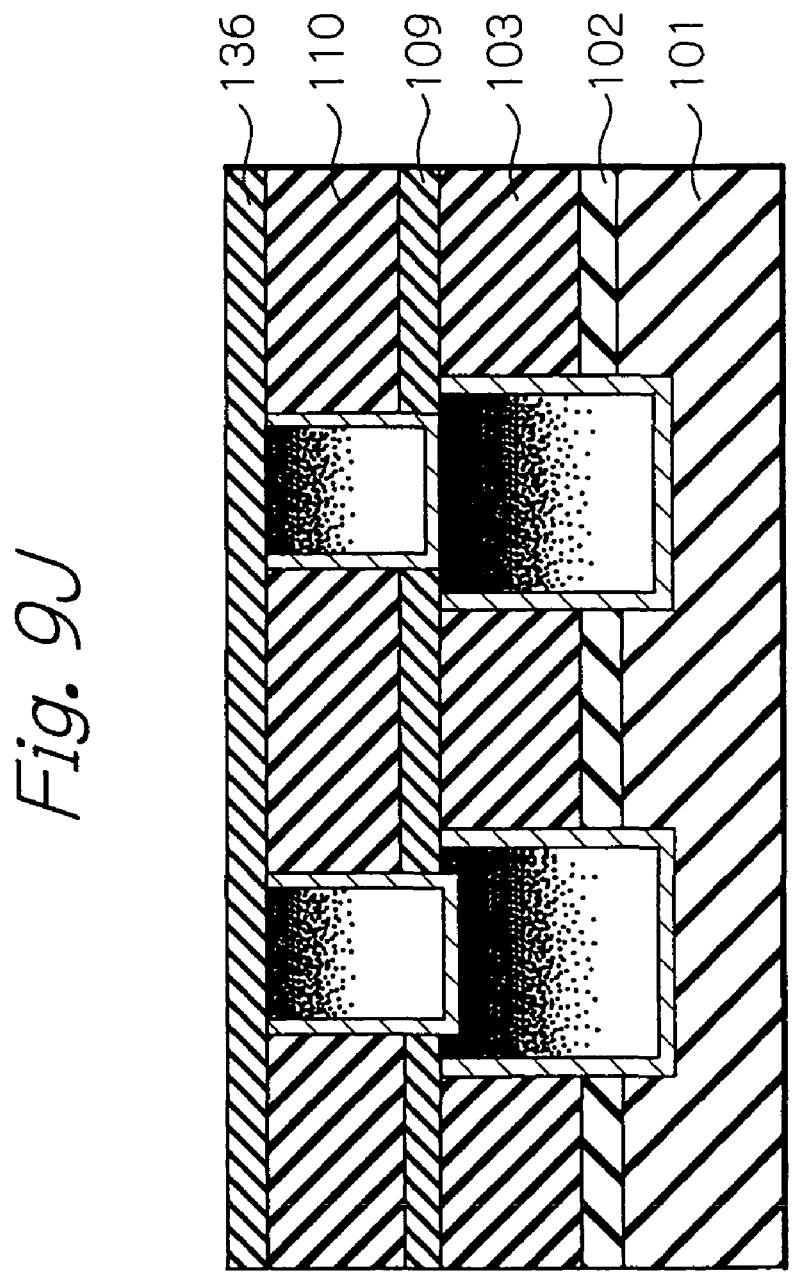

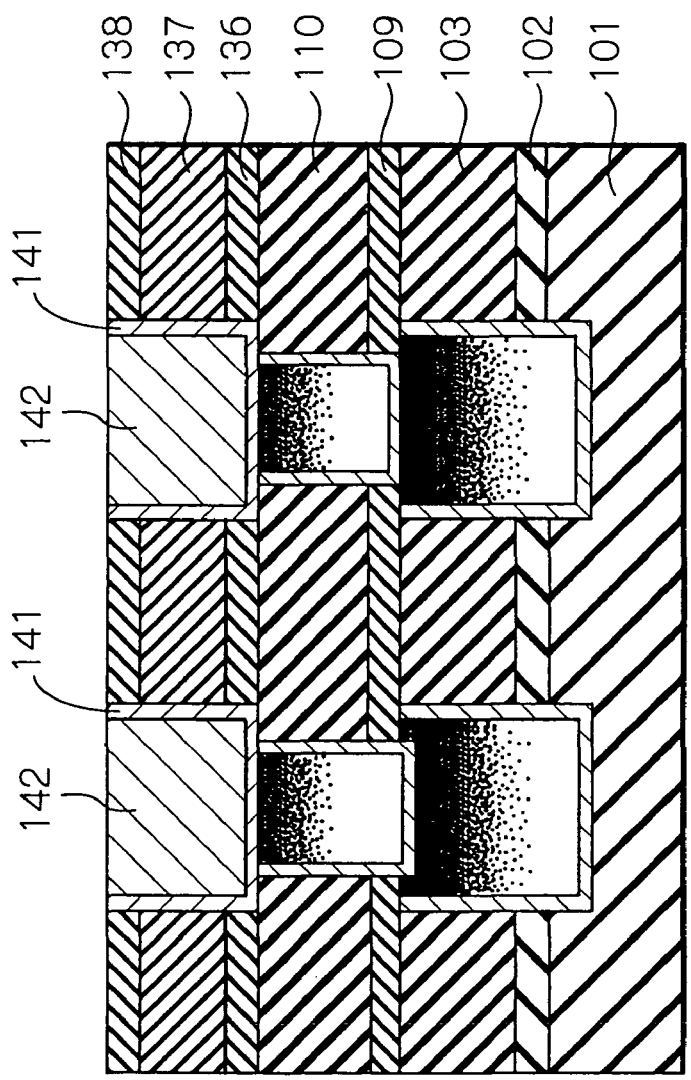

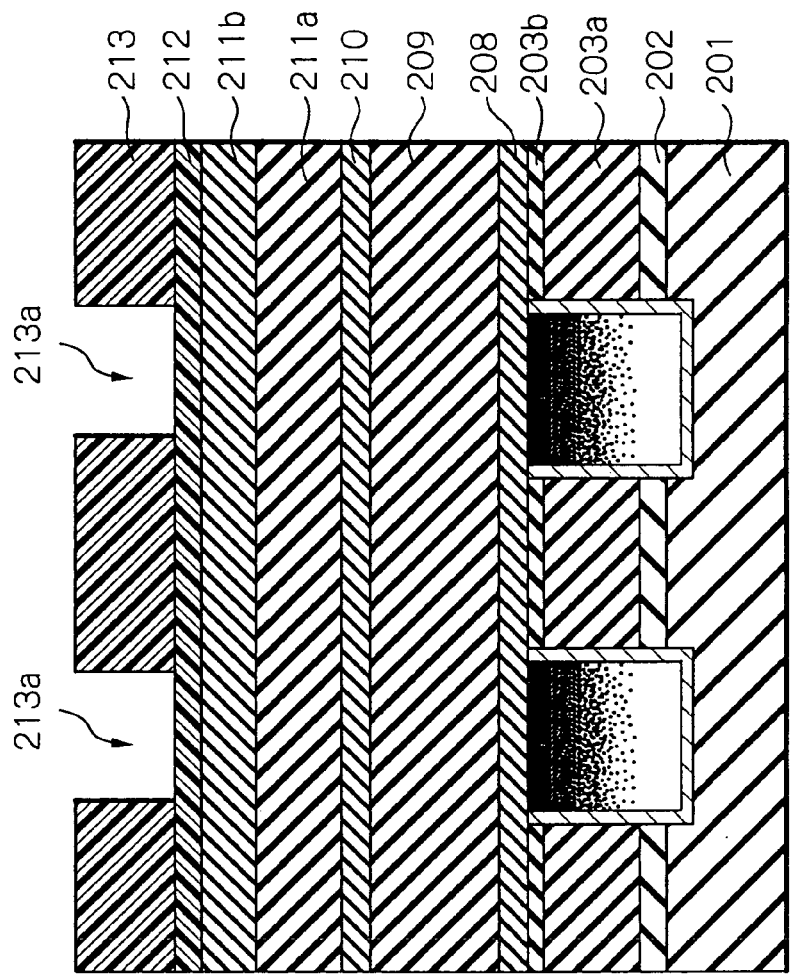

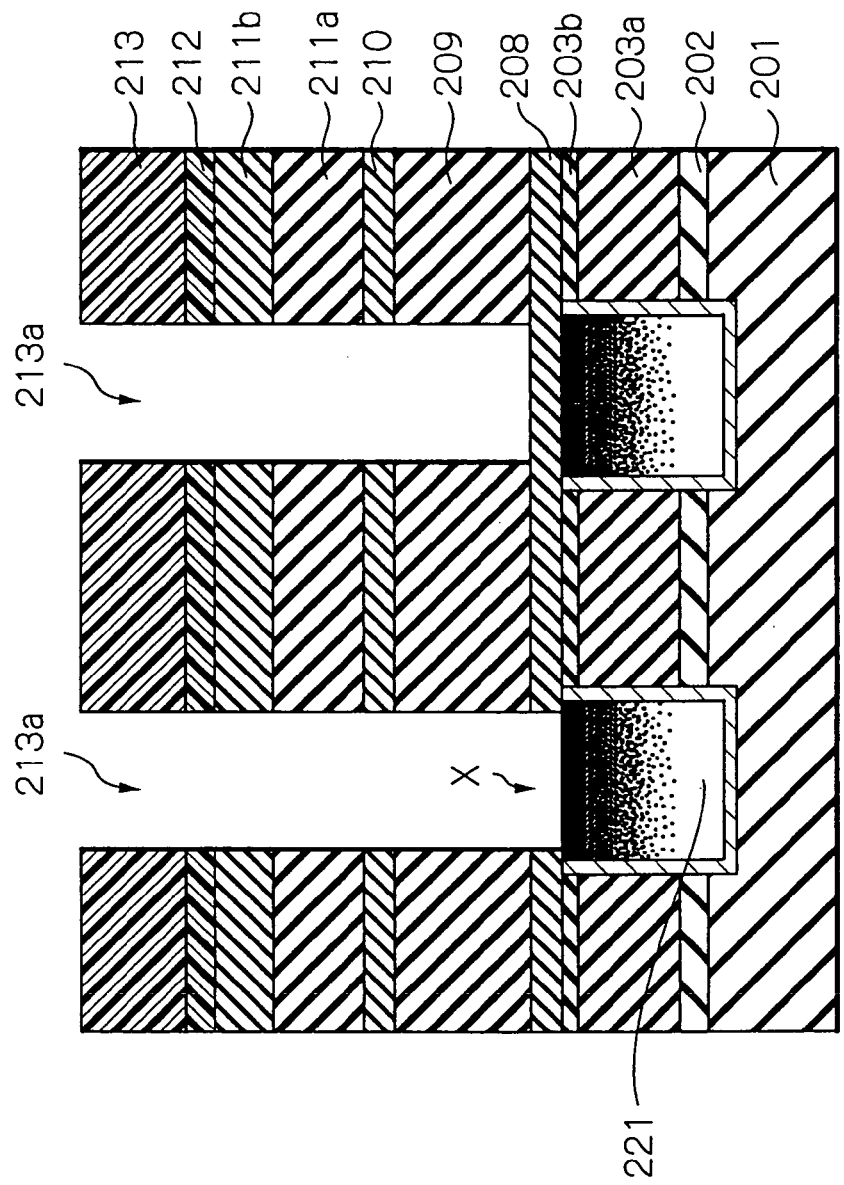

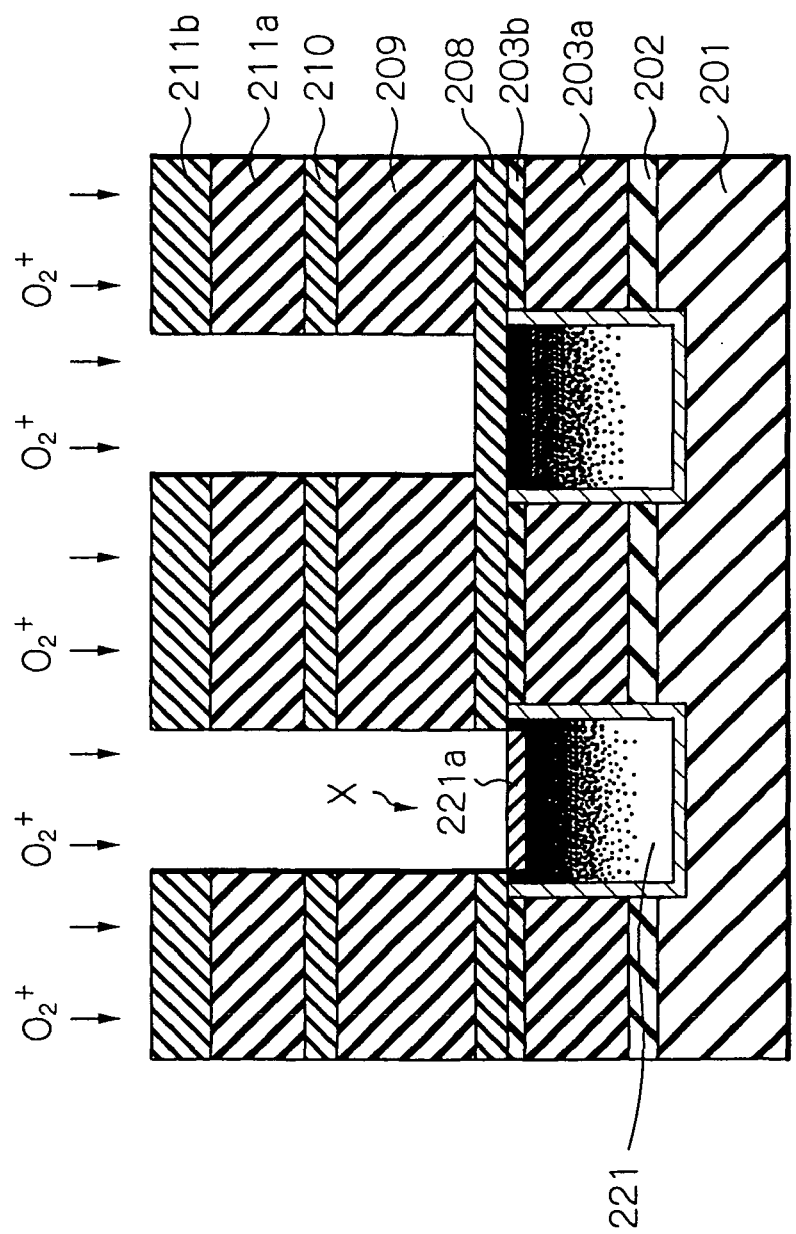

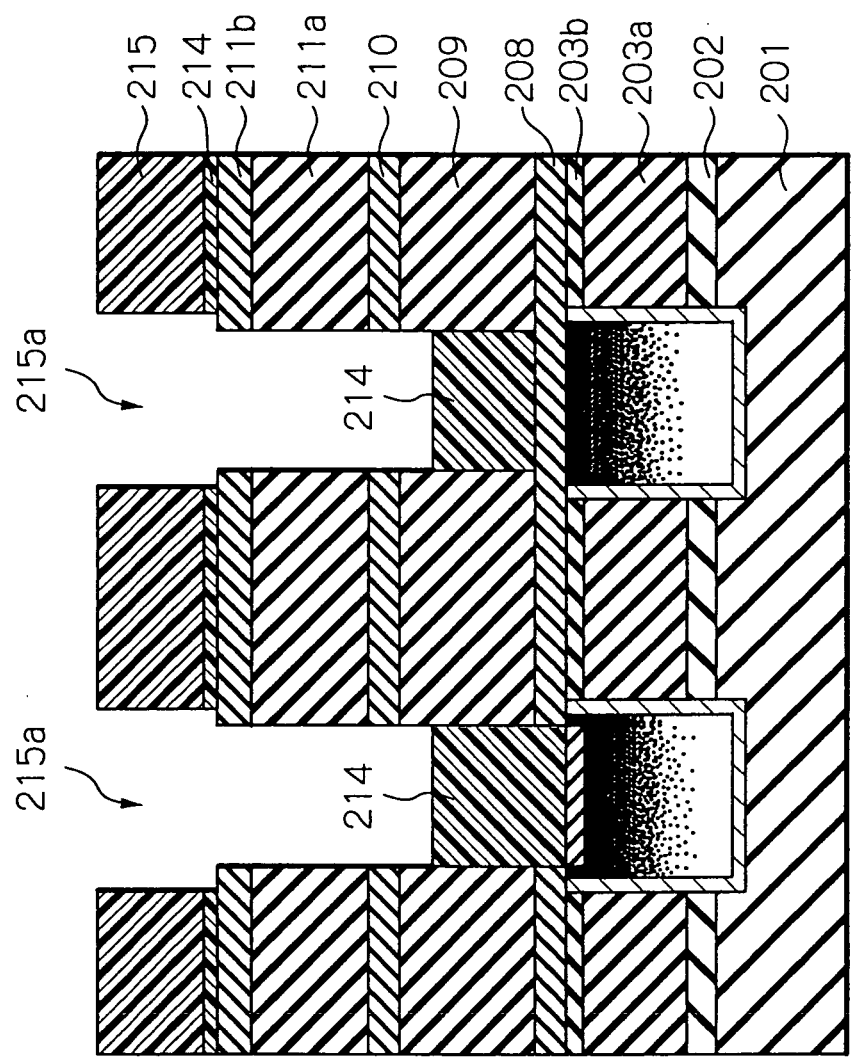

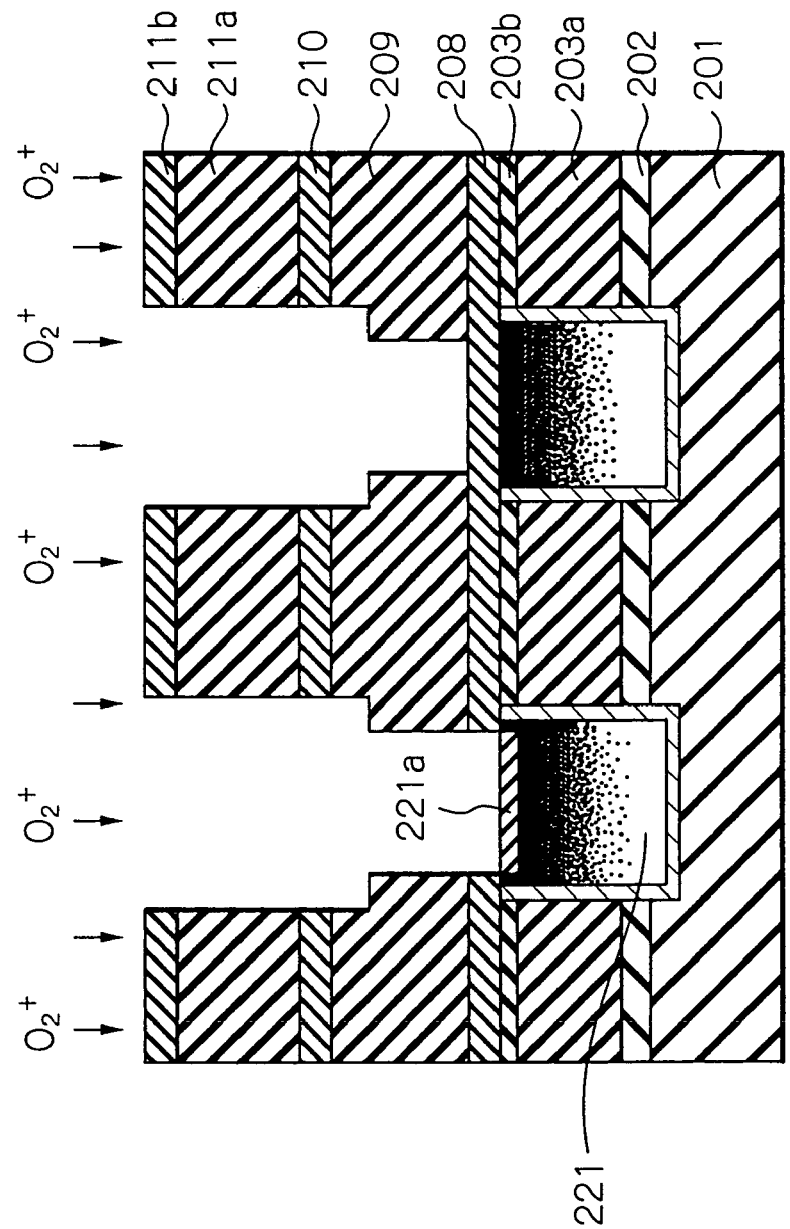

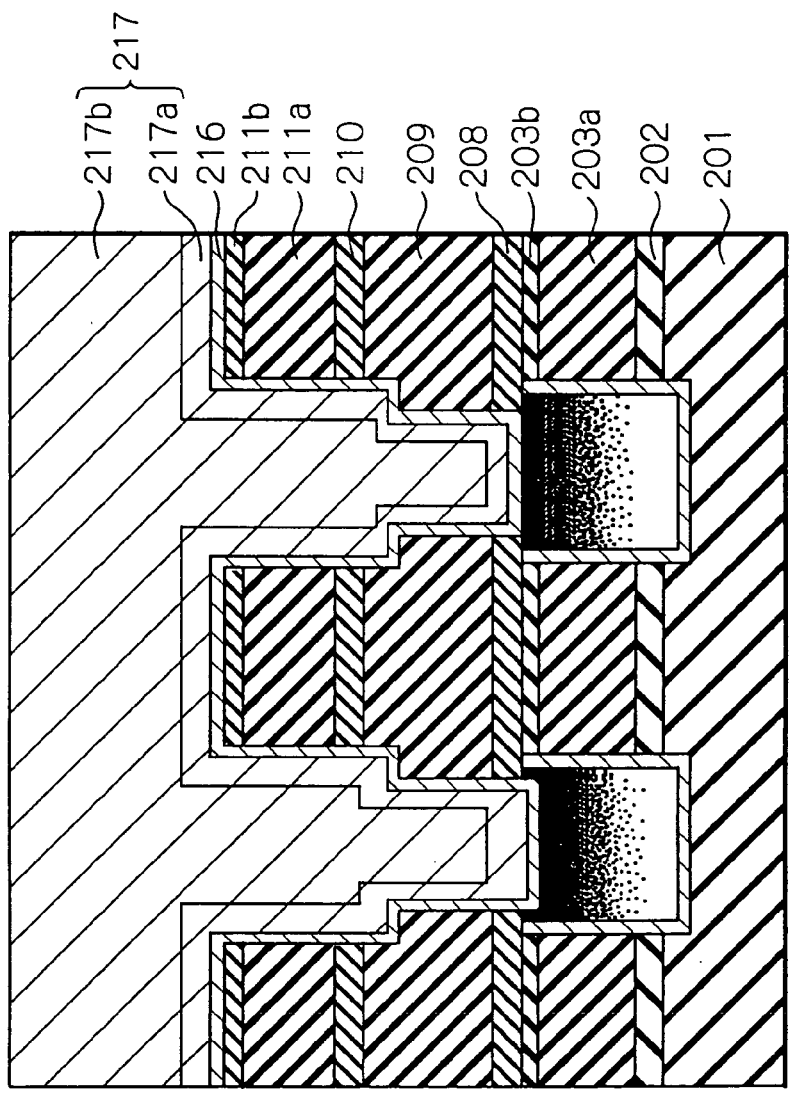

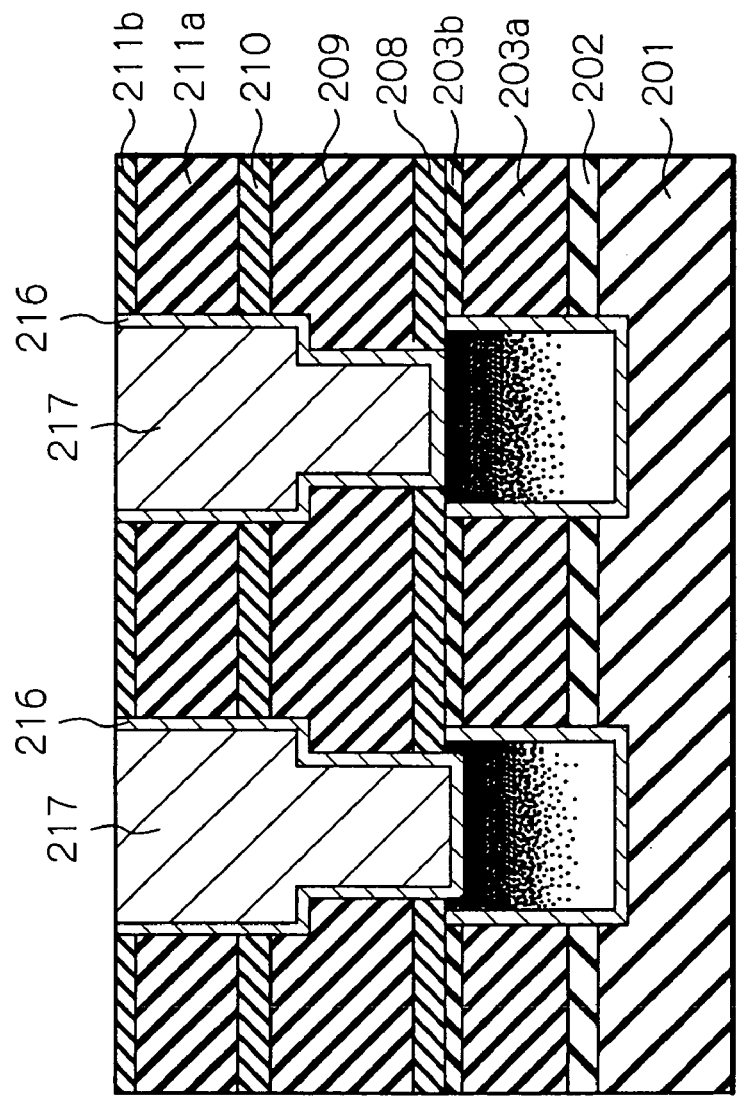

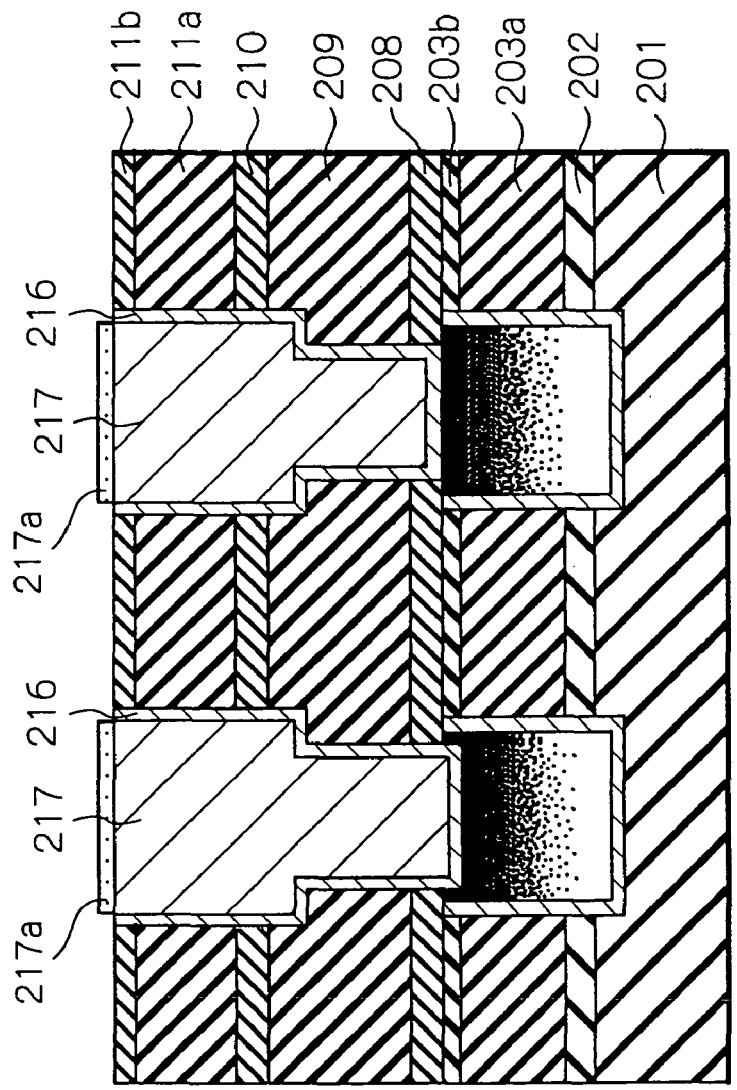

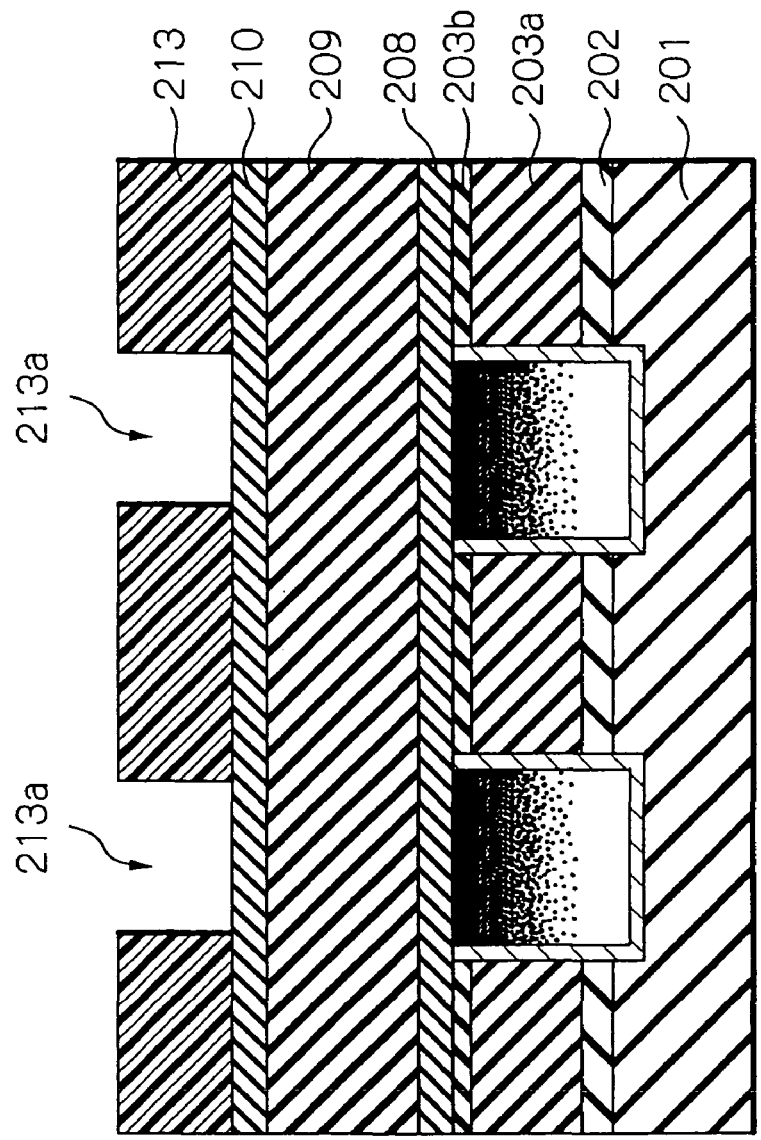

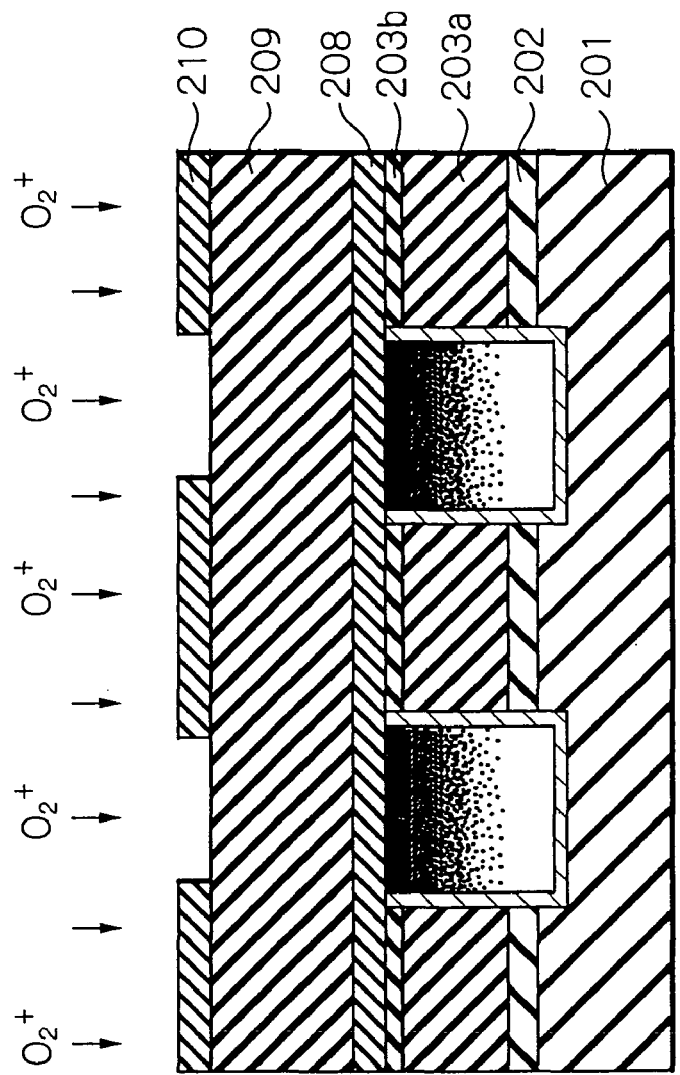

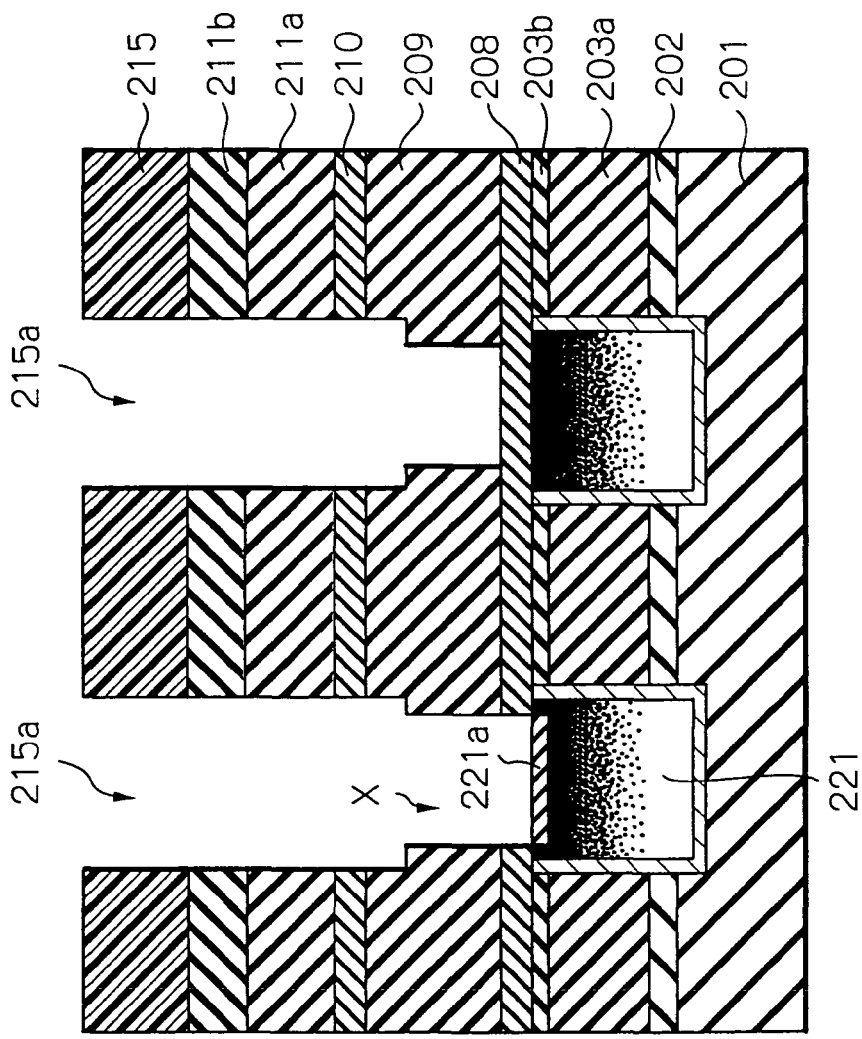

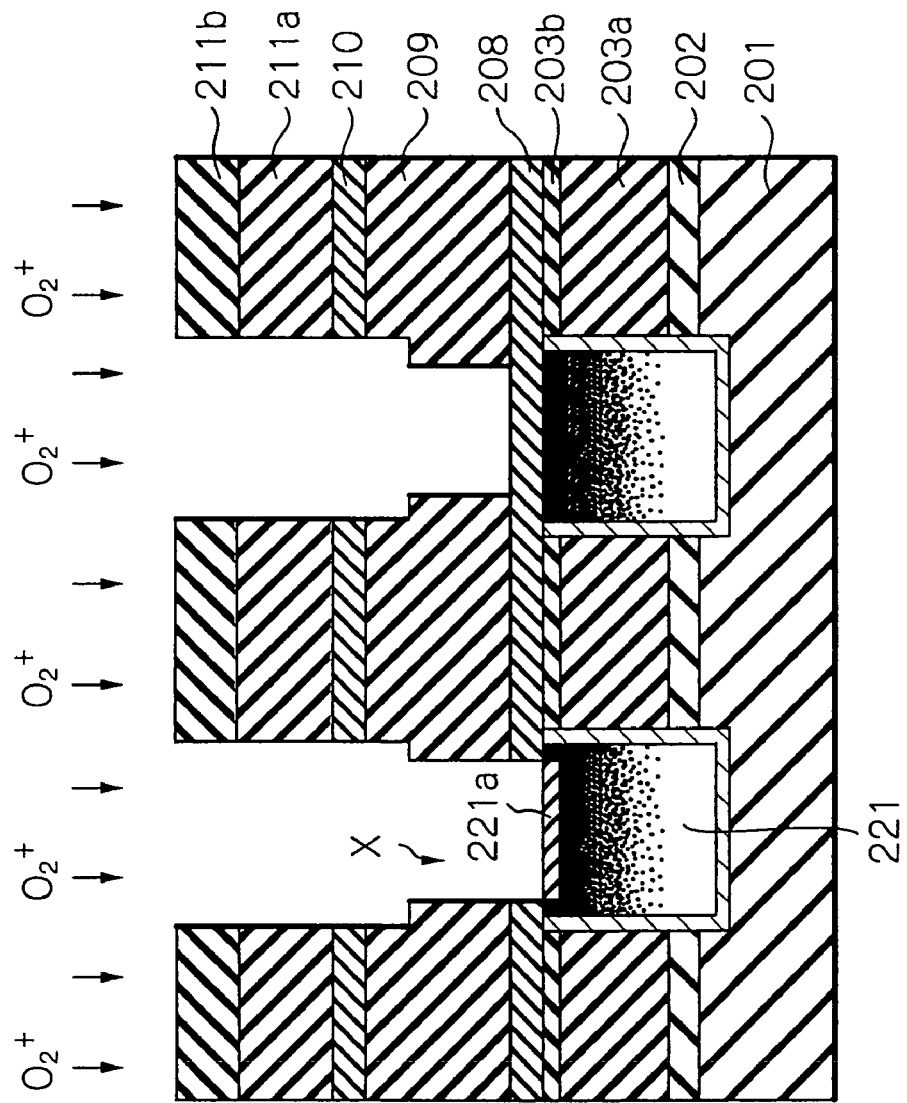

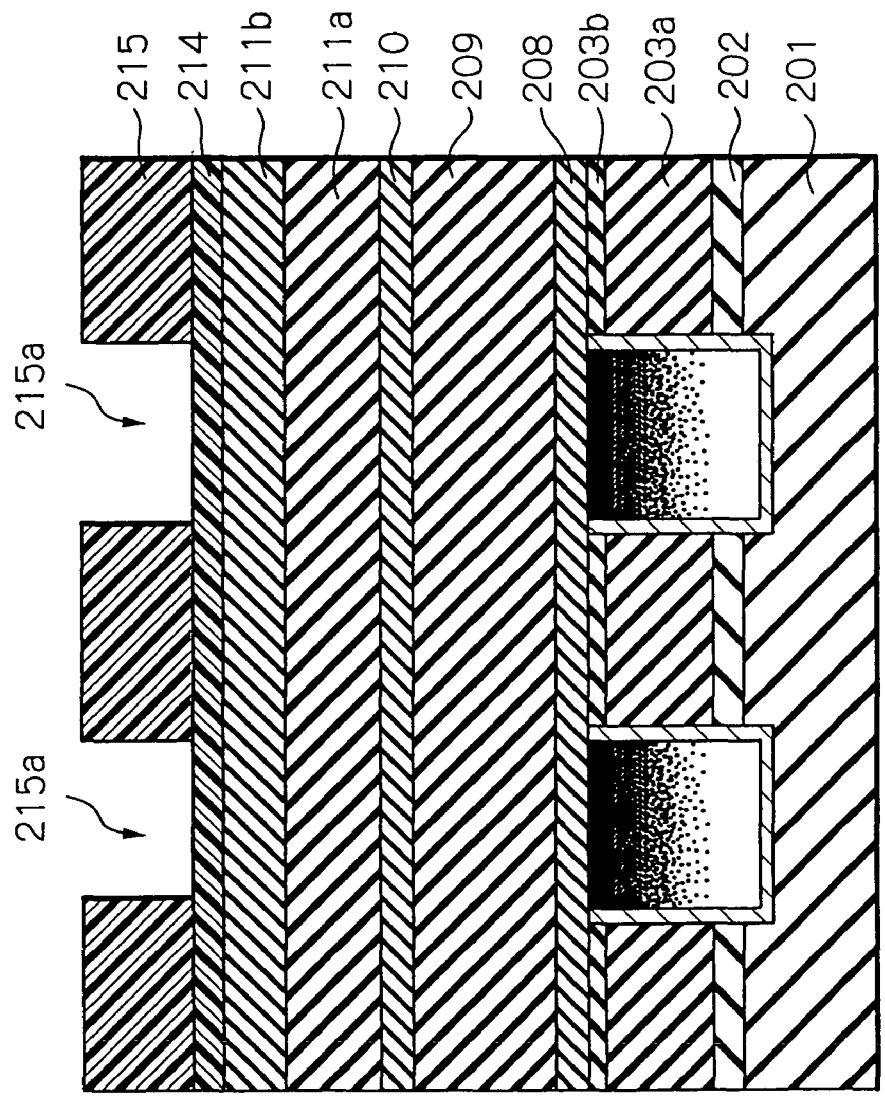

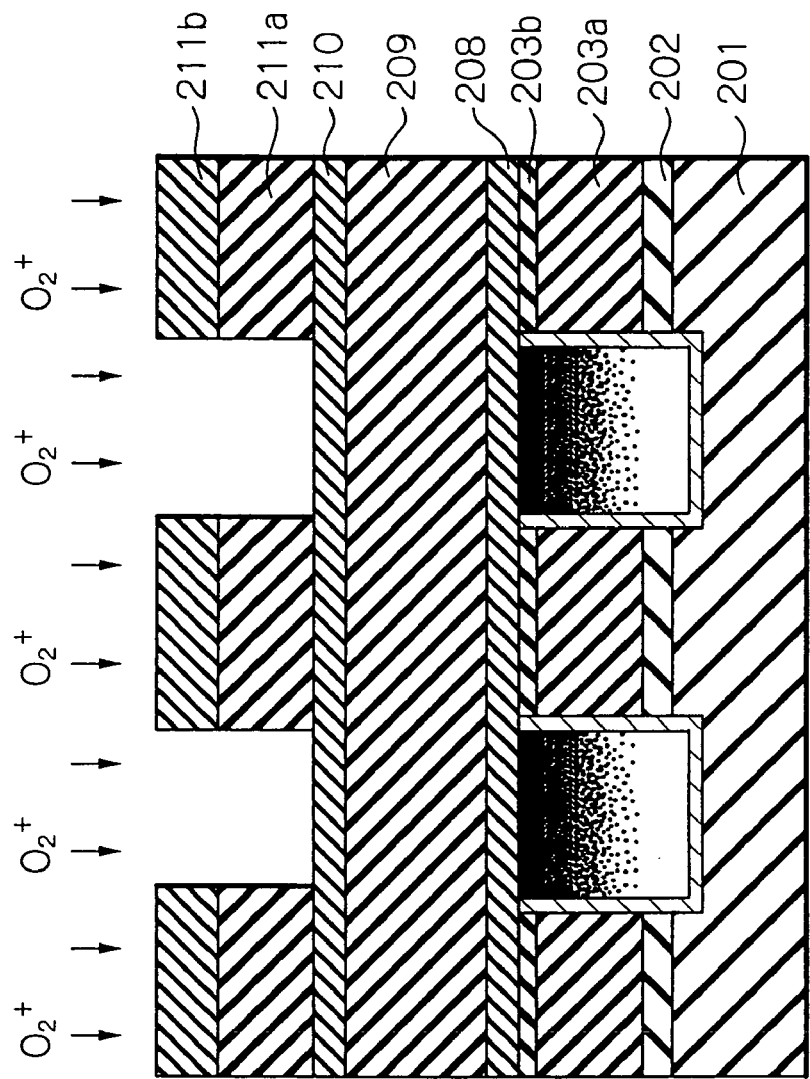

Fig. 16B

| DIELECTRIC CONSTANT | 2.9 at 1MHz |
|---|---|
| REFRACTIVE INDEX | 1.39 at 633nm |
| STRESS | 7.00E+08 dyne/cm$^2$ |
| HARDNESS | 0.9 Gpa |
| SHEAR MODULUS | 6 Gpa |
| THERMAL EXPANSION RATIO | 18 ppm/deg-C |
| GLASS TRANSITION POINT | none |
| THERMAL CONDUCTIVITY RATIO | 0.31 W/mk@25deg-C |

|  | ① | ② | ③ | ④ | ⑤ |
|---|---|---|---|---|---|
| HYDROGEN SILOXANE | 957 | 981 | 915 | 922 | 932 |
| HSQ | 1198 | 1232 | 1007 | 1101 | 1058 |

(Å)

SINGLE DAMASCENE STRUCTURE SEMICONDUCTOR DEVICE HAVING SILICON-DIFFUSED METAL WIRING LAYER

This is a Continuation-In-Part of Application No. 10/281,321 filed Oct. 28, 2002, now abandoned; the disclosure of which is incorporated herein by reference.

BACKGROUND OF THE INVENTION

1. Field of the Invention

The present invention relates to a semiconductor device including metal wiring layers such as copper (Cu) wiring layers and its manufacturing method.

2. Description of the Related Art

As semiconductor devices have been become more-finely structured, the resistance of wiring layers have been increased, and also, the parasitic capacitance therebetween has been increased. Note that the increase of resistance and the increase of parasitic capacitance in wiring layers increase time-constants thereof, which would delay the propagation of signals on the wiring layers.

In order to decrease the resistance of wiring layers, use is made of Cu rather than aluminum (Al). However, since it is difficult to subject Cu to a dry etching process, a chemical mechanical polishing (CMP) process is applied to the formation of wiring layers using Cu, which is called a damascene structure.

In a prior art method for manufacturing a single-damascene structure using Cu (see: JP-A-2000-150517), a copper layer filled in a groove of an insulating interlayer by a CMP process is completely sandwiched by a barrier metal layer and a copper diffusion barrier layer, so as to suppress the oxidation of the copper layer and diffusion of copper from the copper layer. Also, in order to suppress the electromigration of the copper layer, a Cu silicide is formed on the upper surface of the copper layer. This will be explained later in detail.

In the above-described prior art method for a single-damascene structure, however, the resistance of wiring layers is substantially increased due to the presence of Cu silicide and the oxide thereon.

On the other hand, in a prior art method for manufacturing a dual-damascene structure using Cu, a first copper layer is filled in a groove of an insulating interlayer via a barrier metal layer, and then, a copper diffusion barrier layer is formed thereon. Then, insulating interlayers are further formed on the copper diffusion barrier layer, and a via hole is formed in the insulating interlayers by a photolithography and etching process using the copper diffusion barrier layer as an etching stopper. Then, another copper layer is filled in the via hole and is connected to the first copper layer. This also will be explained later in detail.

In the above-described prior art method for a dual-damascene structure, however, the copper diffusion barrier layer may be overetched by the photolithography and etching process for the insulating interlayers, so that the first copper layer is oxidized by the post-stage dry ashing process using $O_2$ gas plasma, which decreases the manufacturing yield and enhances the electromigration.

Note that the dual-damascene structure is mainly divided into a via first type; a middle first type; and a trench first type.

In the via first type dual damascene structure, first and second insulating interlayers are sequentially formed. Then, a via hole is formed in the first insulating interlayer, and then, a groove is formed in the second insulating interlayer. Finally, a via structure and a groove wiring layer are simultaneously formed in the via hole and the groove, respectively.

In the middle first type dual-damascene structure, a first insulating interlayer is formed, and a via hole etching mask is formed on the first insulating interlayer. Then, a second insulating interlayer is formed. Then, a groove is formed in the second insulating interlayer simultaneously with the formation of a via hole in the first insulating interlayer using the via hole as an etching mask. Finally, a via structure and a groove wiring layer are simultaneously formed in the via hole and the groove, respectively. In the middle first type dual-damascene structure, note that anti-reflective layers for suppressing reflective light from an under Cu layer cannot be used in the photolithography processes for the formation of the via hole mask and the groove.

In the trench first type dual-damascene structure, first and second insulating interlayers are sequentially formed. Then, a groove (trench) is formed in the second insulating interlayer. Then, a via hole is formed in the first insulating interlayer. Finally, a via structure and a groove wiring layer are simultaneously formed in the via hole and the groove, respectively. In the trench first type dual-damascene structure, note that an anti-reflective layer for suppressing reflective light from an under Cu layer cannot be used in the photolithography process for the formation of the via hole.

The via first type dual-damascene structure is used for finer lower wiring layers, while the middle first type and the trench first type dual-damascene structures are used for non-fine middle and upper wiring layers.

SUMMARY OF THE INVENTION

It is an object of the present invention to provide a single-damascene type semiconductor device and its manufacturing method having a wiring layer capable of substantially decreasing the resistance thereof.

Another object of the present invention is to provide a dual-damascene type semiconductor device and its manufacturing method capable of increasing the manufacturing yield.

According to the present invention, a semiconductor device is constructed by an insulating underlayer; a first insulating interlayer formed on the insulating underlayer and having a groove; a first silicon-diffused metal layer buried in the groove; and a first metal diffusion barrier layer formed on the first silicon-diffused metal layer and the first insulating interlayer.

The semiconductor device is further constructed by a second insulating interlayer formed on the first metal diffusion barrier layer, the second insulating interlayer and the first metal diffusion barrier layer having a via hole opposing the groove of the first insulating interlayer; a second silicon-diffused metal layer buried in the via hole; a second metal diffusion barrier layer formed on the second silicon-diffused metal layer and the second insulating interlayer; a third insulating interlayer formed on the second metal diffusion barrier layer, the third insulating interlayer and the second metal diffusion barrier layer having a trench opposing the via hole; a third silicon-diffused metal layer buried in the trench; and a third metal diffusion barrier layer formed on the third silicon-diffused metal layer and the third insulating interlayers. Thus, a multiple-layer single-damascene structure is obtained.

On the other hand, the semiconductor device is further constructed by a second insulating interlayer formed on the first metal diffusion barrier layer, the second insulating interlayer and the first metal diffusion barrier layer having a via hole opposing the groove of the first insulating interlayer; a third insulating interlayer formed on the second insulating interlayer, the third insulating interlayer having a trench opposing the via hole; a second silicon-diffused metal layer buried in the trench and via hole; and a second metal diffusion barrier layer formed on the second silicon-diffused metal layer and the third insulating interlayer. Thus, a dual-damascene structure is obtained.

BRIEF DESCRIPTION OF THE DRAWINGS

The present invention will be more clearly understood from the description set forth below, as compared with the prior art, with reference to the accompanying drawings, wherein:

FIG. 7 is a phase diagram of Cu—Si;

FIG. 8C is a table showing the presence or absence of Si in the silicon-diffused copper layer of FIG. 5H;

FIGS. 13A through 13F are cross-sectional views for explaining a fourth embodiment of the method for manufacturing a semiconductor device according to the present invention;

FIGS. 15A through 15F are cross-sectional views for explaining a fifth embodiment of the method for manufacturing a semiconductor device according to the present invention;

FIG. 16B is a table showing the characteristics of the ladder-type hydrogen siloxane of FIG. 16A;

DESCRIPTION OF THE PREFERRED EMBODIMENTS

Before the description of the preferred embodiments, prior art methods for manufacturing a semiconductor device will be explained with reference to FIGS. 1A through 1H and FIGS. 2A through 2P, and 3.

FIGS. 1A through 1H are cross-sectional views for explaining a first prior art method for a manufacturing a semiconductor device (see: JP-A-2000-150517). In this case, a one-layer single-damascene structure is formed.

Figure 1A:
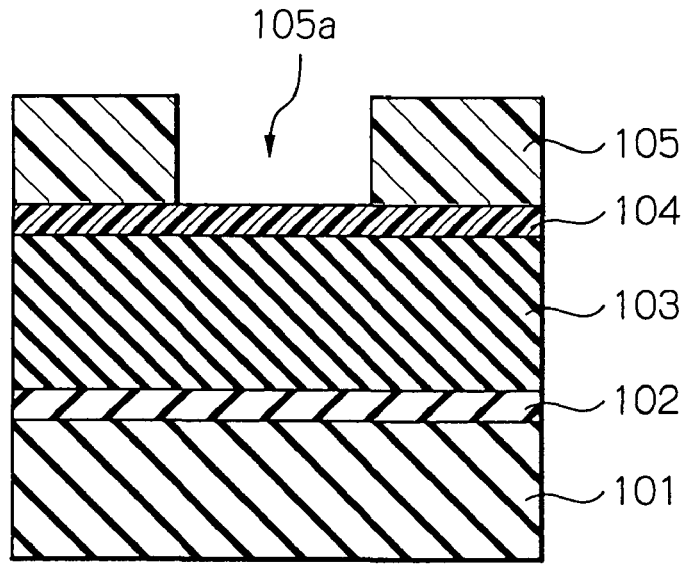
FIGS. 1A through 1H are cross-sectional views for explaining a first prior art method for manufacturing a semiconductor device.

First, referring to FIG. 1A, an insulating underlayer 101 made of silicon dioxide or the like is formed on a silicon substrate (not shown) where various semiconductor elements are formed. Then, an etching stopper 102 made of SiCN is formed by a plasma CVD process on the insulating underlayer 101. Then, an insulating interlayer 103 made of silicon dioxide is deposited by a CVD process on the etching stopper 102. Then, an anti-reflective coating layer 104 and a photoresist layer 105 are sequentially coated on the insulating interlayer 103. Then, the photoresist layer 105 is patterned by a photolithography process, so that a groove 105a is formed in the photoresist layer 105.

Figure 1B:
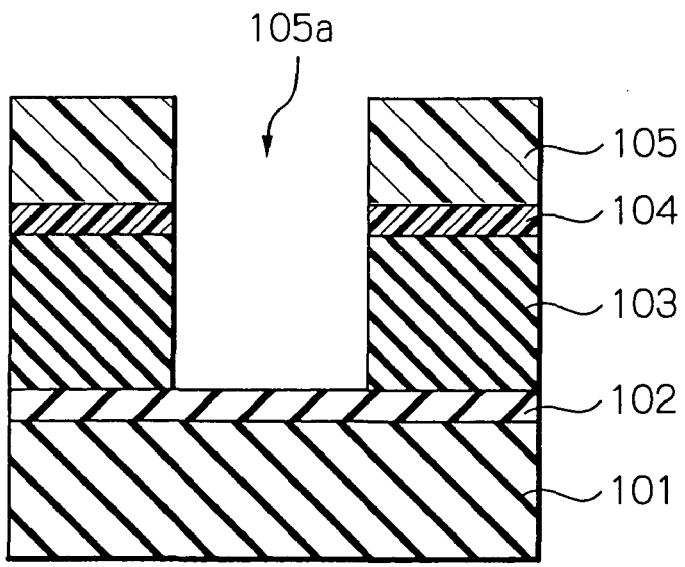

Next, referring to FIG. 1B, the anti-reflective coating layer 104 and the insulating interlayer 103 are etched by a dry etching process using the photoresist layer 105 as a mask.

Figure 1C:
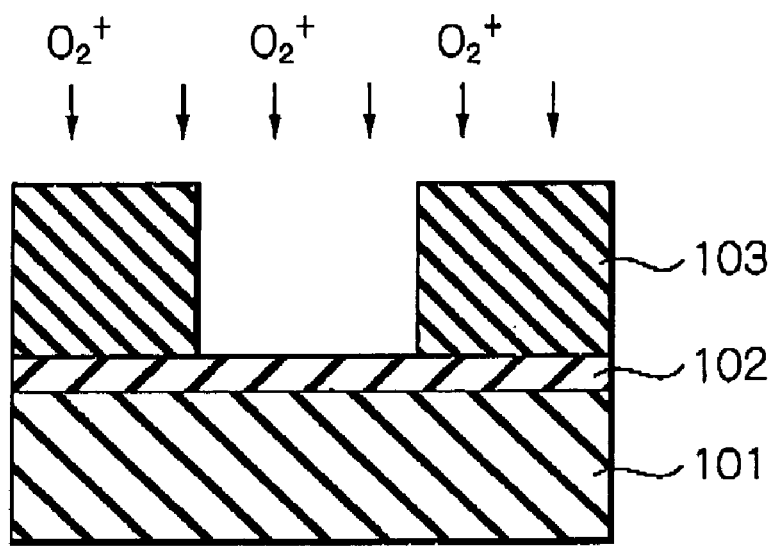

Next, referring to FIG. 1C, the photoresist layer 105 and the anti-reflective layer 104 are ashed by a dry ashing process using $O_2$ gas plasma.

Figure 1D:
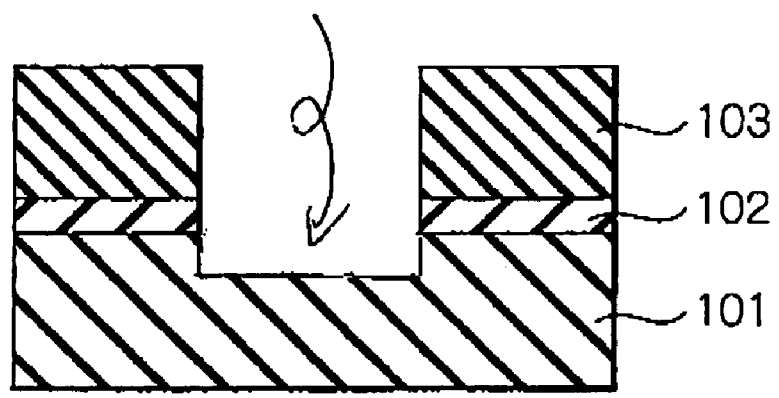

Next, referring to FIG. 1D, the etching stopper 102 is etched back by a dry etching process. Then, a wet stripping process is performed upon the insulating interlayer 103 and the insulating underlayer 101, so that residues of the dry etching process are completely removed.

Figure 1E:
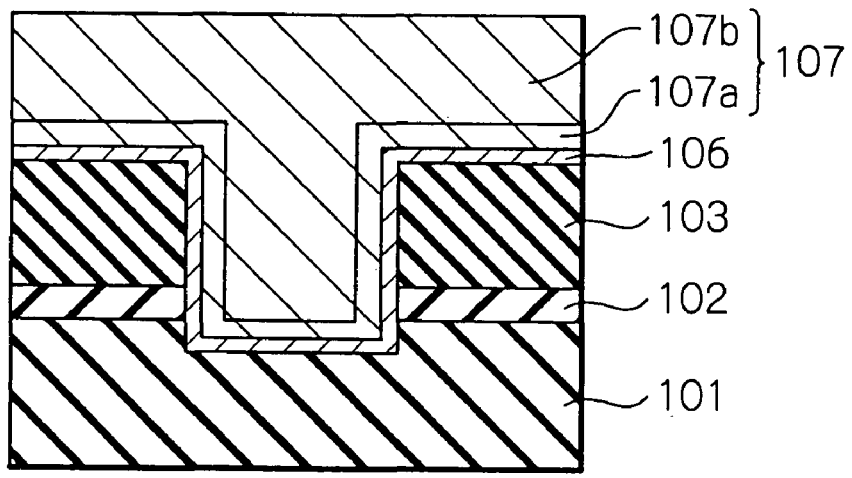

Next, referring to FIG. 1E, a barrier metal layer 106 made of Ta on TaN and a seed copper layer 107a are sequentially deposited by a sputtering process on the entire surface. Then, a copper layer 107b is further deposited by an electroplating process using the seed copper layer 107a as a cathode electrode. Note that the copper layers 107a and 107b form a copper layer 107. Then, an annealing treatment is performed upon the copper layer 107 under a $N_2$ atmosphere to crystallize the copper layer 107.

Figure 1F:
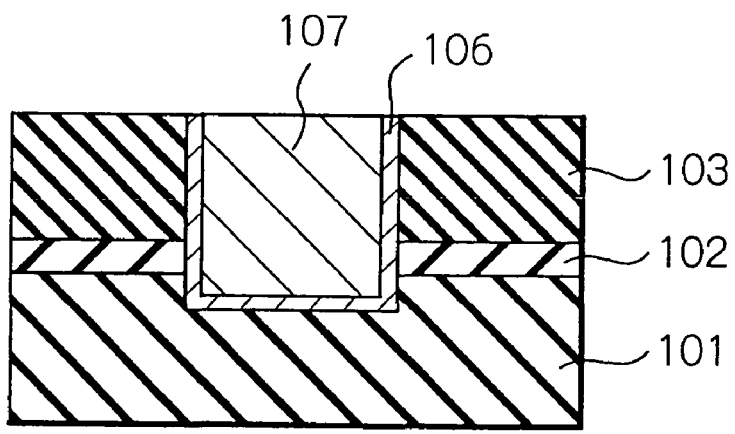

Next, referring to FIG. 1F, the copper layer 107 and the barrier metal layer 106 on the insulating interlayer 103 are removed by a CMP process.

Figure 1G:
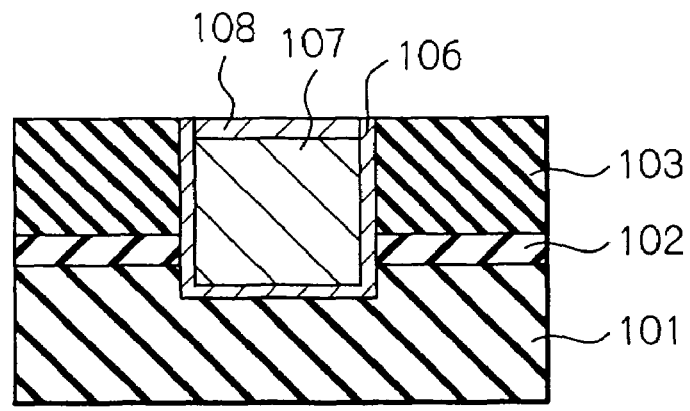

Next, referring to FIG. 1G, a Cu silicide layer 108 is grown in the copper layer 107 by a passivation process using $SiH_4$ gas.

Figure 1H:
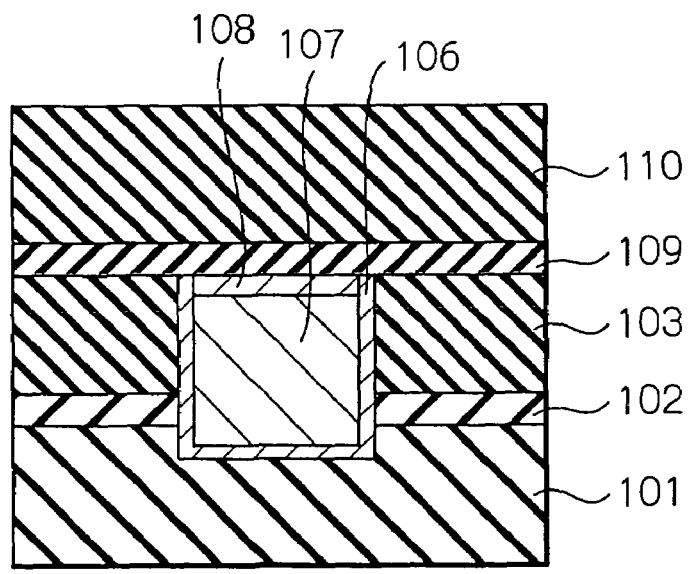

Finally, referring to FIG. 1H, a copper diffusion barrier layer 109 made of SiN is deposited on the entire surface by a plasma CVD process using $SiH_4$ gas. Then, an insulating interlayer 110 made of silicon dioxide is formed on the copper diffusion barrier layer 109.

In the first prior art method as illustrated in FIGS. 1A through 1H, in order to suppress the oxidation of the copper layer 107 and the diffusion of copper from the copper layer 107 to the insulating underlayer 101 and the insulating interlayers 103 and 110 made of silicon dioxide, the copper layer 107 is completely surrounded by the barrier metal layer 106 and the copper diffusion barrier layer 109.

Also, in the first prior art method as illustrated in FIGS. 1A through 1H, in order to suppress the electromigration of the copper layer 107, the Cu silicide layer 108 is formed on the upper surface of the copper layer 107.

In the first prior art method as illustrated in FIGS. 1A through 1H, since the resistivity of Cu silicide is higher than that of Cu, the resistance of a wiring layer made of Cu and Cu silicide is substantially increased. Also, when a via hole is formed in the insulating interlayer 110, a part of the Cu silicide layer 108 may be removed. Therefore, in view of this, in order to surely suppress the electromigration and stress migration, the Cu silicide layer 108 has to be even thicker, which also substantially increases the resistance of the wiring layer made of Cu and Cu silicide. Further, if the copper layer 107 is oxidized before the growth of the Cu silicide layer 108, the oxide of Cu will react with silicon in a $SiH_4$ gas atmosphere, so that mixture of Cu, Si and O abnormally grow, which also substantially increases the resistance of the wiring layer. At worst, the mixture of Cu, Si and O grown at the periphery of the wiring layer and the barrier metal layer 106 invites a short-circuit between two adjacent wiring layers, if they are close to each other.

On the other hand, in order to decrease the parasitic capacitance between wiring layers, the copper diffusion barrier layer 109 can be made of SiC or SiCN which has a lower dielectric constant than that of SiN. That is, the copper diffusion barrier layer 109 can be deposited by a plasma CVD process using organic silane gas such as $SiH(CH_3)_3$ gas or $Si(CH_3)_4$ gas, not $SiH_4$ gas. In this case, bonding energy between Si and an organic group in $SiH(CH_3)_3$ or $Si(CH_3)_4$ is stronger than bonding energy between Si and H in $SiH_4$, so that thermal decomposition of $SiH(CH_3)_3$ or $Si(CH_3)_4$ is harder than thermal decomposition of $SiH_4$. As a result, Cu silicide is hardly grown by using $SiH(CH_3)_3$ gas or $Si(CH_3)_4$ gas as compared with $SiH_4$ gas. Note that, if there is no Cu silicide between the copper layer 107 and the Cu diffusion barrier layer 109 made of SiCN, the contact characteristics therebetween deteriorate, so that the crystal grains of the copper layer 107 are not stabilized, which would decrease the electromigration resistance and also, would decrease the stress migration resistance so that the copper layer 107 is easily broken.

Figure 2A:
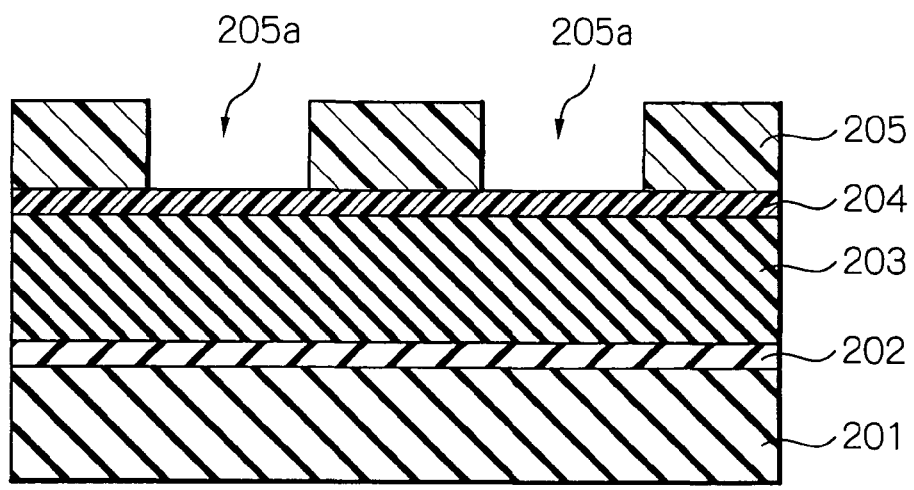
FIGS. 2A through 2P are cross-sectional views for explaining a second prior art method for manufacturing a semiconductor device.
Figure 2B:
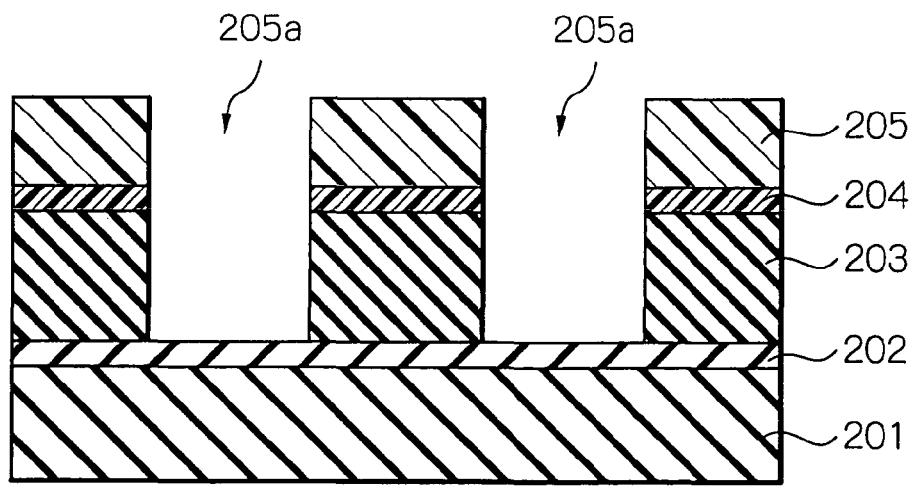
Figure 2C:
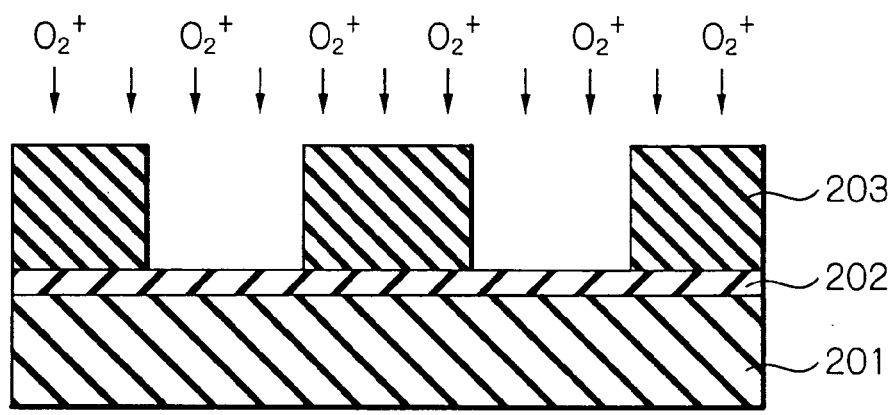
Figure 2D:
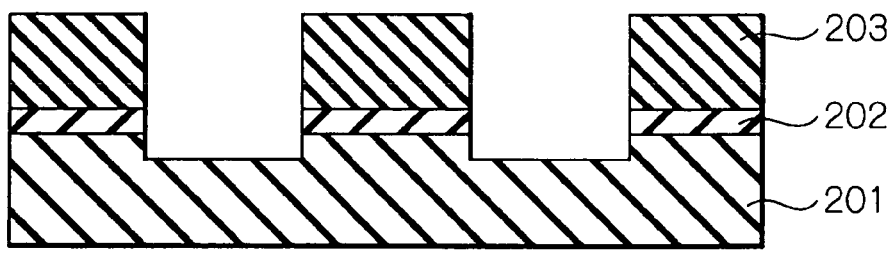
Figure 2E:
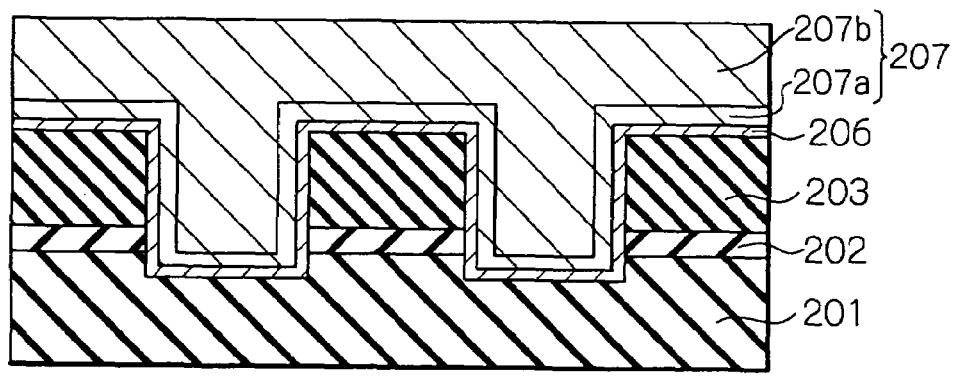
Figure 2F:
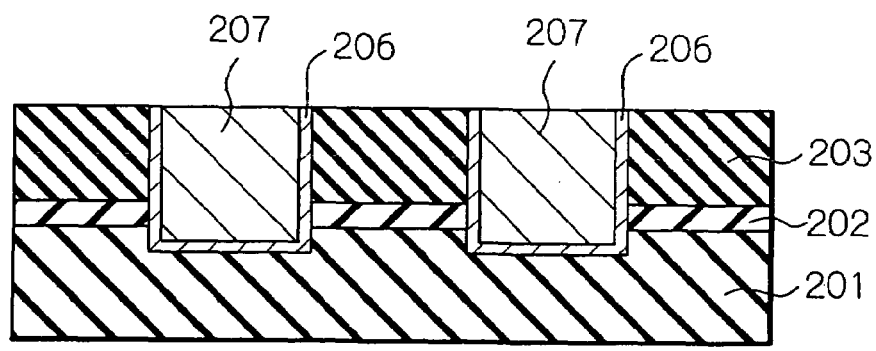
Figure 2G:
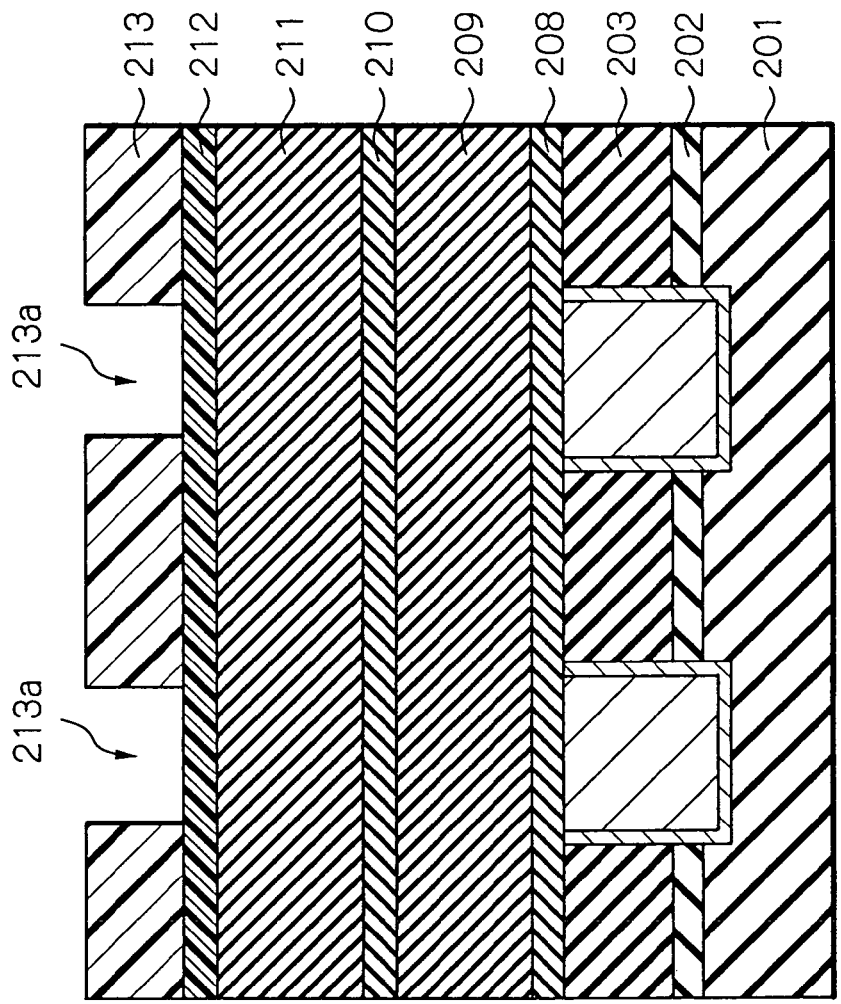
Figure 2H:
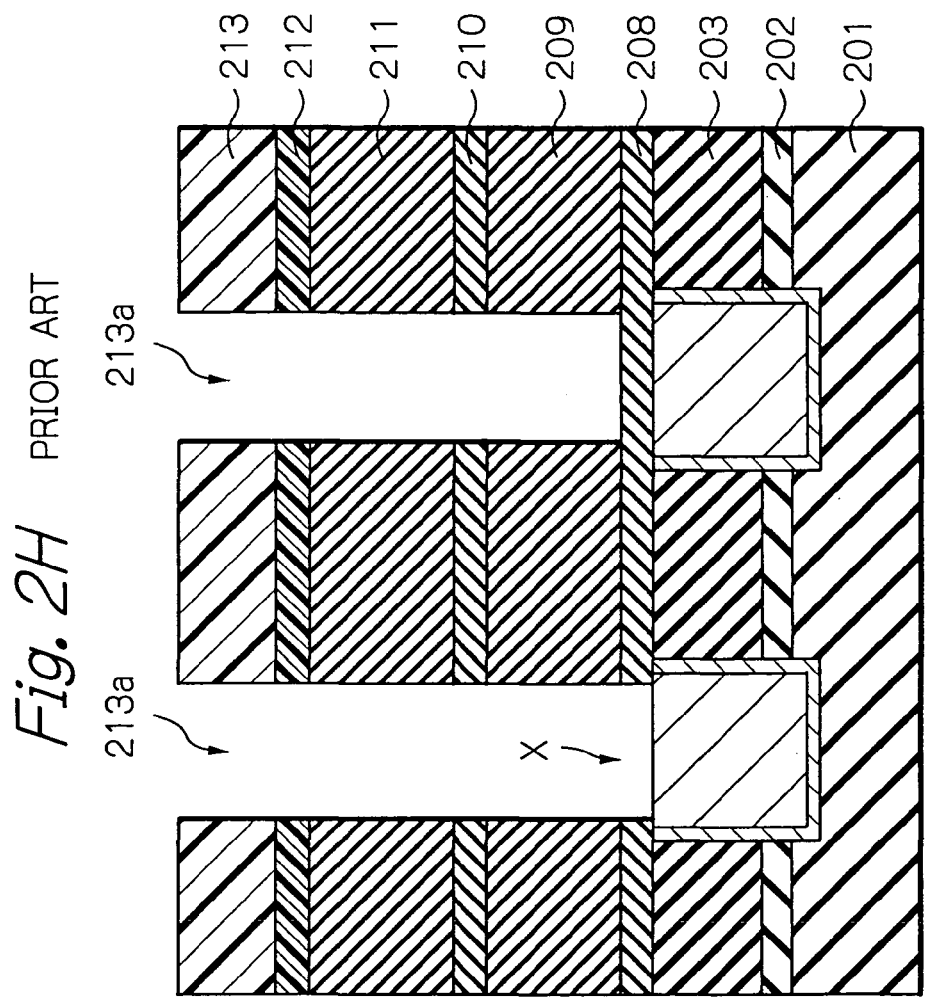
Figure 2I:
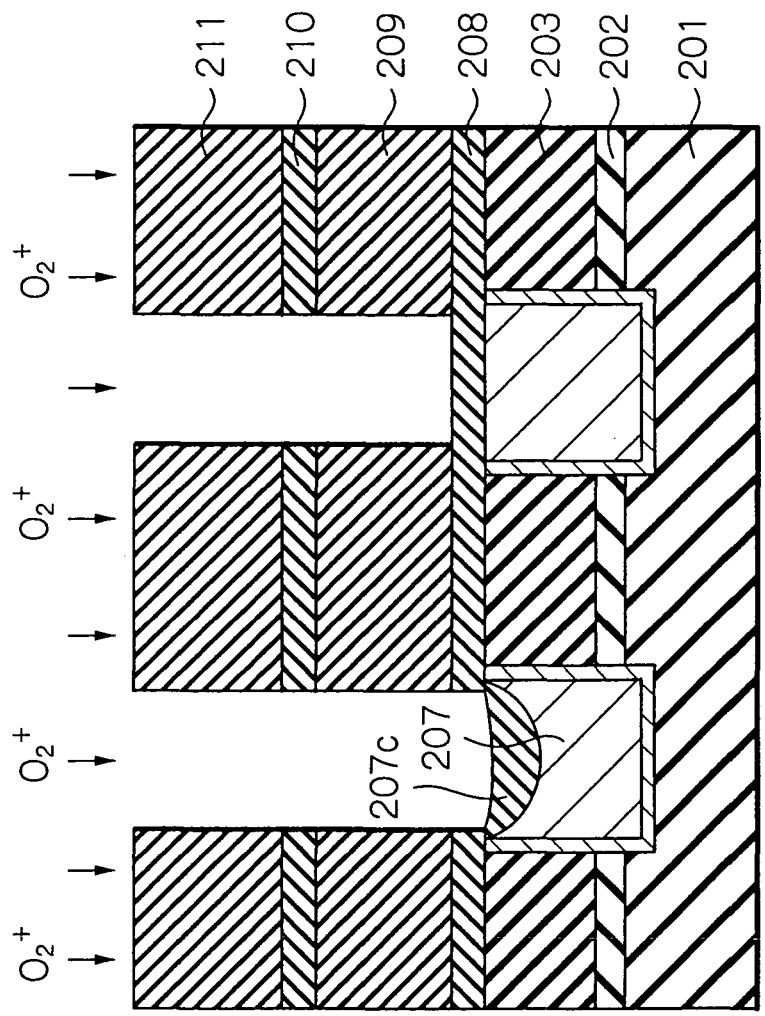
Figure 2J:
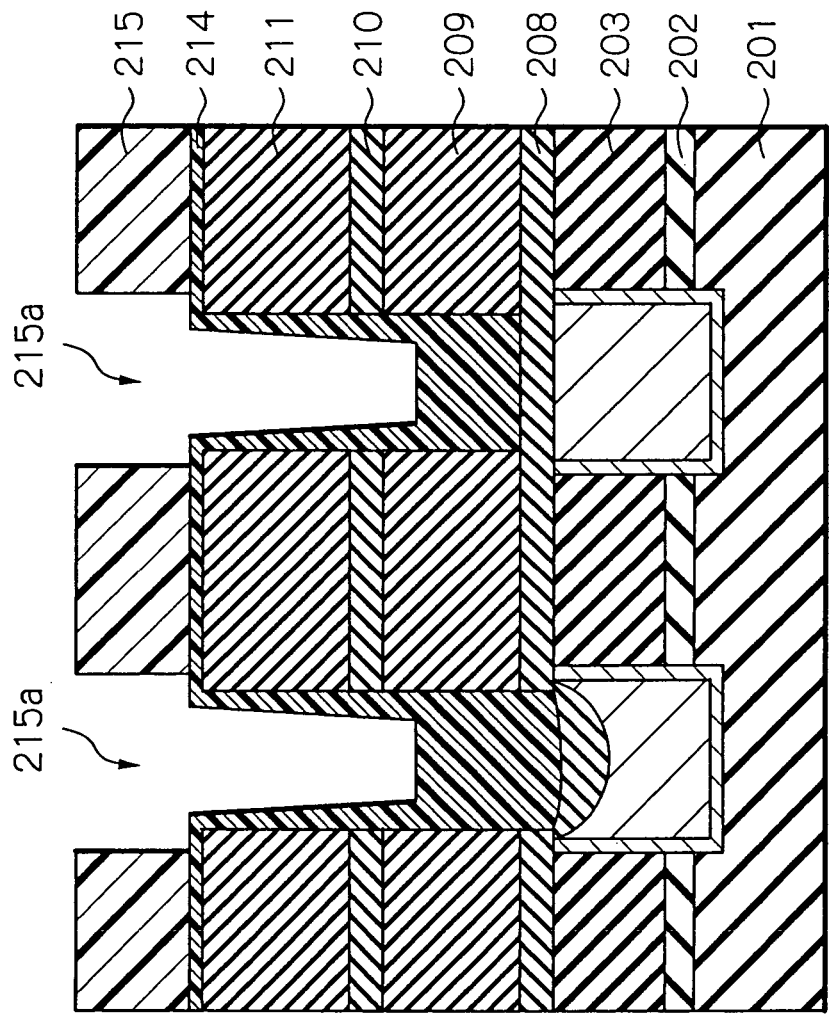
Figure 2K:
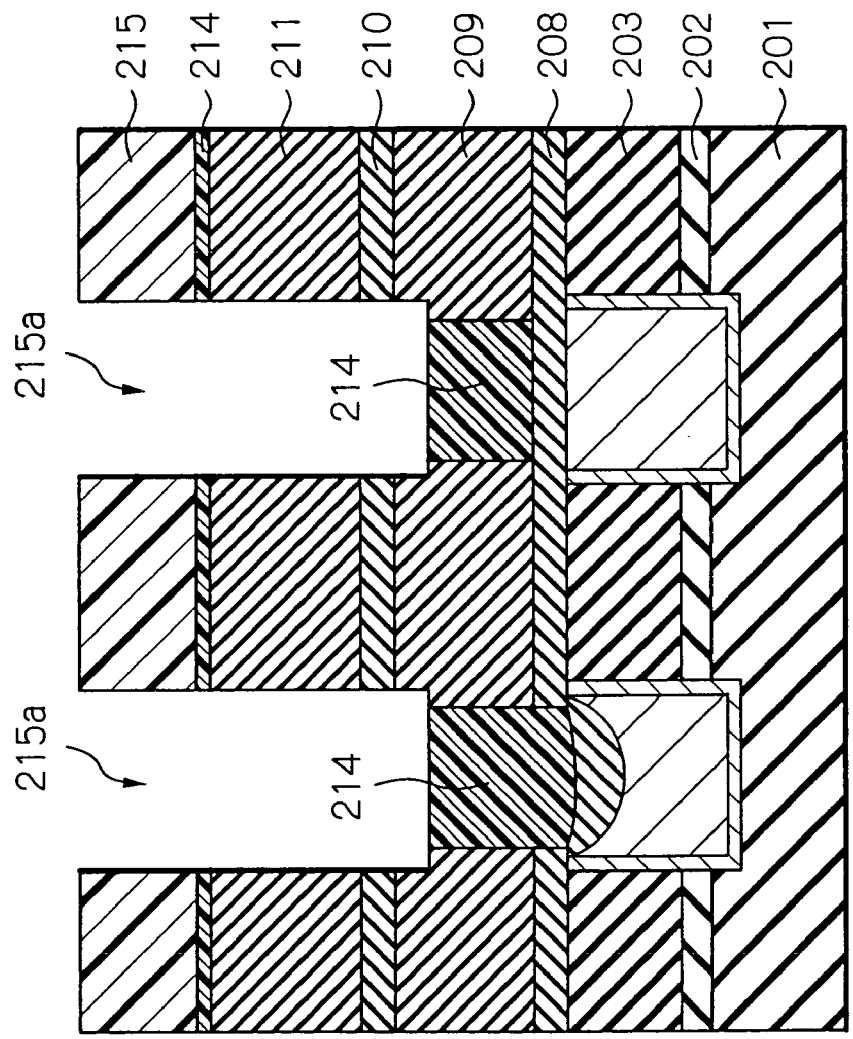
Figure 2M:
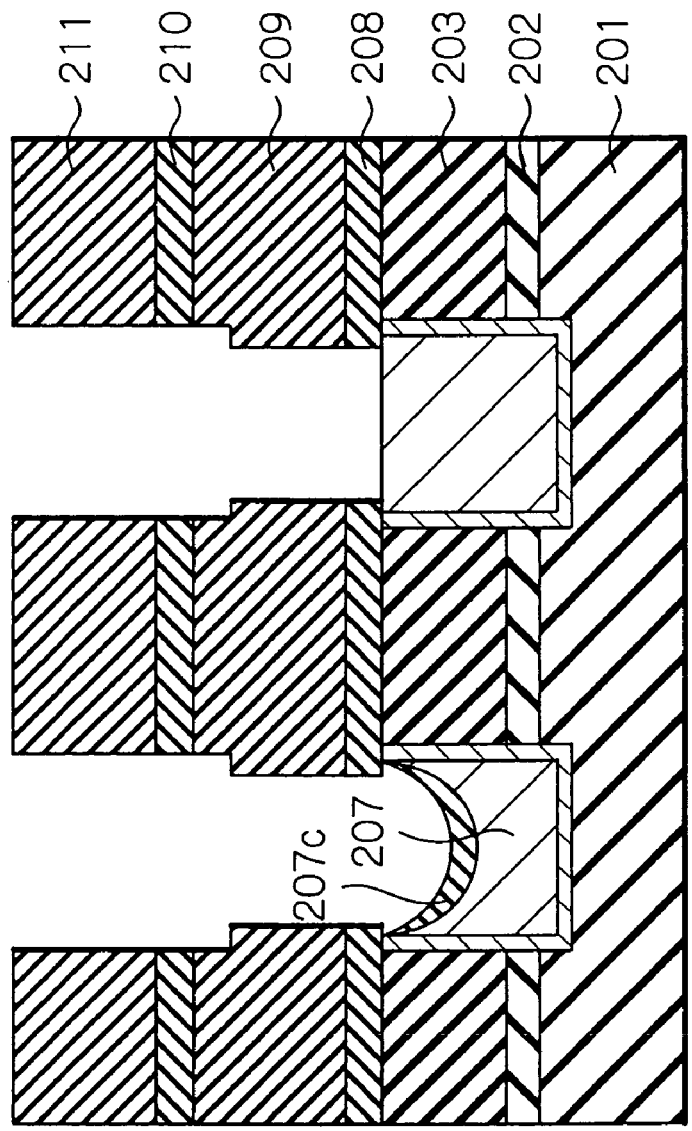
Figure 2N:
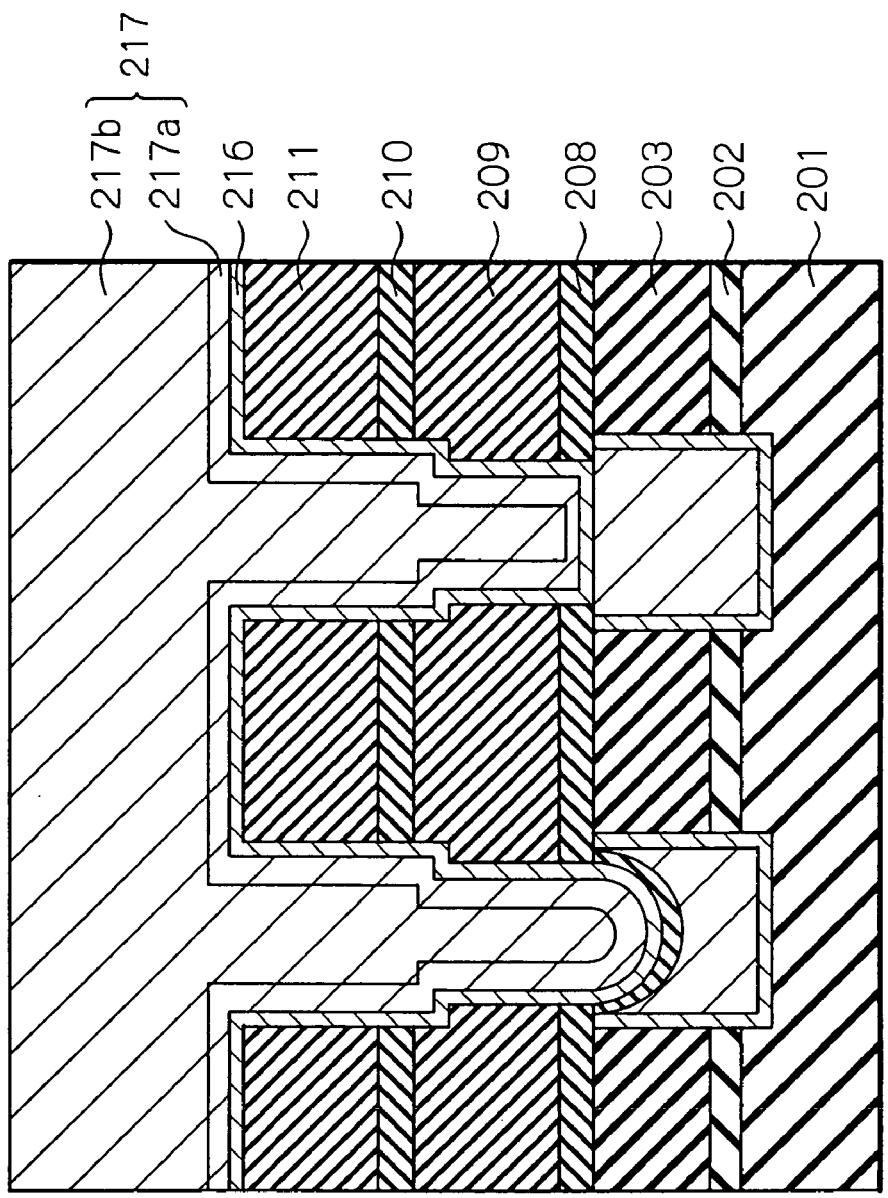
Figure 2P:
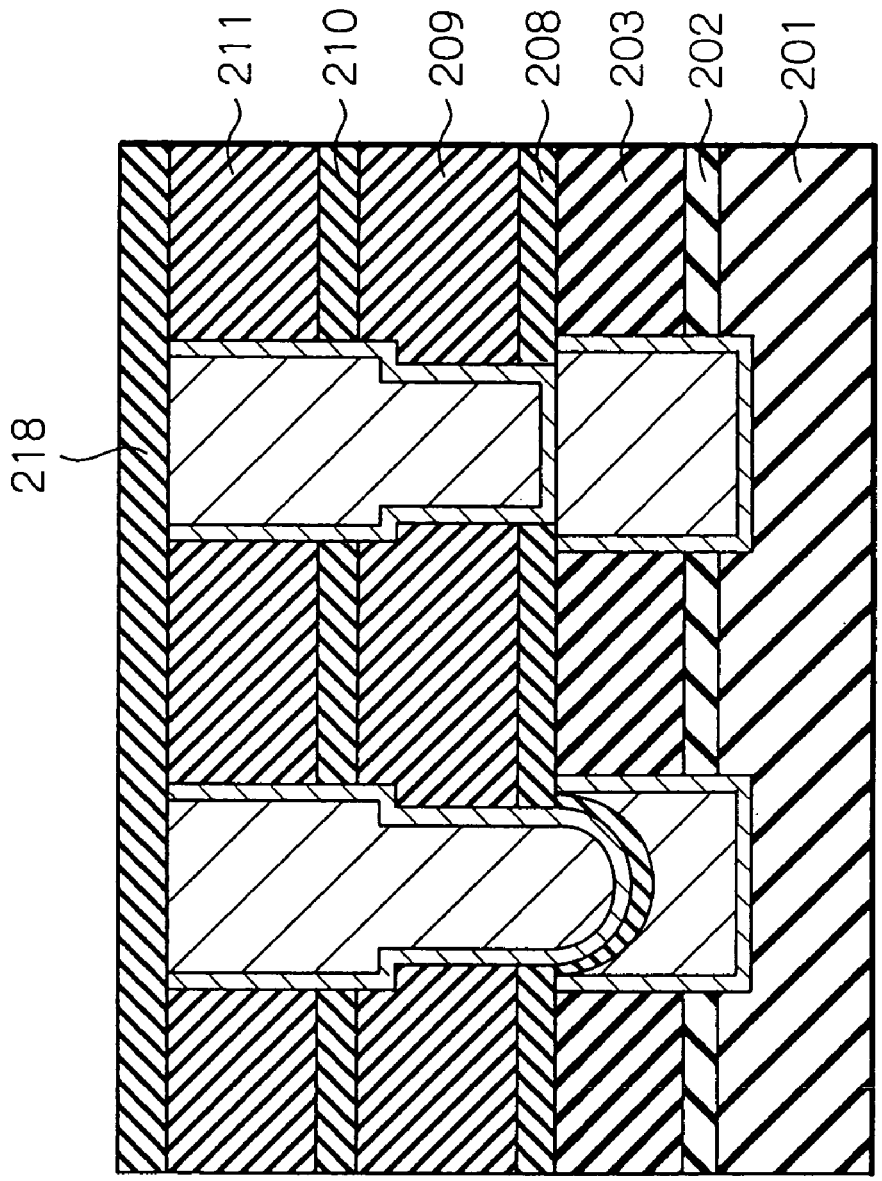

FIGS. 2A through 2P are cross-sectional views for explaining a second prior art method for manufacturing a semiconductor device. In this case, a two-layer via first type dual-damascene structure is formed.

First, referring to FIG. 2A, an insulating underlayer 201 made of silicon dioxide or the like is formed on a silicon substrate (not shown) where various semiconductor elements are formed. Then, an etching stopper 202 made of SiN is formed by a plasma CVD process on the insulating underlayer 201. Then, an insulating interlayer 203 made of silicon dioxide is deposited by a CVD process on the etching stopper 202. Then, an anti-reflective coating layer 204 and a photoresist layer 205 are sequentially coated on the insulating interlayer 203. Then, the photoresist layer 205 is patterned by a photolithography process, so that a groove 205a is formed in the photoresist layer 205.

Next, referring to FIG. 2B, the anti-reflective coating layer 204 and the insulating interlayer 203 are etched by a dry etching process using the photoresist layer 205 as a mask.

Next, referring to FIG. 2C, the photoresist layer 205 and the anti-reflective layer 204 are ashed by a dry ashing process using $O_2$ gas plasma.

Next, referring to FIG. 2D, the etching stopper 202 is etched back by a dry etching process. Then, a wet stripping process is performed upon the insulating interlayer 203 and the insulating underlayer 201, so that residues of the dry etching process are completely removed.

Next, referring to FIG. 2E, a barrier metal layer 206 made of Ta on TaN and a seed copper layer 207a are sequentially deposited by a sputtering process on the entire surface. Then, a copper layer 207b is further deposited by an electroplating process using the seed copper layer 207a as a cathode electrode. Note that the copper layers 207a and 207b form a copper layer 207. Then, an annealing treatment is performed upon the copper layer 207 under a $N_2$ atmosphere to crystallize the copper layer 207.

Next, referring to FIG. 2F, the copper layer 207 and the barrier metal layer 206 on the insulating interlayer 203 are removed by a CMP process.

Next, referring to FIG. 2G, a copper diffusion barrier layer 208 made of SiCN, an insulating interlayer 209 made of silicon dioxide, an etching stopper 210 made of SiCN, and an insulating interlayer 211 made of silicon dioxide are sequentially deposited on the entire surface. Then, an anti-reflective layer 212 and a photoresist layer 213 are sequentially coated on the insulating interlayer 211. Then, the photoresist layer 213 is patterned by a photolithography process, so that a via hole 213a is formed in the photoresist layer 213.

Next, referring to FIG. 2H, the anti-reflective layer 212 and the insulating interlayer 211, the etching stopper 210 and the insulating interlayer 209 are etched by a dry etching process using CF based gas plasma and using the copper diffusion barrier layer 208 as an etching stopper. In this case, since the copper diffusion barrier layer 208 is an incomplete etching stopper, the copper diffusion barrier layer 208 may be also etched as indicated by X.

Next, referring to FIG. 2I, the photoresist layer 213 and the anti-reflective layer 212 are ashed by a dry ashing process using $O_2$ gas plasma. In this case, an exposed portion of the copper layer 207 is oxidized, so that a copper oxide layer 207c is grown in the copper layer 207.

Next, referring to FIG. 2J, an anti-reflective layer 214 and a photoresist layer 215 are sequentially coated on the entire surface. Then, the photoresist layer 215 is patterned by a photolithography process so that a groove 215a is formed in the photoresist layer 215. In this case, the anti-reflective layer 214 is buried in the via hole 213a.

Next, referring to FIG. 2K, the insulating interlayer 211 and the etching stopper 210 are etched by a dry etching process using CF based gas plasma and using the photoresist layer 215 as a mask.

Next, referring to FIG. 2L, the photoresist layer 215 and the anti-reflective layer 214 are ashed by a dry ashing process using $O_2$ gas plasma. In this case, the copper oxide layer 207c is further grown in the copper layer 207.

Next, referring to FIG. 2M, the copper diffusion-barrier layer 208 is etched back by a dry etching process. Then, a wet stripping process is performed upon the insulating interlayer 211, the etching stopper 210, the insulating interlayer 209 and the copper diffusion-barrier layer 208, so that residues of the dry etching process are completely removed.

Next, referring to FIG. 2N, a barrier metal layer 216 made of Ta on TaN and a seed copper layer 217a are sequentially deposited by a sputtering process on the entire surface. Then, a copper layer 217b is further deposited by an electroplating process using the seed copper layer 217a as an cathode electrode. Note that the copper layers 217a and 217b form a copper layer 217. Then, an annealing treatment is performed upon the copper layer 217 under a $N_2$ atmosphere to crystallize the copper layer 217.

Next, referring to FIG. 2O, the copper layer 217 and the barrier metal layer 216 on the insulating interlayer 211 are removed by a CMP process.

Finally, referring to FIG. 2P, a copper diffusion barrier layer 218 made of SiCN is deposited by a plasma CVD process.

Figure 3:
FIG. 3 is a graph showing the manufacturing yield of the via structure obtained by the method as illustrated in FIGS. 2A through 2P.

In the method as illustrated in FIGS. 2A through 2P, when the copper diffusion barrier layer 208 is overetched, the copper layer 207 is oxidized by the dry ashing process using $O_2$ gas plasma, which decreases the manufacturing yield of the via structure and enhances the electromigration of the via structure. If the photolithography and etching process for the insulating interlayers 211 and 209 fails, photolithography and etching processes for the insulating interlayers 211 and 209 are repeated. In this case, since the copper layer 207 is further oxidized by the dry ashing process using $O_2$ gas plasma, the manufacturing yield of the via structure is further decreased as shown in FIG. 3. This is true for a middle-first type dual-damascene structure and a trench-first type dual-damascene structure.

Figure 4:
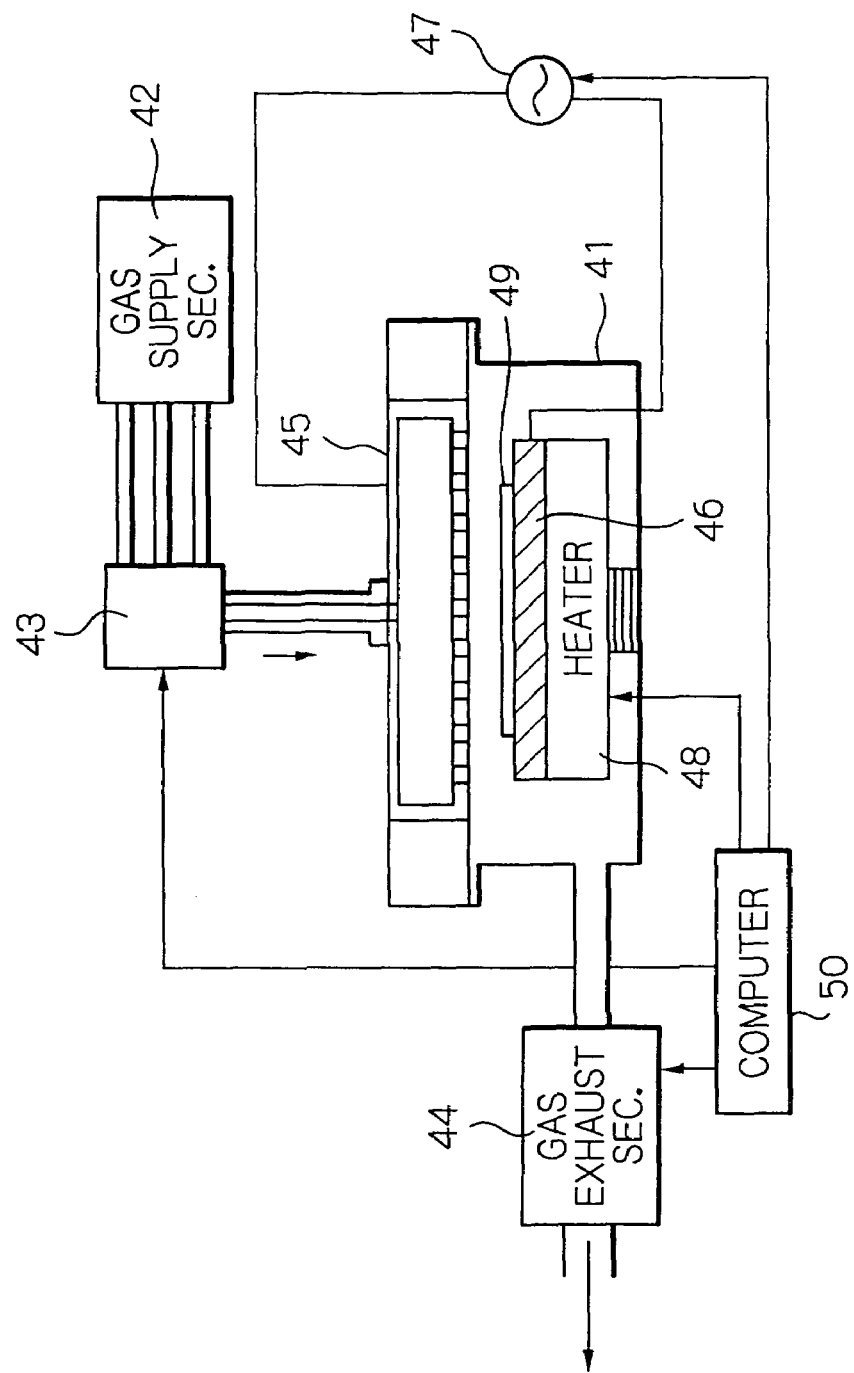
FIG. 4 is a cross-sectional view illustrating a conventional parallel-plate type plasma chemical vapor deposition (CVD) apparatus.

FIG. 4 illustrates a conventional parallel-plate type plasma CVD apparatus which is used in the manufacture of a semiconductor device according to the present invention, reference numeral 41 designates a processing chamber where a plurality of reaction gases are supplied from a gas supply section 42 via a gas flow rate controller 43 and a reacted gas is exhausted by a gas exhaust section 44, so that the pressure in the processing chamber 41 is controlled to be definite. The processing chamber 41 is provided with an upper plate electrode 45 and a lower plate electrode 46 to which a radio frequency (RF) power is applied from an RF source 47. A lower surface of the electrode 46 is fixed on a heater 48, while an upper surface of the electrode 46 is used for mounting a semiconductor wafer 49. The gas flow rate controller 43, the gas exhaust section 44, the RF source 47 and the heater 48 are controlled by a computer 50.

For example, when depositing a SiN layer on the semiconductor wafer 49, $SiH_4$ gas, $NH_3$ gas and $N_2$ gas are supplied from the gas supply section 42 via the gas flow rate controller 43 controlled by the computer 50 to the processing chamber 41. Also, the heater 48 is controlled by the computer 50, so that the temperature in the processing chamber 41 is caused to be a predetermined value. Further, a predetermined RF power is supplied by the RF power source 47 controlled by the computer 50. Additionally, the gas exhaust section 44 is controlled by the computer 50, so that the processing pressure is caused to be a predetermined value.

FIGS. 5A through 5J are cross-sectional views for explaining a first embodiment of the method for manufacturing a semiconductor device according to the present invention. In this case, a one-layer single-damascene structure is formed.

Figure 5A:
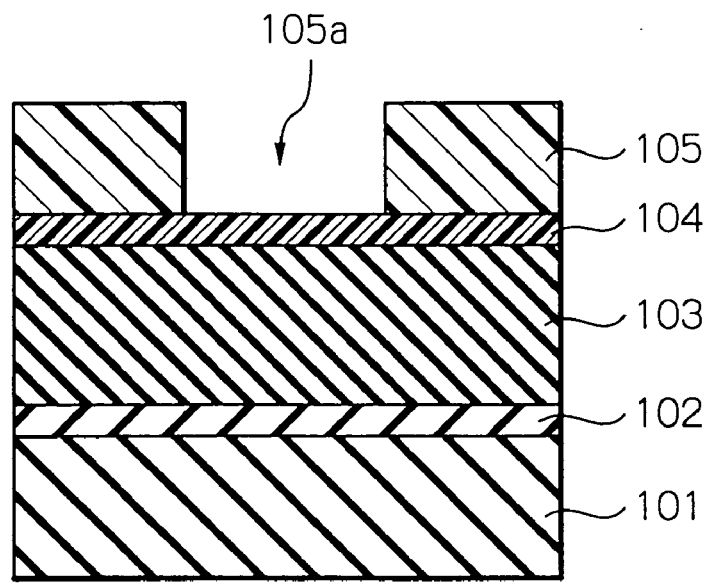
FIGS. 5A through 5J are cross-sectional views for explaining a first embodiment of the method for manufacturing a semiconductor device according to the present invention.

First, referring to FIG. 5A, in the same way as in FIG. 1A, an insulating underlayer 101 made of silicon dioxide or the like is formed on a silicon substrate (not shown) where various semiconductor elements are formed. Then, an about 50 nm thick etching stopper 102 made of SiGN is formed by a plasma process on the insulating underlayer 101. Then, an about 400 nm thick insulating interlayer 103 made of silicon dioxide is deposited by a plasma CVD process on the etching stopper 102. Then, an anti-reflective coating layer 104 and a photoresist layer 105 are sequentially coated on the insulating interlayer 103. Then, the photoresist layer 105 is patterned by a photolithography process, so that a groove 105a is formed in the photoresist layer 105. Note that the insulating interlayer 103 can be made of a low-k material having a lower dielectric constant than that of silicon dioxide.

Figure 5B:
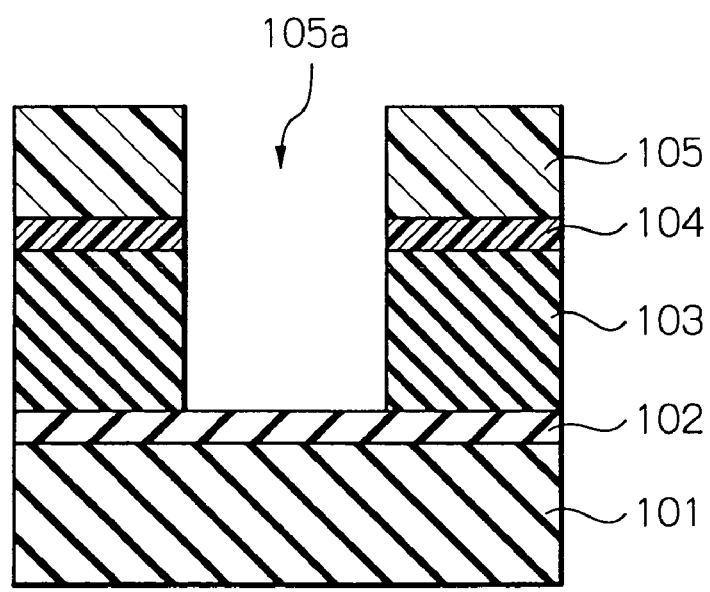

Next, referring to FIG. 5B, in the same way as in FIG. 1B, the anti-reflective coating layer 104 and the insulating interlayer 103 is etched by a dry etching process using the photoresist layer 105 as a mask.

Figure 5C:
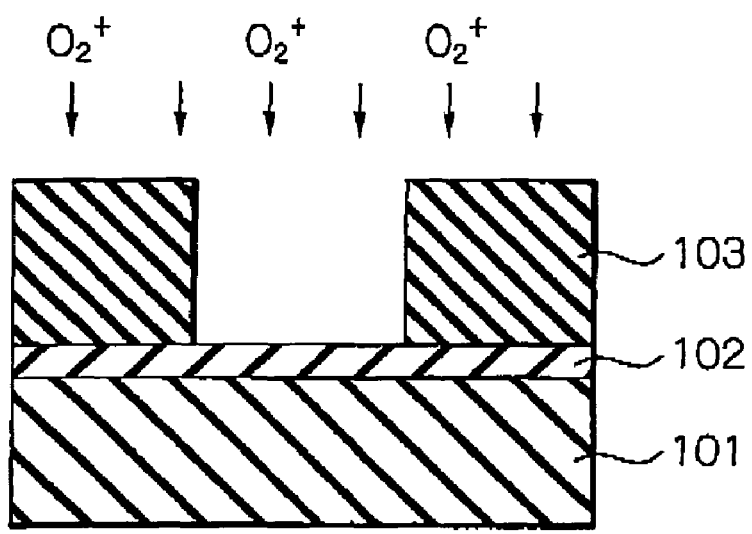

Next, referring to FIG. 5C, in the same way as in FIG. 1C, the photoresist layer 105 and the anti-reflective layer 104 are ashed by a dry ashing process using $O_2$ gas plasma.

Figure 5D:
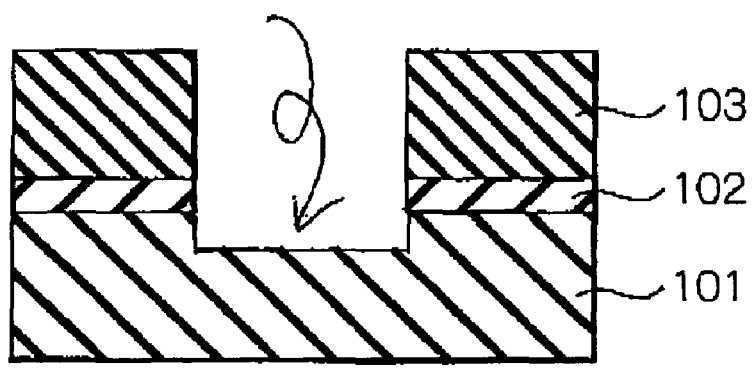

Next, referring to FIG. 5D, in the same way as in FIG. 1D, the etching stopper 102 is etched back by a dry etching process. Then, a wet stripping process is performed upon the insulating interlayer 103 and the insulating underlayer 101, so that residues of the dry etching process is completely removed.

Figure 5E:
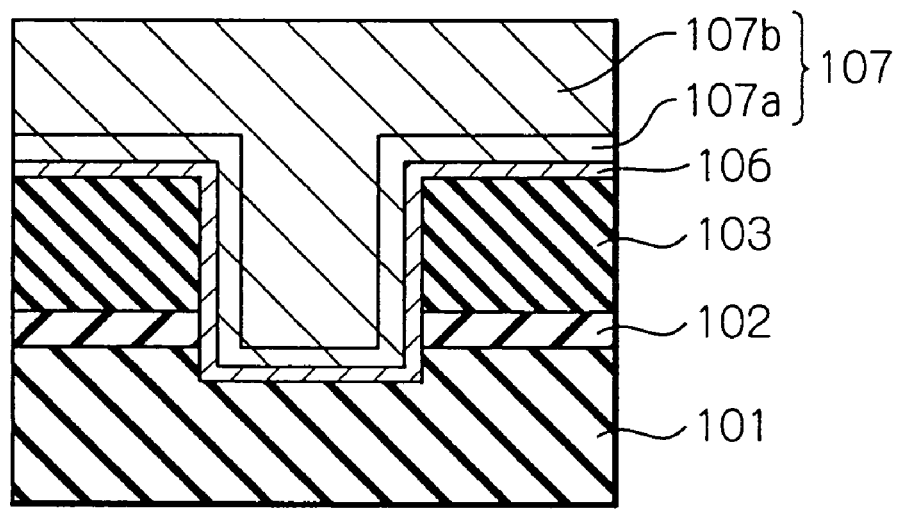

Next, referring to FIG. 5E, in the same way as in FIG. 1E, an about 30 nm thick barrier metal layer 106 made of Ta on TaN and an about 100 nm thick seed copper layer 107a are sequentially deposited by a sputtering process on the entire surface. Then, an about 700 nm thick copper layer 107b is further deposited by an electroplating process using the seed copper layer 107a as a cathode electrode. Note that the copper layers 107a and 107b form a copper layer 107. Then, an annealing treatment is performed upon the copper layer 107 under a $N_2$ atmosphere to crystallize the copper layer 107 at a temperature of about 400° C. for about 30 minutes.

Figure 5F:
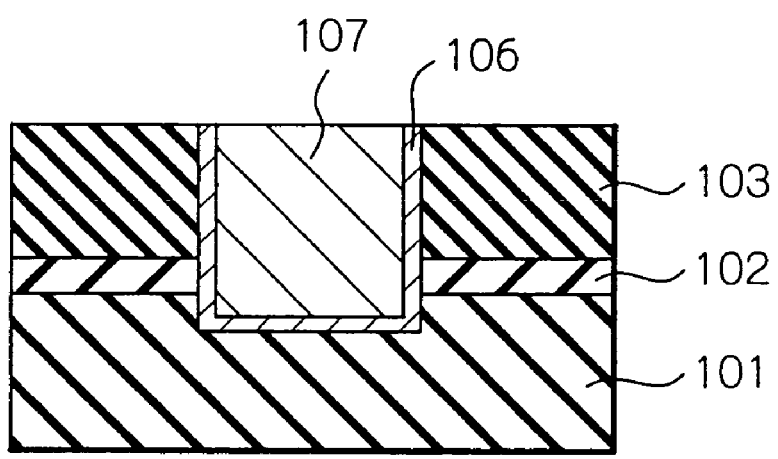

Next, referring to FIG. 5F, in the same way as in FIG. 1F, the copper layer 107 and the barrier metal layer 106 on the insulating interlayer 103 are removed by a CMP process.

Figure 5G:
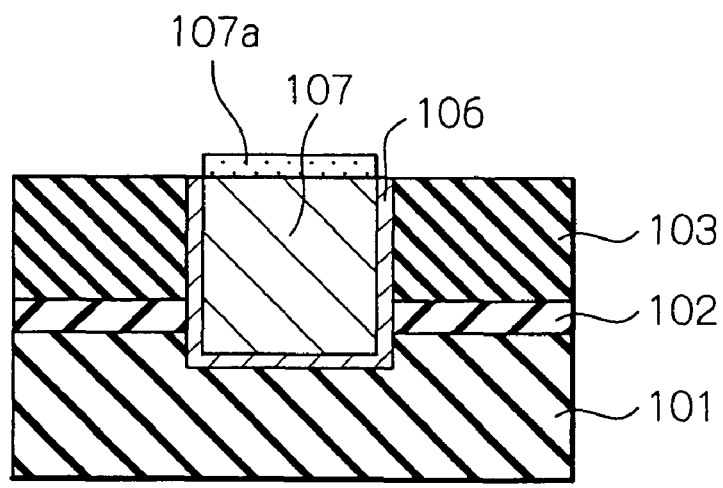

Next, referring to FIG. 5G, the semiconductor device is cleaned and rinsed. In this case, since Cu oxide (not shown) is grown on the copper layer 107 by pure water, the Cu oxide is removed by a solution of oxalic acid. Then, the semiconductor device is immersed into a 1% diluted solution of benzotriazole (BTA). As a result, BTA reacts with the Cu oxide, so that a BTA layer 107a serving as an oxidation barrier layer is formed on the copper layer 107. Note that the step of removing the Cu oxide by oxalic acid can be deleted.

Figure 5H:
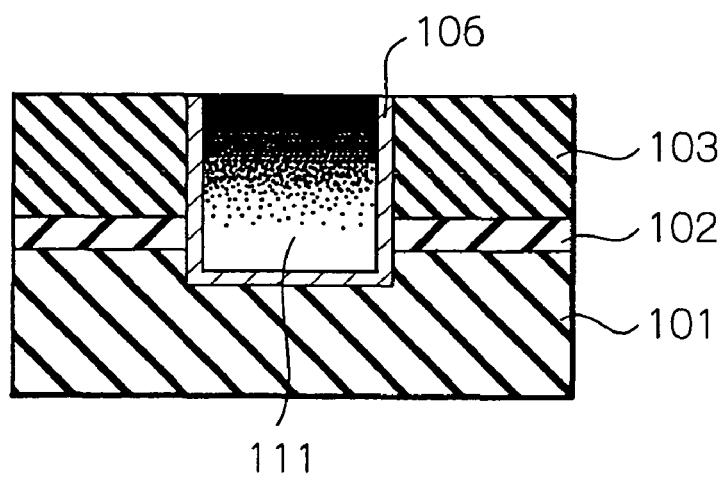

Next, referring to FIG. 5H, the semiconductor device is put into the plasma CVD apparatus of FIG. 4. Then, in the plasma CVD apparatus of FIG. 4, a heating process is performed upon the BTA layer 107a for 2 minutes under the following conditions:

temperature: 250 to 400° C.
$N_2$ gas: 0 to 5000 sccm
processing pressure: 0 to 20 Torr (0 to 2666.4 Pa).

As a result, the BTA layer 107a is thermally decomposed and removed. In this case, the copper layer 107 includes no Cu silicide.

Subsequently, in the plasma CVD apparatus of FIG. 4, a heating process is performed upon the copper layer 107 for 120 seconds under the following conditions:

temperature: 250 to 400° C.
$SiH_4$ gas: 10 to 1000 sccm
$N_2$ (or Ar, He etc.) gas: 0 to 5000 sccm
processing pressure: 0 to 20 Torr (0 to 2666.4 Pa).

Thus, the copper layer 107 is converted into a silicon-diffused copper layer 111. Note that inorganic silane gas such as $Si_2H_6$ gas or $SiH_2Cl_2$ can be used instead of $SiH_4$ gas under the conditions that the temperature is 250 to 400° C. and the processing pressure is less than 20 Torr (2666 Pa), to decrease the processing time. Then, in the plasma CVD apparatus of FIG. 4, as occasion demands, a plasma process is further performed upon the silicon-diffused copper layer 111 and the insulating interlayer 103 for 3 seconds under the following conditions:

NH$_3$ gas: 10 to 1000 sccm
N$_2$ gas: 0 to 5000 sccm
processing pressure: 1 to 20 Torr (133.3 to 2666.4 Pa)
high frequency wave at 100 kHz to 13.56 MHz
RF power: 50 to 500 W.

Thus, silicon (not shown) on the surfaces of the silicon-diffused copper layer 111 and the insulating interlayer 103 is nitrized. Note that the silicon on the surfaces can also be etched by a plasma process using Ar (or He) gas.

In FIG. 5H, note that at least one of NH$_3$ gas, H$_2$ gas, He gas, Ar gas and SiH$_4$ gas without O$_2$ gas can be used instead of N$_2$ gas. That is, NH$_3$ gas or H$_2$ gas react with remainder Cu oxide between the copper layer 107 and the BTA layer 107a, so as to remove the remainder Cu oxide. Further, a heat treatment at 250 to 400° C. and a pressure of less than 20 Torr (2666 Pa) without any gas can remove the BTA layer 107a. Note that this plasma process is carried out at a temperature of 250 to 400° C., at a processing pressure less than 20 Torr (2666 Pa) and at an RF power of 50 to 500 W.

Note that, after the BTA layer 107a is formed as illustrated in FIG. 5G and before the heating process as illustrated in FIG. 5H is carried out, if Cu oxide on the copper layer 107 is removed by reducing it by reducing gas plasma treatment using H$_2$ gas or NH$_3$ gas, the growth of Cu silicide is enhanced, which is not preferable. On the other hand, after the heating process as illustrated in FIG. 5H is carried out, if Cu oxide on the silicon-diffused copper layer 111 is removed by reducing gas plasma treatment using H$_2$ gas or NH$_3$ gas, there is no effect on the growth of Cu silicide, so that no problem occurs.

Figure 5I:
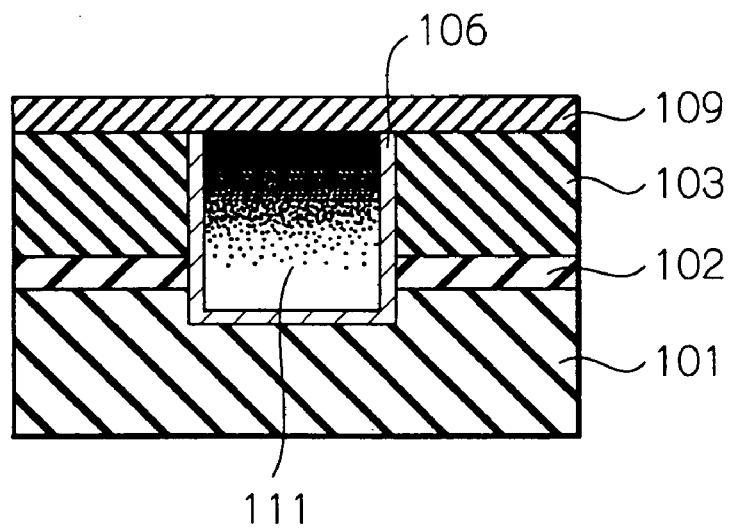

Next, referring to FIG. 5I, in the plasma CVD apparatus of FIG. 4, a plasma process is carried out under the following conditions:

SiH (CH$_3$)$_3$ gas: 10 to 1000 sccm
NH$_3$ gas: 10 to 500 sccm
He gas: 0 to 5000 sccm
processing pressure: 1 to 20 Torr (133.3 to 2666.4 Pa)
high frequency wave at 100 kHz to 13.56 MHz
RF power: 50 to 500 W.

Figure 6:
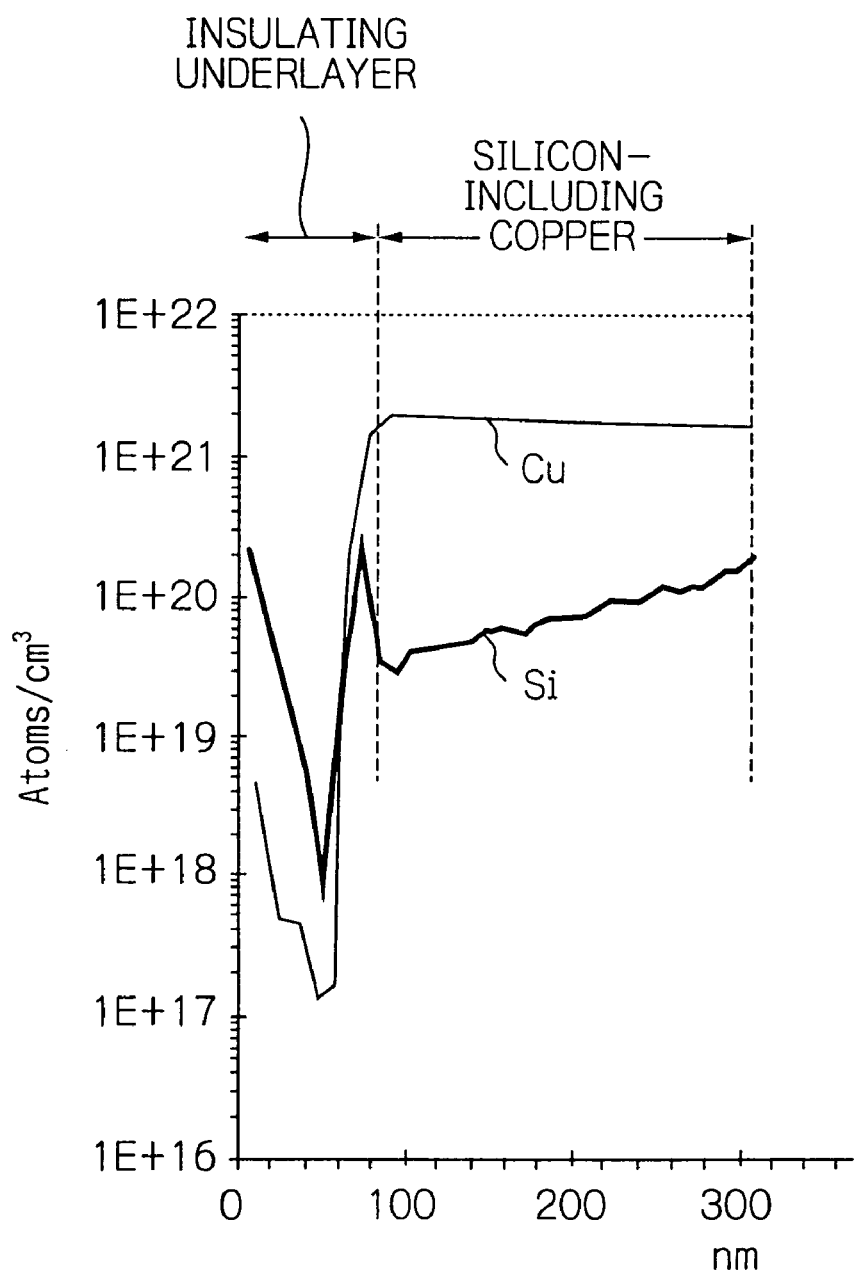
FIG. 6 is a graph showing the Si component distribution within the silicon-diffused copper layer of FIG. 5I.

Thus, an about 50 nm thick copper diffusion barrier layer 109 made of SiCN is deposited on the entire surface. In this case, the silicon on an upper side of the silicon-diffused copper layer 111 diffuses deeply thereinto. As a result, the Si component distribution within the silicon-diffused copper layer 111 is shown in FIG. 6 where an insulating underlayer (SiO$_2$) is in direct contact with a silicon-diffused copper layer. That is, the deeper the location of the silicon-diffused copper layer 111, the smaller the concentration of Si. As a result, the contact characteristics between the silicon-diffused copper layer 111 and the copper diffusion barrier layer 109 can be improved. Also, the ratio of silicon component to copper component is caused to be lower than 8 atoms %, so that no Cu silicide having a large resistance is generated (see Cu—Si phase diagram of FIG. 7).

Note that the copper diffusion barrier layer 109 can be made of SiC, SiCN, SiOC or organic material such as benzocycrobutene by a plasma process in the plasma CVD apparatus of FIG. 4. Also, the copper diffusion barrier layer 109 can be a multiple layer of SiC, SiCN, SiOC and the above-mentioned organic material.

Figure 5J:
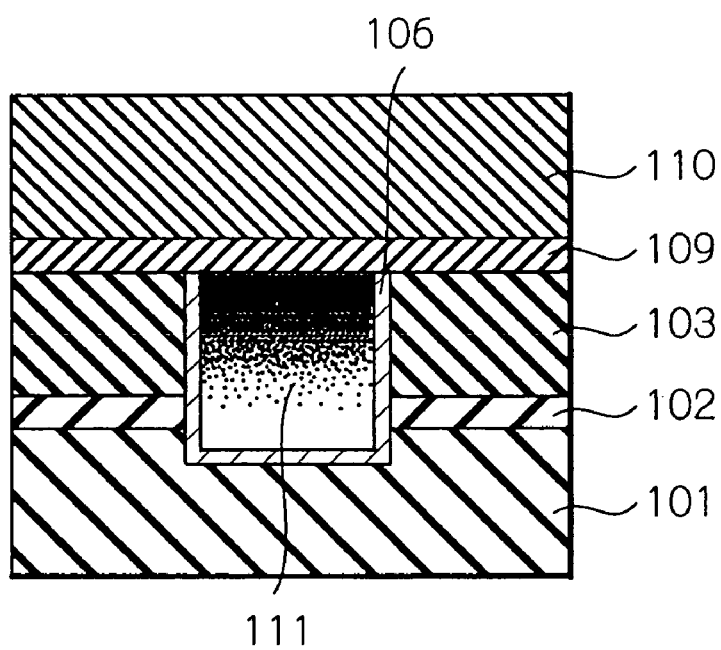

Finally, referring to FIG. 5J, an about 500 nm thick insulating interlayer 110 made of silicon dioxide is formed on the copper diffusion barrier layer 109. Note that the insulating interlayer 110 can be made of a low-k material having a lower dielectric constant than that of silicon dioxide.

In the method as illustrated in FIGS. 5A through 5J, since the three processes as illustrated in FIGS. 5H and 5I are sequentially carried out in the plasma CVD apparatus of FIG. 4 without exposing the semiconductor device to the air, no oxide is grown between the silicon-diffused copper layer 111 and the copper diffusion barrier layer 109.

Also, since silicon is diffused into the entirety of the silicon-diffused copper layer 111, the migration of copper atoms within the silicon-diffused copper layer 111 can be suppressed. Additionally, since the total amount of silicon in the silicon-diffused copper layer 111 is smaller than the total amount of silicon in the Cu silicide layer 108 of FIG. 1I, the increase of resistance in the wiring layer, i.e., the silicon-diffused copper layer 111 can be suppressed. Further, at a post stage, even if the silicon-diffused copper layer 111 is etched by an etching process, since silicon is present on the etched surface, the oxidation of the silicon-diffused copper layer 111 is suppressed, which would increase the manufacturing yield.

The temperature range of the heating processes carried out as shown FIG. 5H will be explained next with reference to FIGS. 8A, 8B and 8C.

The reason why the upper limit of the temperature is 400° C. is explained with reference to FIG. 8A which shows Cu silicide generation characteristics of FIG. 5H. That is, when the temperature is lower than about 400° C., no Cu silicide is grown on the silicon-diffused copper layer 111. However, when the temperature is 425° C., Cu silicide is partially grown on the silicon-diffused copper layer 111. Further, when the temperature is 450° C., a lot of Cu silicide is grown on the silicon-diffused copper layer 111. Note that, in the prior art method as illustrated in FIG. 1G, even when the temperature is 250° C., a lot of Cu silicide is grown on the copper layer 107 of FIG. 1G.

The reason why the lower limit of the temperature is about 250° C. is explained with reference to FIG. 8B which shows BTA removal characteristics of FIG. 5H. That is, when the temperature is 180° C., the BTA layer 107a starts to be removed. Also, when the temperature is 250° C. the removal amount of the BTA layer 107a reaches its maximum.

Also, referring to FIG. 8C, which shows the presence or absence of Si in the layer 111 of FIG. 5H executed by using an atmospheric pressure ion-mass spectroscopy (API-MS) method, when the temperature is 200° C. or 225° C., no Si is observed in the layer 111. On the other hand, when the temperature is 250° C., 300° C., 350° C. or 400° C., Si is observed in the layer 111.

Thus, at a step as illustrated in FIG. 5H, when the heating process is carried out at a temperature from 250 to 400° C., the copper layer 107 is converted into the silicon-diffused copper layer 111 while the BTA layer 107a is completely removed, thus enhancing the throughput.

Figure 9B:
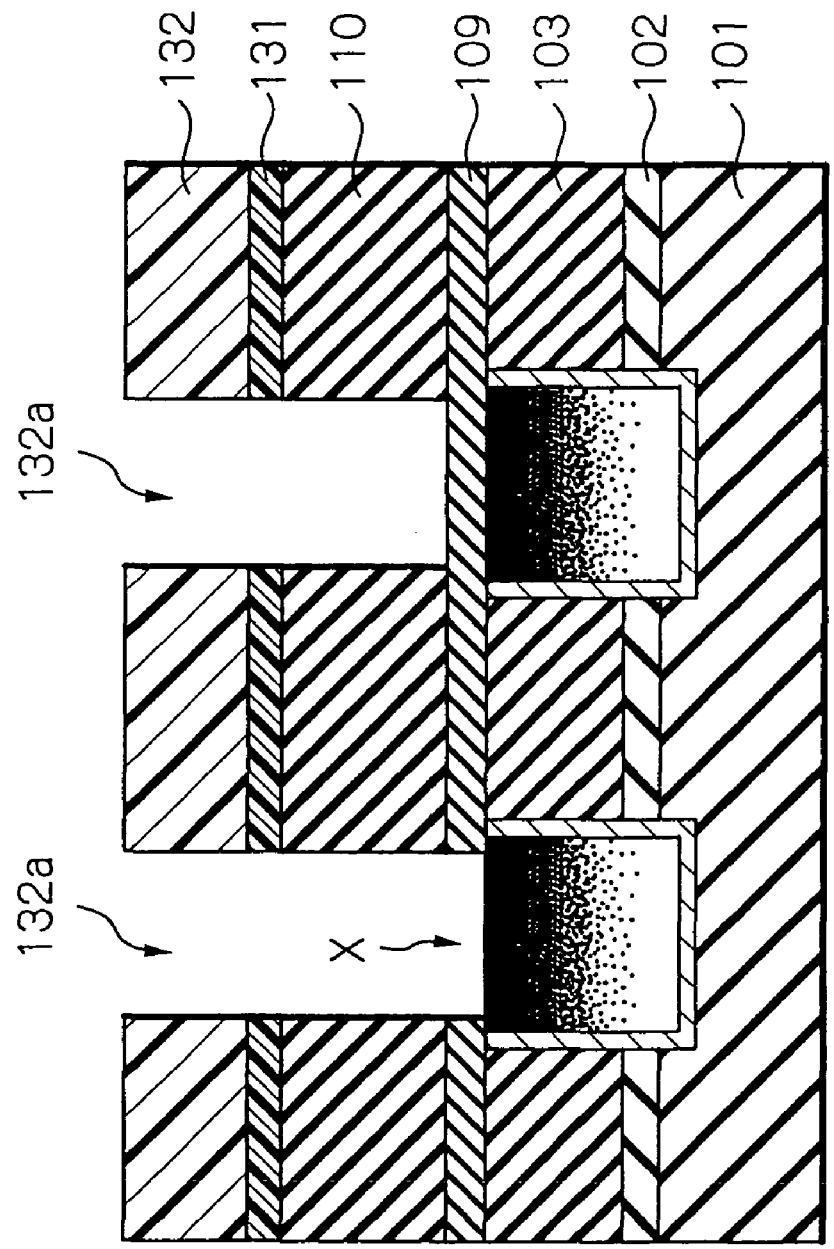
FIGS. 9A through 9S are cross-sectional views for explaining a second embodiment of the method for manufacturing a semiconductor device according to the present invention.
Figure 9F:
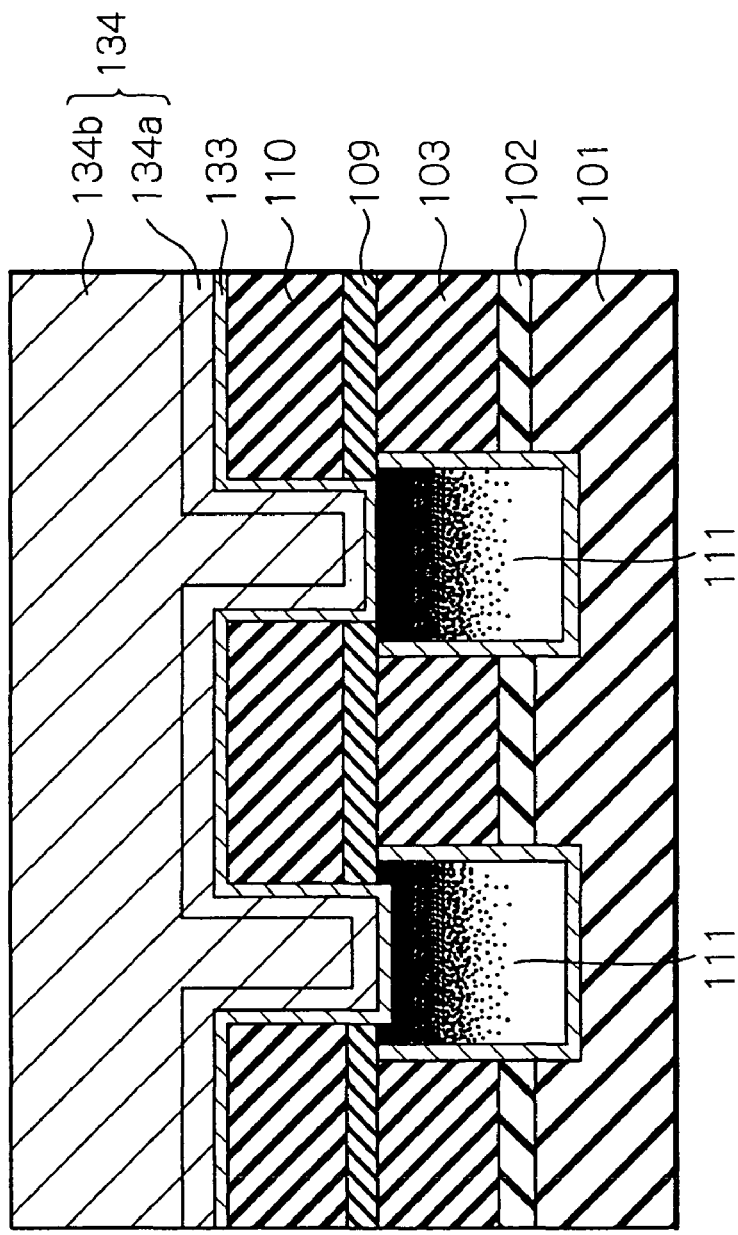
Figure 9H:
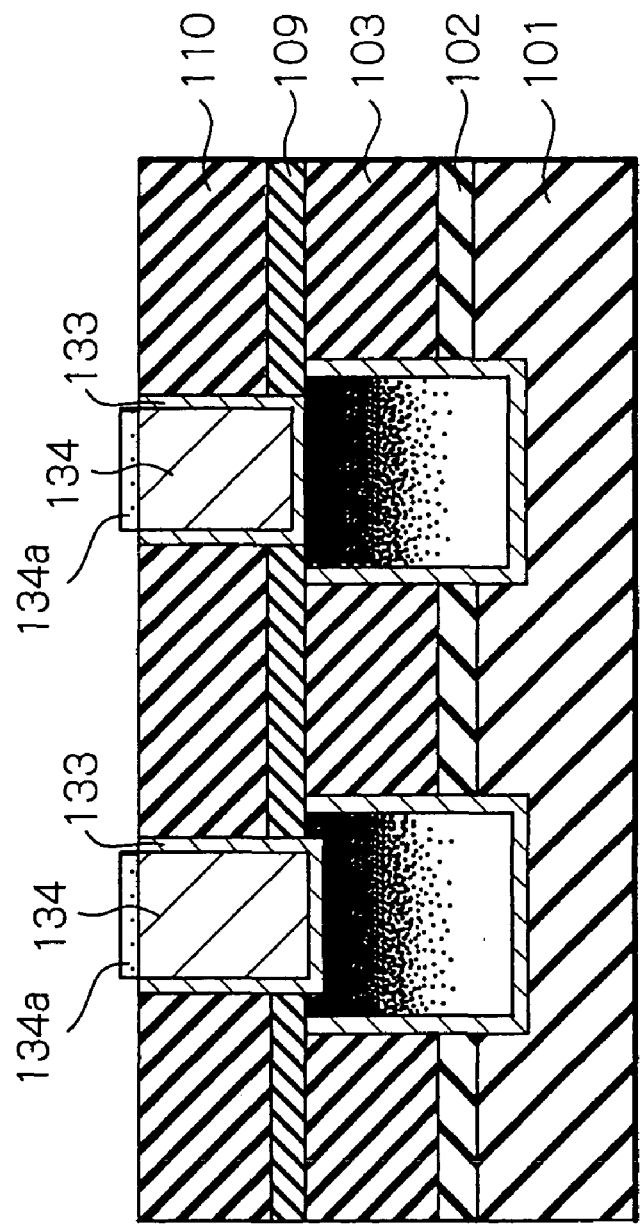
Figure 9I:
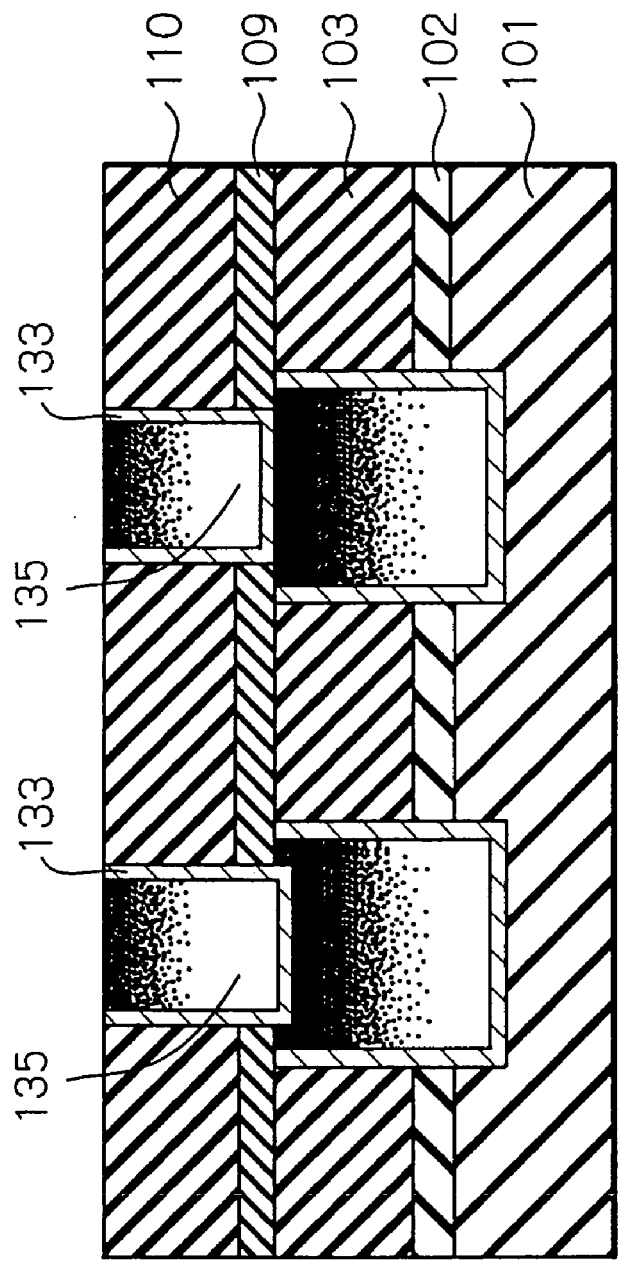
Figure 9K:
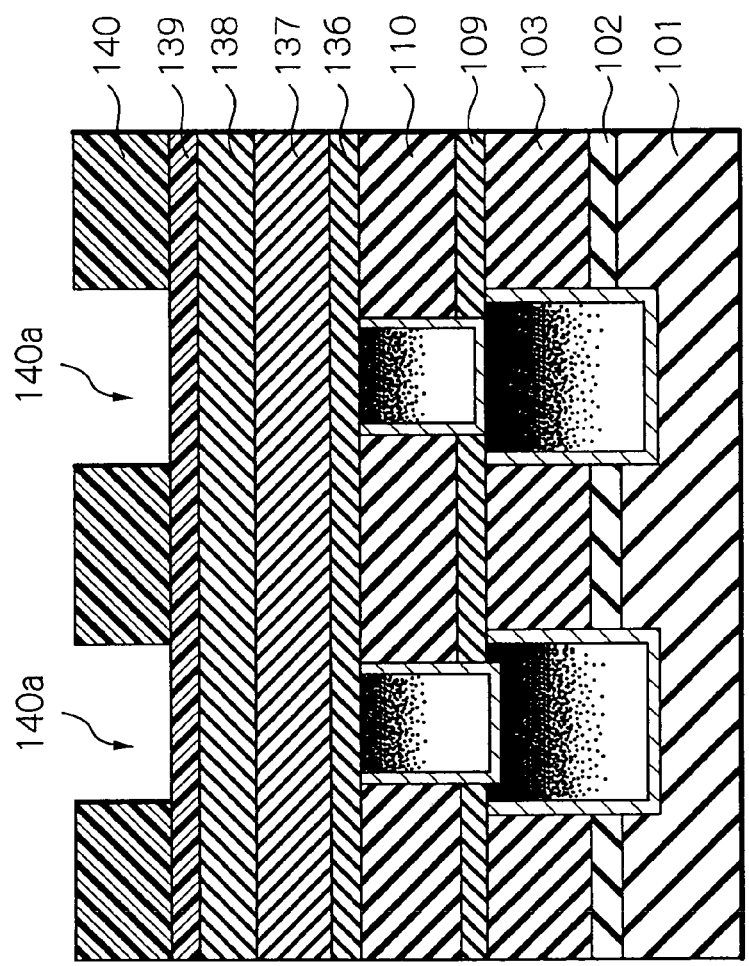
Figure 9L:
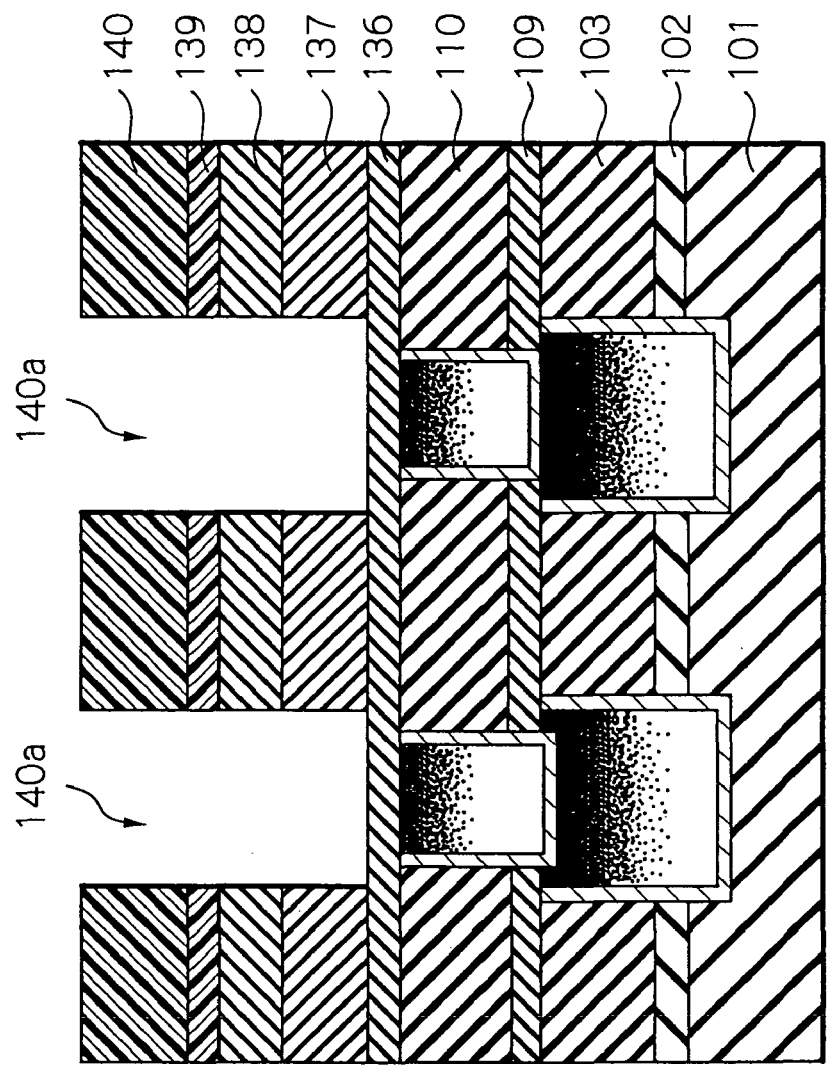
Figure 9M:
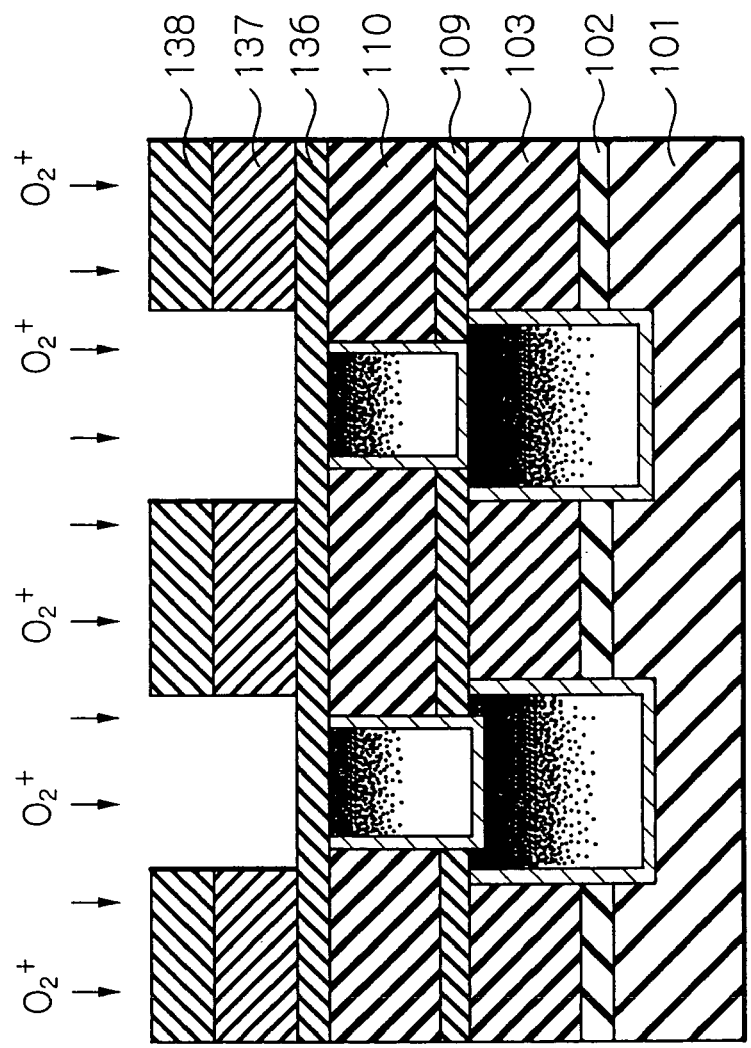
Figure 9N:
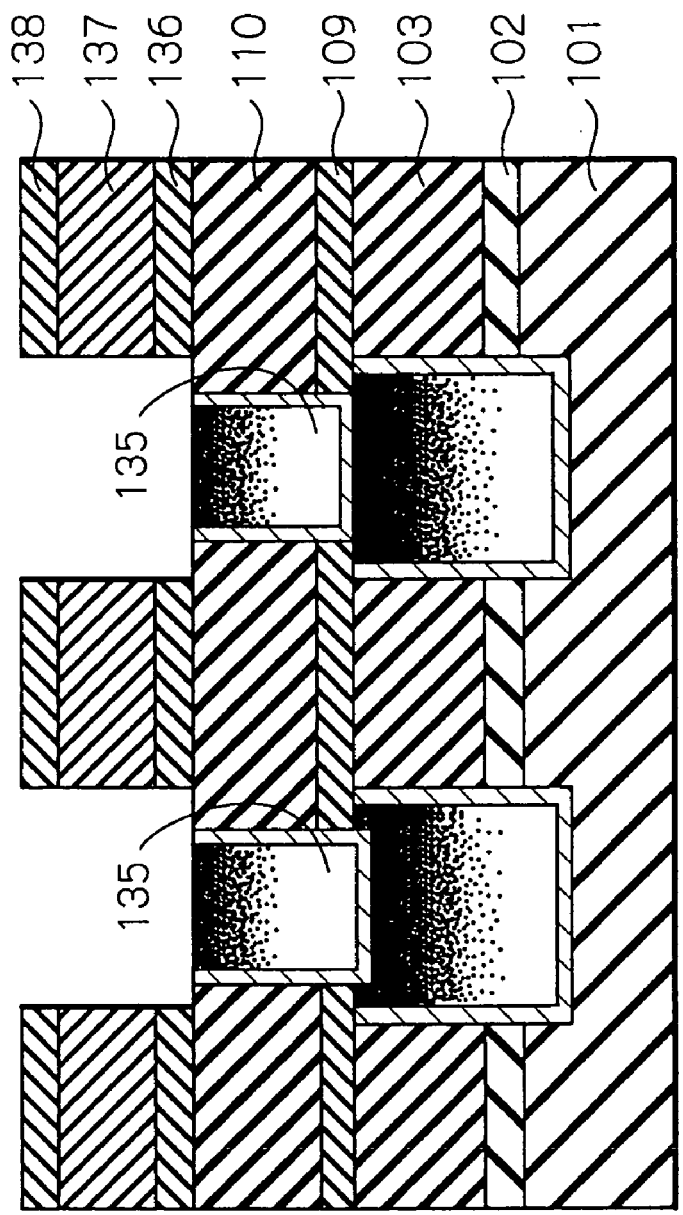
Figure 90:
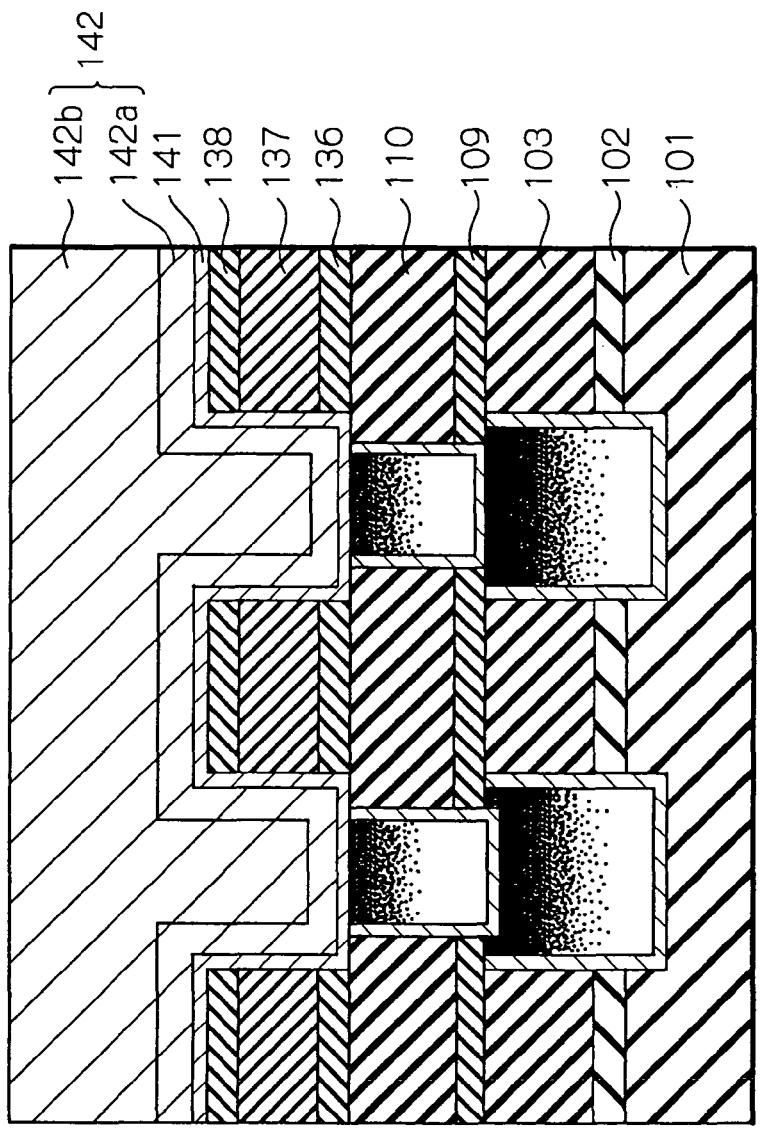
Figure 9Q:
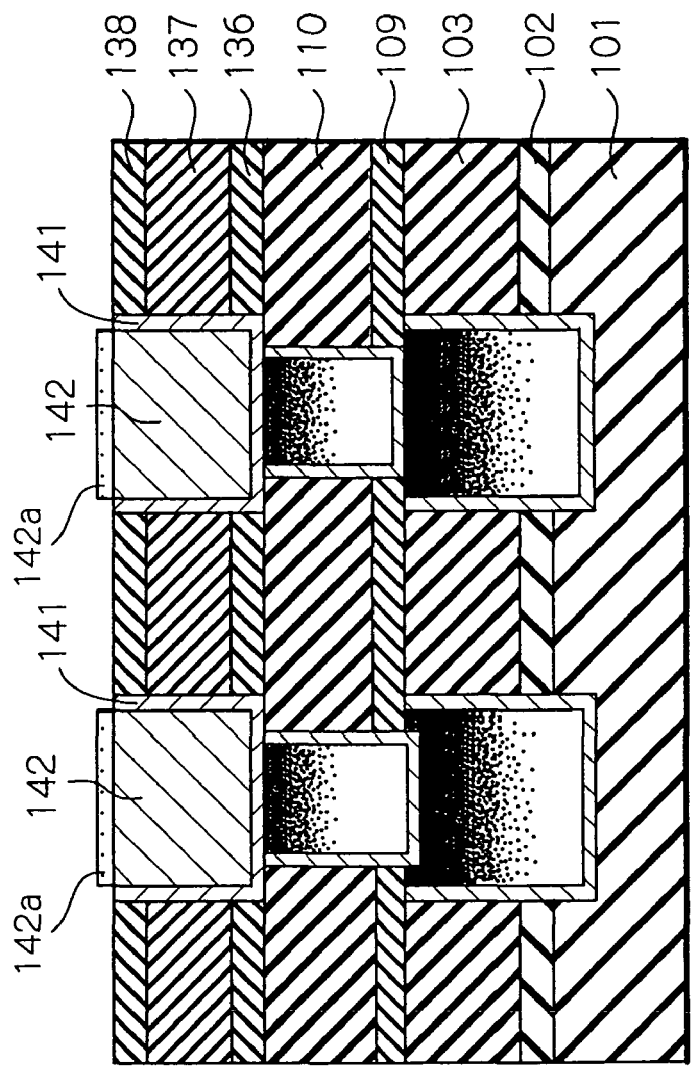
Figure 9R:
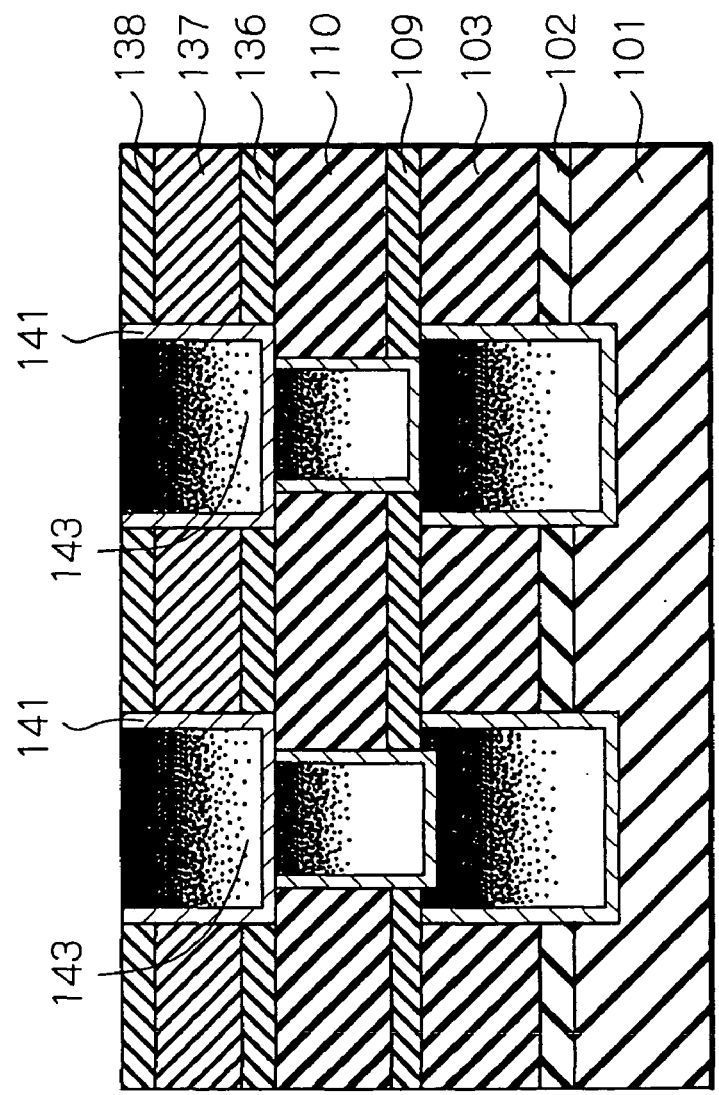
Figure 9S:
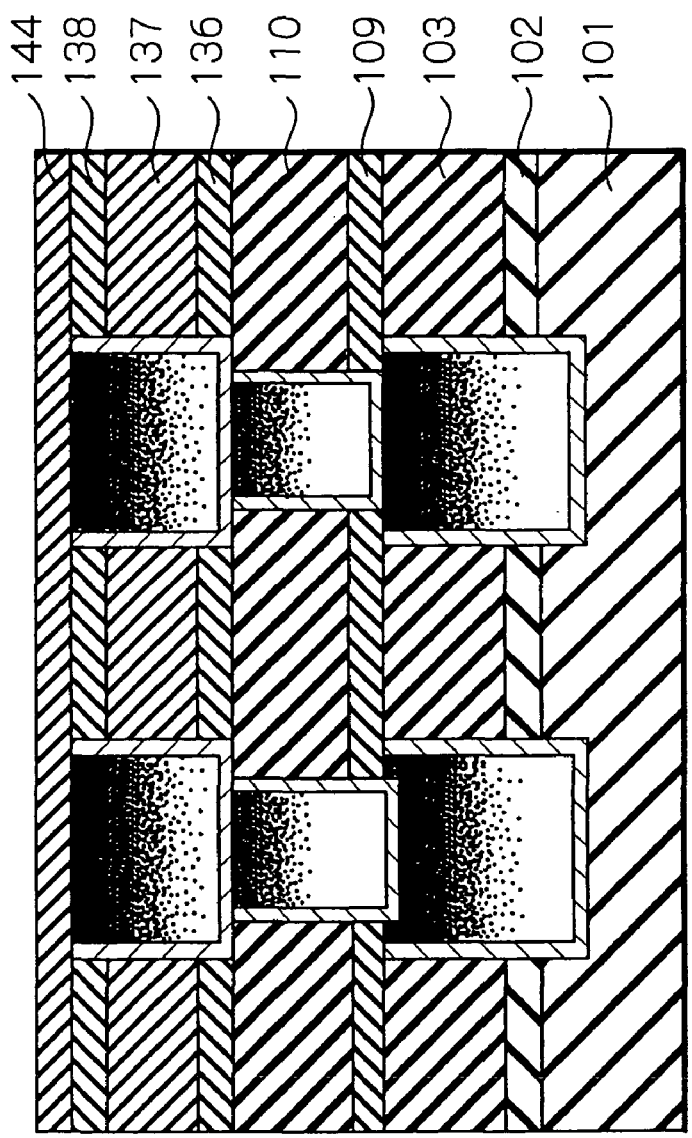

FIGS. 9A through 9S are cross-sectional views for explaining a second embodiment of the method for manufacturing a semiconductor device according to the present invention. In this case, a two-layer single-damascene structure is formed.

Assume that the semiconductor device as illustrated in FIG. 5J is completed. In this case, the silicon-diffused copper layer 111 serves as a lower wiring layer.

Next, referring to FIG. 9A, an anti-reflective coating layer 131 and a photoresist layer 132 are sequentially coated on the insulating interlayer 110. Then, the photoresist layer 132 is patterned by a photolithography process, so that a via hole 132a is formed in the photoresist layer 132.

Next, referring to FIG. 9B, the insulating interlayer 110 and the anti-reflective coating layer 131 is etched by a dry etching process using the photoresist layer 132 as a mask. In this case, since the copper diffusion barrier layer 109 is an incomplete etching stopper, the copper diffusion barrier layer 109 may be also etched as indicated by X.

Next, referring to FIG. 9C, the photoresist layer 132 and the anti-reflective layer 131 are ashed by a dry ashing process using $O_2$ gas plasma. In this case, since the silicon concentration of the silicon-diffused copper layer 111 on the surface thereof is high, and the electronegativity of Si is larger than that of Cu, the Si component of the exposed portion of the silicon-diffused copper layer 111 is oxidized, so that a silicon oxide layer 111a is grown in the silicon-diffused copper layer 111 in self-alignment with the via hole 132a. The silicon oxide layer 111a serves as a copper oxidation barrier layer.

Next, referring to FIG. 9D, the copper diffusion barrier layer 109 is etched back by a dry etching process. Then, a wet stripping process is performed upon the insulating interlayer 110, so that residues of the dry etching process is completely removed.

Note that the process as illustrated in FIG. 9D can be carried out before the process as illustrated in FIG. 9C.

Next, referring to FIG. 9E, the silicon oxide layer 111a is etched by a plasma etching process.

Next, referring to FIG. 9F, an about 30 nm thick barrier metal layer 133 made of Ta on TaN and an about 100 nm thick seed copper layer 134a are sequentially deposited by a sputtering process on the entire surface. Then, an about 700 nm thick copper layer 134b is further deposited by an electroplating process using the seed copper layer 134a as a cathode electrode. Note that the copper layers 134a and 134b form a copper layer 134. Then, an annealing treatment is performed upon the copper layer 134 under a $N_2$ atmosphere to crystallize the copper layer 134 at a temperature of about 400° C. for about 30 minutes.

Next, referring to FIG. 9G, the copper layer 134 and the barrier metal layer 133 on the insulating interlayer 110 are removed by a CMP process.

Next, referring to FIG. 9H, the semiconductor device is cleaned and rinsed. In this case, since Cu oxide (not shown) is grown on the copper layer 134 by pure water, the Cu oxide is removed by a solution of oxalic acid. Then, the semiconductor device is immersed into a 1% diluted solution of benzotriazole (BTA). As a result, BTA reacts with the Cu oxide, so that a BTA layer 134a serving as an oxidation barrier layer is formed on the copper layer 134. Note that the step of removing the Cu oxide by oxalic acid can be deleted.

Next, referring to FIG. 9I, the semiconductor device is put into the plasma CVD apparatus of FIG. 4. Then, in the plasma CVD apparatus of FIG. 4, a heating process is performed upon the BTA layer 134a for 2 minutes under the following conditions:
temperature: 250 to 400° C.
$N_2$ gas: 0 to 5000 sccm
processing pressure: 0 to 20 Torr (0 to 2666.4 Pa).

As a result, the BTA layer 134a is thermally decomposed and removed. In this case, the copper layer 134 includes no Cu silicide.

Subsequently, in the plasma CVD apparatus of FIG. 4, a heating process is performed upon the copper layer 134 for 120 seconds under the following conditions:
temperature: 250 to 400° C.
$SiH_4$ gas: 10 to 1000 sccm
$N_2$ gas: 0 to 5000 sccm
processing pressure: 0 to 20 Torr (0 to 2666.4 Pa).

Thus, the copper layer 134 is converted into a silicon-diffused copper layer 135. Note that inorganic silane gas such as $Si_2H_6$ gas or $SiH_2Cl_2$ can be used instead of $SiH_4$ gas under the conditions that the temperature is 250 to 400° C. and the processing pressure is less than 20 Torr (2666 Pa), to decrease the processing time. Then, in the plasma CVD apparatus of FIG. 4, as occasion demands, a plasma process is further performed upon the silicon-diffused copper layer 135 and the insulating interlayer 110 for 3 seconds under the following conditions:
$NH_3$ gas: 10 to 1000 sccm
$N_2$ gas: 0 to 5000 sccm
processing pressure: 1 to 20 Torr (133.3 to 2666.6 Pa)
RF power: 50 to 500 W.

Thus, silicon (not shown) on the surfaces of the silicon-diffused copper layer 135 and the insulating interlayer 110 is nitrized. Note that the silicon on the surfaces can be etched by a plasma process using Ar gas.

Next, referring to FIG. 9J, in the plasma CVD apparatus of FIG. 4, a plasma process is carried out under the following conditions:
$SiH(CH_3)_3$ gas: 10 to 1000 sccm
$NH_3$ gas: 10 to 500 sccm
He gas: 0 to 5000 sccm
processing pressure: 1 to 20 Torr (133.3 to 2666.4 Pa)
RF power: 50 to 500 W.

Thus, an about 50 nm thick copper diffusion barrier layer 136 made of SiCN is deposited on the entire surface. In this case, the silicon on an upper side of the silicon-diffused copper layer 135 diffuses deeply thereinto. As a result, the Si component distribution within the silicon-diffused copper layer 135 is shown in FIG. 6. That is, the deeper the location of the silicon-diffused copper layer 135, the smaller the concentration of Si. As a result, the contact characteristics between the silicon-diffused copper layer 135 and the copper diffusion barrier layer 136 can be improved. Also, the ratio of silicon component to copper component is caused to be lower than 8 atoms %, so that no Cu silicide having a large resistance is generated (see Cu—Si phase diagram of FIG. 7).

Note that the copper diffusion barrier layer 136 can be made of SiC, SiCN, SiOC or organic material such as fluorocarbon polymers or amorphous carbon by a plasma process in the plasma CVD apparatus of FIG. 4. Also, the copper diffusion barrier layer 136 can be a multiple layer of SiC, SiCN, SiOC and the above-mentioned organic material.

Next, referring to FIG. 9K, an about 300 nm thick insulating interlayer 137 made of a low-k material such as SiOF, SiOC, organic material or inorganic material such as ladder-type hydrogen siloxane having a lower dielectric constant than that of silicon dioxide is coated on the copper diffusion barrier layer 136. Then, an about 100 nm thick mask insulating layer 138 made of silicon dioxide is deposited by a plasma CVD process on the insulating interlayer 137. Then, an anti-reflective coating layer 139 and a photoresist layer 140 are sequentially coated on the insulating interlayer 138. Then, the photoresist layer 140 is patterned by a photolithography process, so that a groove (trench) 140a is formed in the photoresist layer 140.

Next, referring to FIG. 9L, the mask insulating layer 138 and the insulating interlayer 137 are etched by a dry etching process using the photoresist layer 140 as a mask. Even in this case, the copper diffusion barrier layer 136 is an incomplete etching stopper, the copper diffusion barrier layer 136 may be also etched, although it is not shown.

Next, referring to FIG. 9M, the photoresist layer 140 and the anti-reflective layer 139 are ashed by a dry ashing process using $O_2$ gas plasma. In this case, since the silicon concentration of the silicon-diffused copper layer 135 on the surface thereof is high, and the electronegativity of Si is larger than that of Cu, the Si component of the exposed portion of the silicon-diffused copper layer 135 is oxidized, so that a silicon oxide layer (not shown) is grown in the silicon-diffused copper layer 135 in self-alignment with the trench 140a. The silicon oxide layer serves as a copper oxidation barrier layer.

Next, referring to FIG. 9N, the copper diffusion barrier layer 136 is etched back by a dry etching process. Then, a wet stripping process is performed upon the mask insulating layer 138 and the insulating interlayer 137, so that residues of the dry etching process are completely removed. Then, the silicon layer (not shown) on the silicon-diffused copper layer 135 is etched by a plasma etching process.

Note that the process as illustrated in FIG. 9N can be carried out before the process as illustrated in FIG. 9M.

Next, referring to FIG. 9O, an about 30 nm thick barrier metal layer 141 made of Ta on TaN and an about 100 nm thick seed copper layer 142a are sequentially deposited by a sputtering process on the entire surface. Then, an about 700 nm thick copper layer 142b is further deposited by an electroplating process using the seed copper layer 142a as a cathode electrode. Note that the copper layers 142a and 142b form a copper layer 142. Then, an annealing treatment is performed upon the copper layer 142 under a $N_2$ atmosphere to crystallize the copper layer 142 at a temperature of about 400° C. for about 30 minutes.

Next, referring to FIG. 9P, the copper layer 142 and the barrier metal layer 141 on the insulating interlayer 138 are removed by a CMP process.

Next, referring to FIG. 9Q, the semiconductor device is cleaned and rinsed. In this case, since Cu oxide (not shown) is grown on the copper layer 142 by pure water, the Cu oxide is removed by a solution of oxalic acid. Then, the semiconductor device is immersed into a 1% diluted solution of benzotriazole (BTA). As a result, BTA reacts with the Cu oxide, so that a BTA layer 142a serving as an oxidation barrier layer is formed on the copper layer 142. Note that the step of removing the Cu oxide by oxalic acid can be deleted.

Next, referring to FIG. 9R, the semiconductor device is put into the plasma CVD apparatus of FIG. 4. Then, in the plasma CVD apparatus of FIG. 4, a heating process is performed upon the BTA layer 142a for 2 minutes under the following conditions:

temperature: 250 to 400° C.
   $N_2$ gas: 0 to 5000 sccm
   processing pressure: 0 to 20 Torr (0 to 2666.4 Pa).

As a result, the BTA layer 142a is thermally decomposed and removed. In this case, the copper layer 142 includes no Cu silicide.

Subsequently, in the plasma CVD apparatus of FIG. 4, a heating process is performed upon the copper layer 142 for 120 seconds under the following conditions:

temperature: 250 to 400° C.
   $SiH_4$ gas: 10 to 100 sccm
   $N_2$ gas: 0 to 5000 sccm
   processing pressure: 0 to 20 Torr (0 to 2666.4 Pa).

Thus, the copper layer 142 is converted into a silicon-diffused copper layer 143. Note that inorganic silane gas such as $Si_2H_6$ gas or $SiH_2Cl_2$ can be used instead of $SiH_4$ gas under the conditions that the temperature is 250 to 400° C. and the processing pressure is less than 20 Torr (2666 Pa), to decrease the processing time. Then, in the plasma CVD apparatus of FIG. 4, as occasion demands, a plasma process is further performed upon the silicon-diffused copper layer 143 and the mask insulating layer 138 for 3 seconds under the following conditions:

$NH_3$ gas: 10 to 1000 sccm
   $N_2$ gas: 0 to 5000 sccm
   processing pressure: 0 to 20 Torr (0 to 2666.4 Pa)
   RF power: 50 to 500 W.

Thus, silicon (not shown) on the surfaces of the silicon-diffused copper layer 143 and the mask insulating layer 138 is nitrized. Note that the silicon on the surfaces can be etched by a plasma process using Ar gas.

Finally, referring to FIG. 9S, in the plasma CVD apparatus of FIG. 4, a plasma process is carried out under the following conditions:

$SiH(CH_3)_3$ gas: 10 to 1000 sccm
   $NH_3$ gas: 10 to 500 sccm
   He gas: 0 to 5000 sccm
   processing pressure: 1 to 20 Torr (133.3 to 2666.4 Pa)
   RF power: 50 to 500 W.

Thus, an about 50 nm thick copper diffusion barrier layer 144 made of SiCN is deposited on the entire surface. In this case, the silicon on an upper side of the silicon-diffused copper layer 143 diffuses deeply thereinto. As a result, the Si component distribution within the silicon-diffused copper layer 143 is shown in FIG. 6. That is, the deeper the location of the silicon-diffused copper layer 143, the smaller the concentration of Si. As a result, the contact characteristics between the silicon-diffused copper layer 143 and the copper diffusion barrier layer 144 can be improved. Also, the ratio of silicon component to copper component is caused to be lower than 8 atoms %, so that no Cu silicide having a large resistance is generated (see Cu—Si phase diagram of FIG. 7).

Note that the copper diffusion barrier layer 144 can be made of SiC, SiCN, SiOC or organic material such as benzocycrobutene by a plasma process in the plasma CVD apparatus of FIG. 4. Also, the copper diffusion barrier layer 144 can be a multiple layer of SiC, SiCN, SiOC and the above-mentioned organic material.

Even in the method as illustrated in FIGS. 9A through 9S, since the three processes for each of the silicon-diffused copper layers 111, 135 and 143 are sequentially carried out in the plasma CVD apparatus of FIG. 4 without exposing the semiconductor device to the air, no oxide is grown between the silicon-diffused copper layers 111, 135 and 143 and the copper diffusion barrier layers 109, 136 and 144.

Also, since silicon is diffused into the entirety of the silicon-diffused copper layers 111, 135 and 143, the migration of copper atoms within the silicon-diffused copper layers 111, 135 and 143 can be suppressed. Additionally, since the total amount of silicon in the silicon-diffused copper layers 111, 135 and 143 is smaller than the total amount of silicon in the Cu silicide layer 108 of FIG. 1H, the increase of resistance in the wiring layer, i.e., the silicon-diffused copper layers 111, 135 and 143 can be suppressed. Further, the oxidation of the silicon-diffused copper layers 111, 135 and 143 is suppressed, which would increase the manufacturing yield.

Figure 8A:
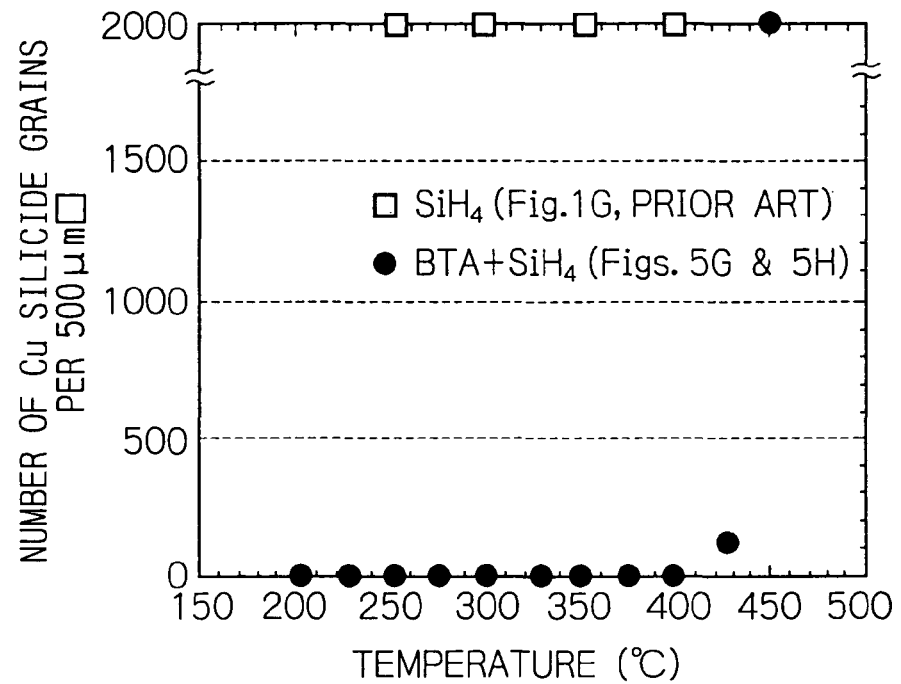
FIG. 8A is a graph showing Cu silicide generation characteristics of FIG. 5H.
Figure 8B:
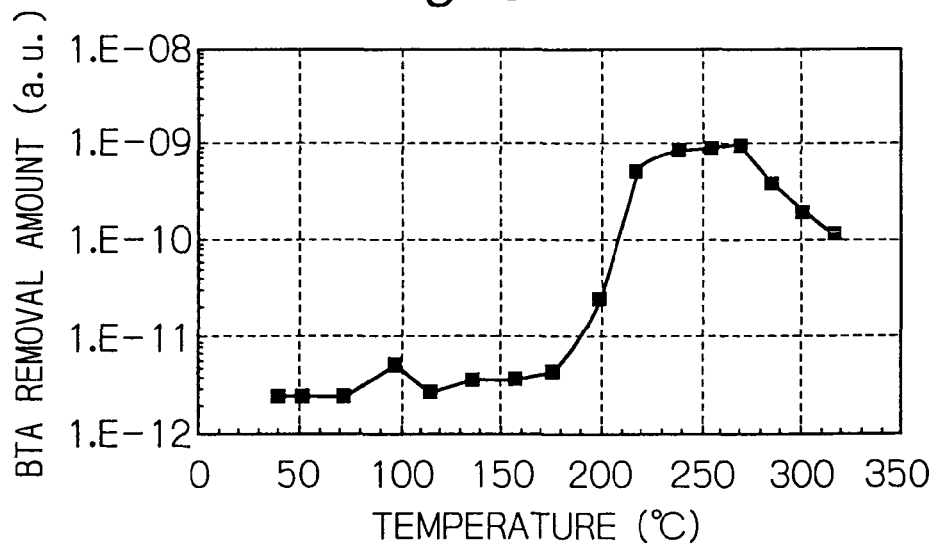
FIG. 8B is a graph shown BTA removal amount characteristics of FIG. 5H.

The modification as illustrated in FIGS. 8A and 8B using a solution of oxalic acid and a solution of benzotriazole (BTA) can also be applied to the method as illustrated in FIGS. 9A through 9S.

In the embodiment as illustrated in FIGS. 9A through 9S, note that the silicon-diffused copper layer 135 can be replaced by a conventional metal layer such as the copper layer 134. In this case, it is unnecessary to convert the copper layer 134 into the silicon-diffused copper layer 135.

Figure 10A:
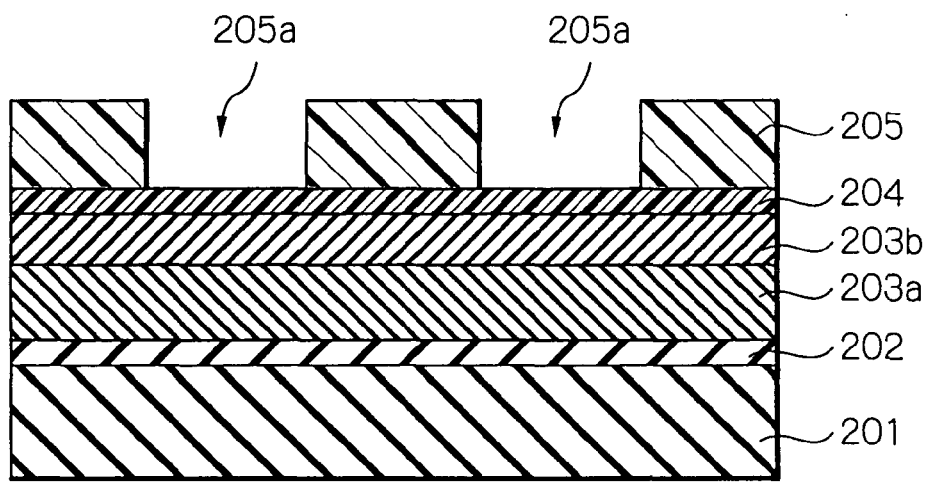
FIGS. 10A through 10V are cross-sectional views for explaining a third embodiment of the method for manufacturing a semiconductor device according to the present invention.
Figure 10B:
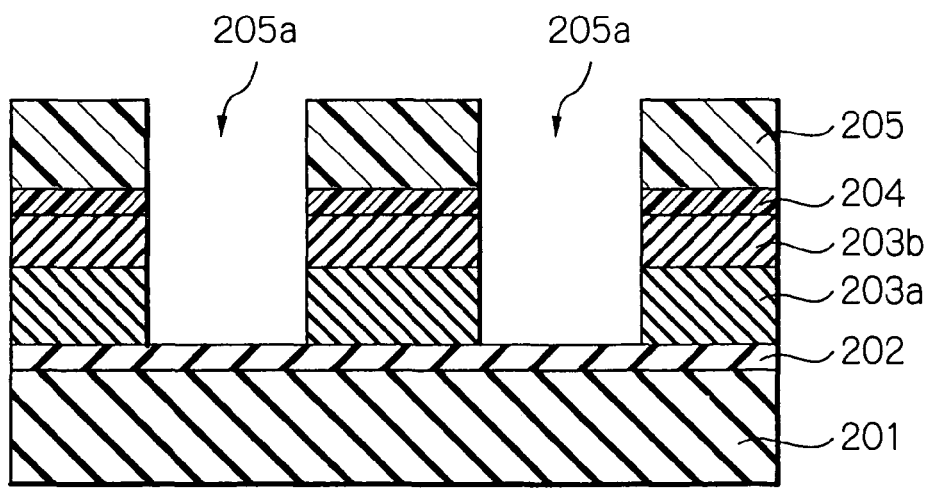
Figure 10C:
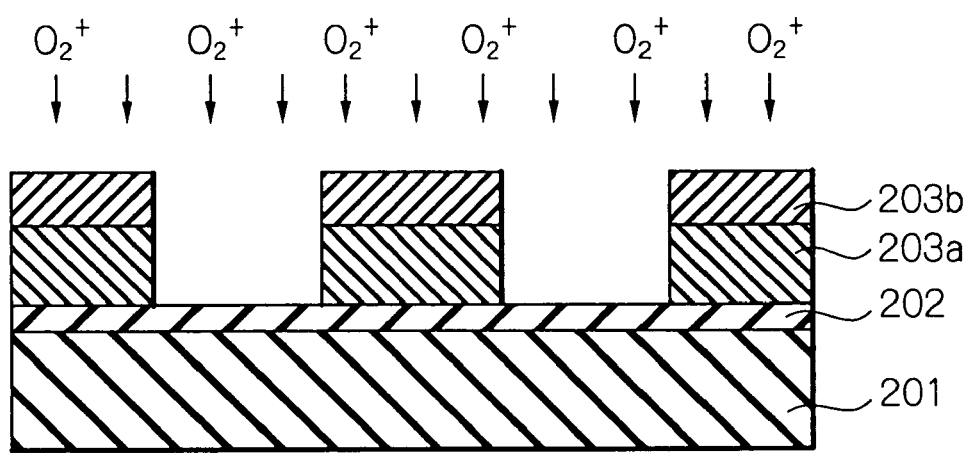
Figure 10D:
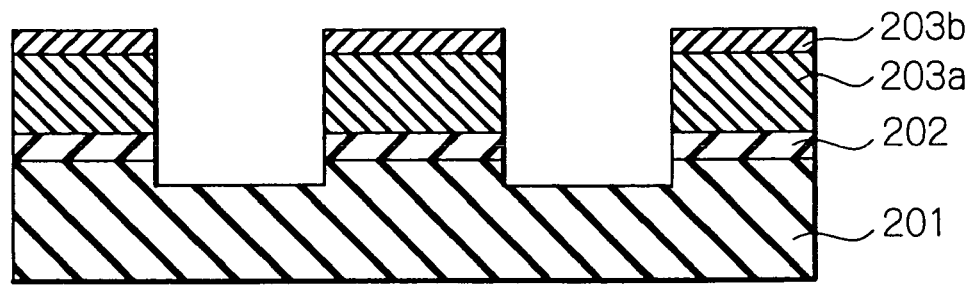
Figure 10E:
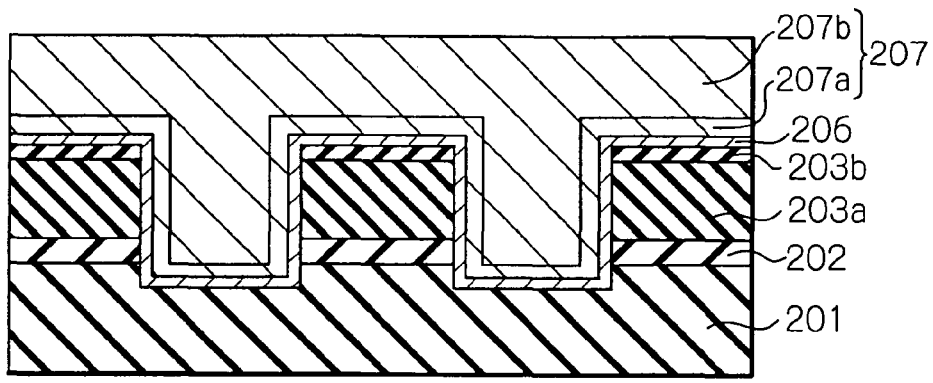
Figure 10F:
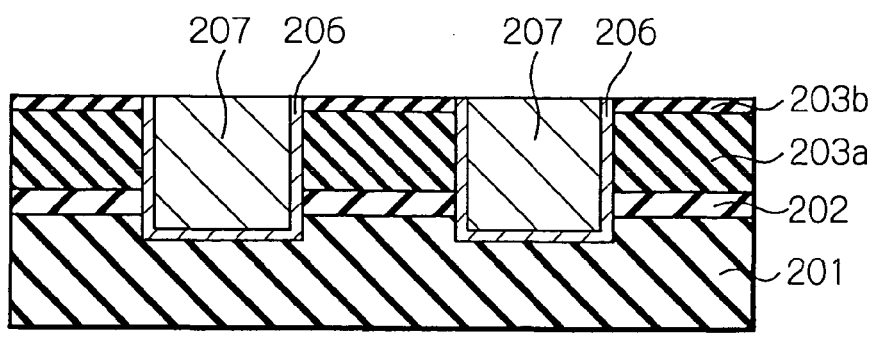
Figure 10G:
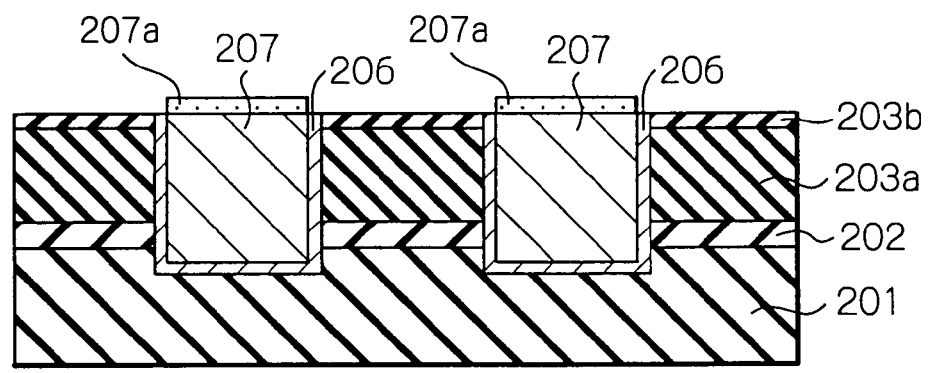
Figure 10H:
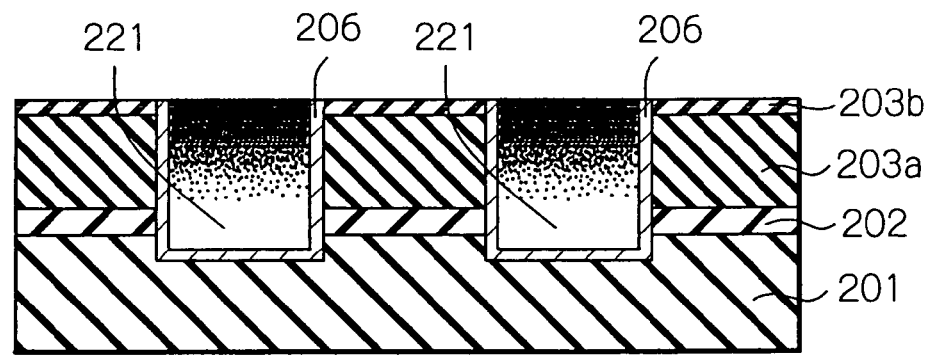
Figure 10I:
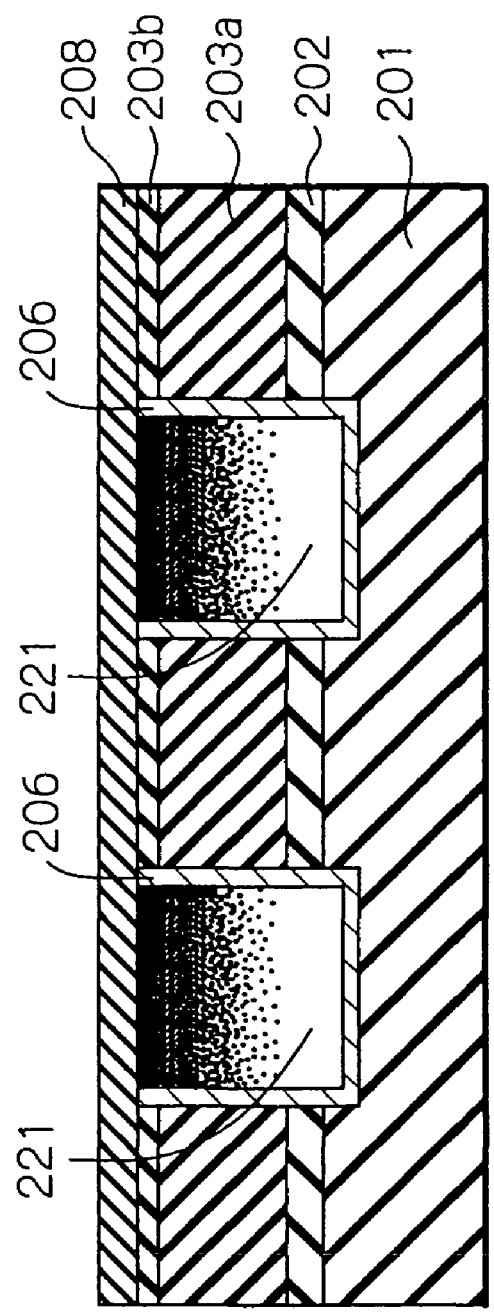
Figure 10M:
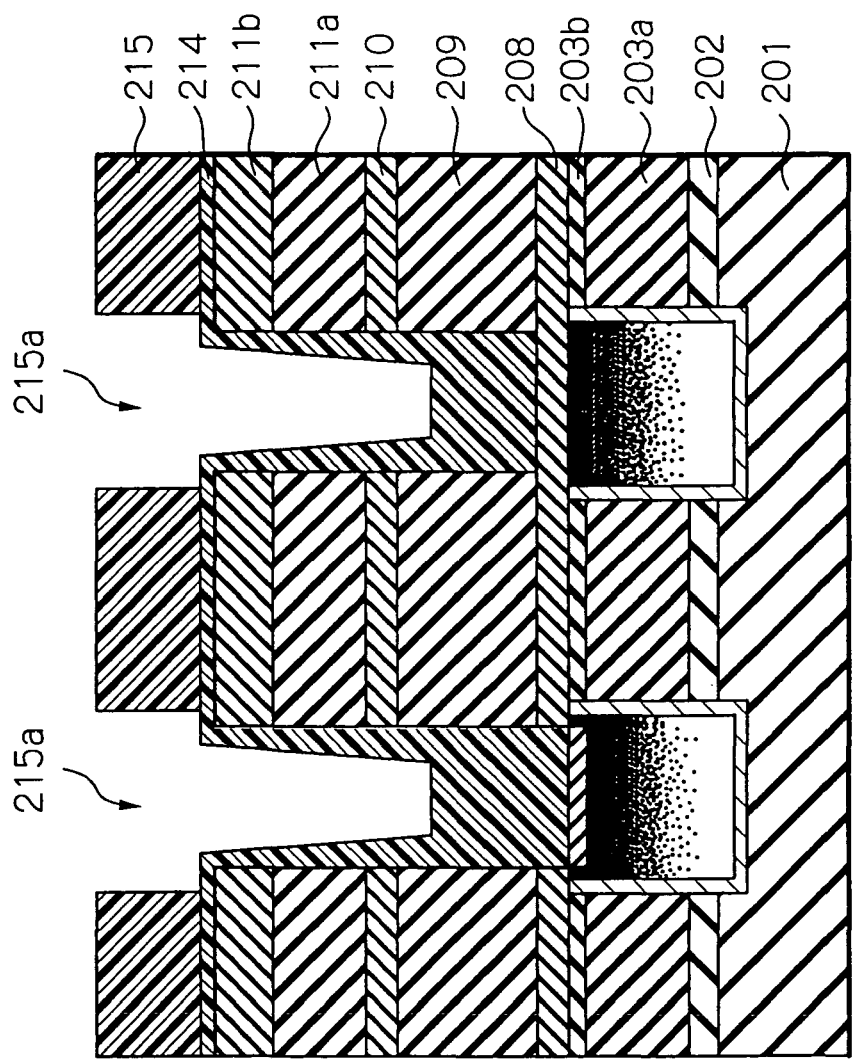
Figure 10P:
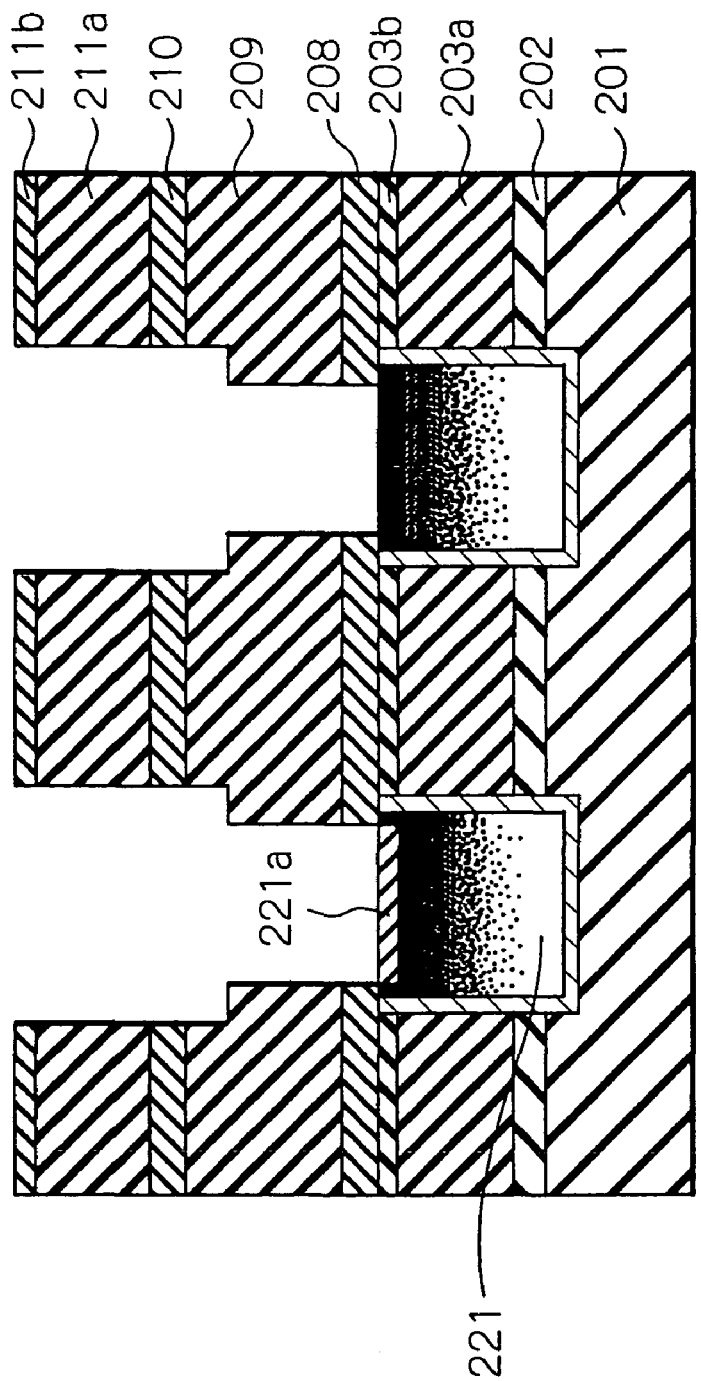
Figure 10Q:
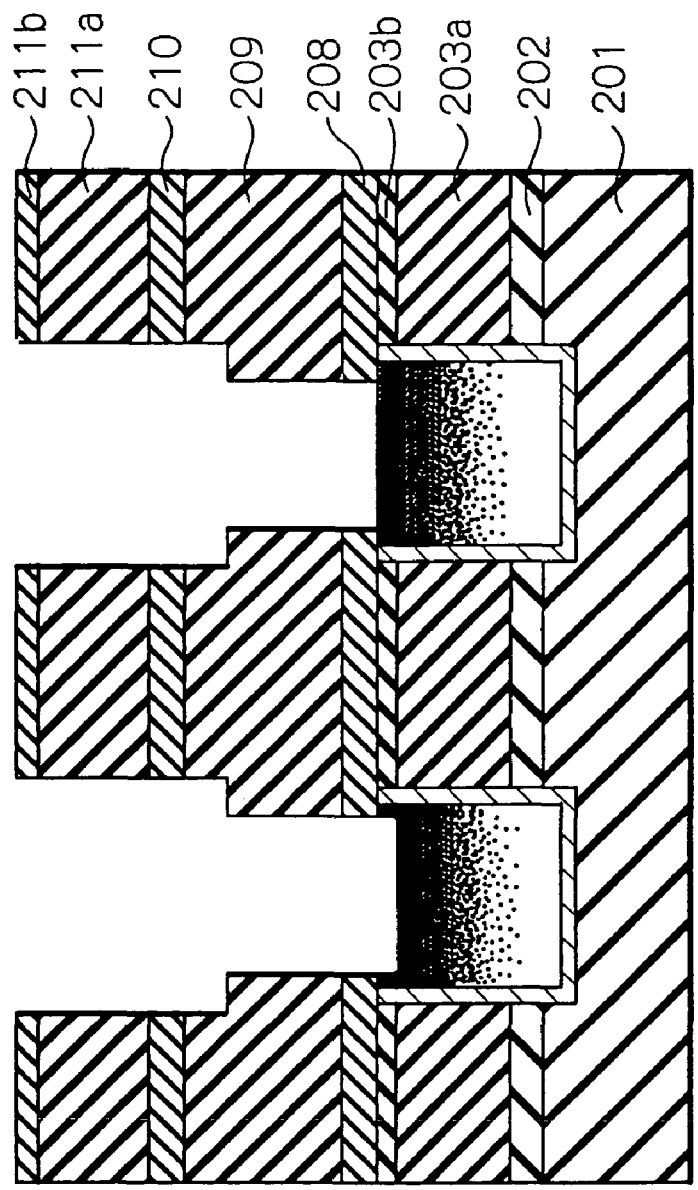
Figure 10U:
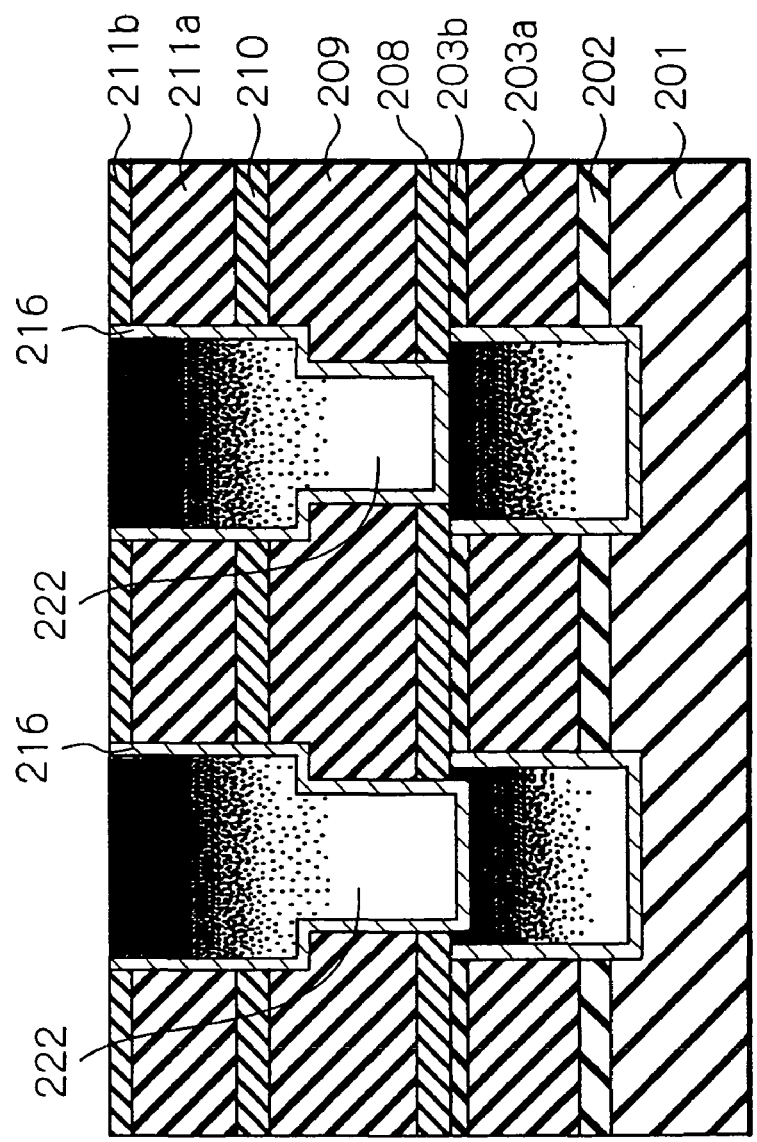
Figure 10V:
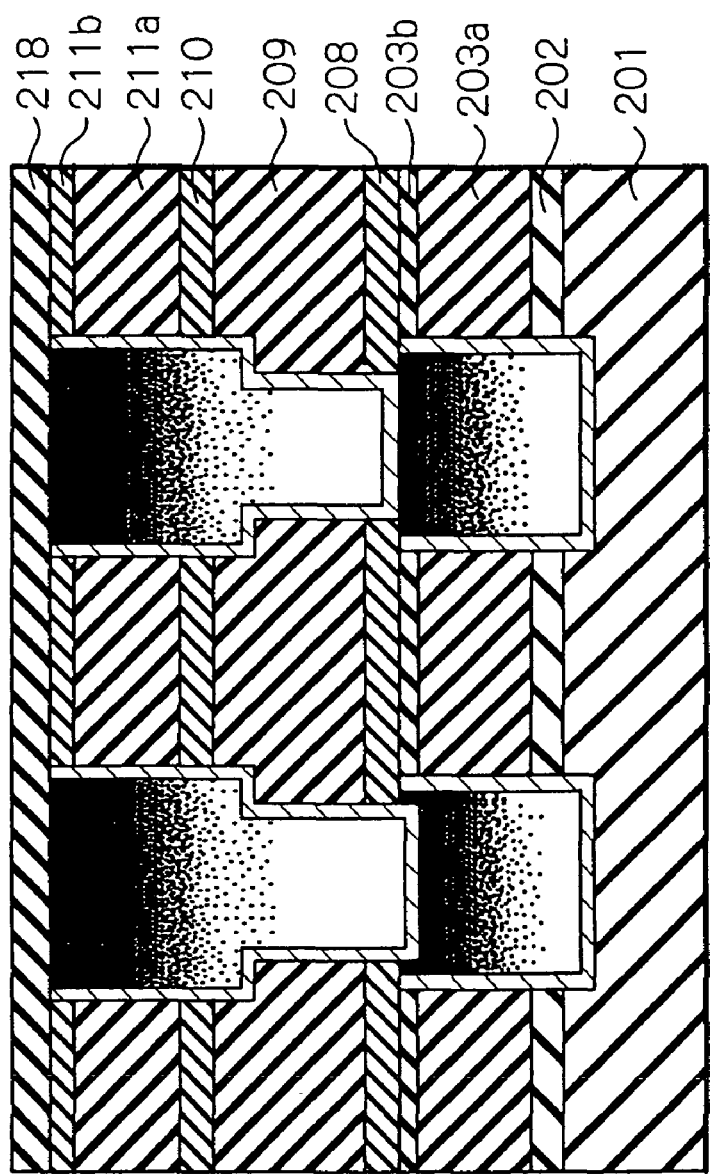

FIGS. 10A through 10V are cross-sectional views for explaining a third embodiment of the method for manufacturing a semiconductor device according to the present invention. In this case, a two-layer via first type dual-damascene structure is formed.

First, referring to FIG. 10A, an insulating underlayer 201 made of silicon dioxide or the like is formed on a silicon substrate (not shown) where various semiconductor elements are formed. Then, an about 50 nm thick etching stopper 202 made of SiCN is formed by a plasma CVD process on the insulating underlayer 201. Then, an about 300 nm thick insulating interlayer 203a made of a low-k material such as SiOF, SiOC, organic material or inorganic material such as ladder-type hydrogen siloxane having a lower dielectric constant than that of silicon dioxide is coated on the etching stopper 202. Then, an about 100 nm thick mask insulating layer 203b made of silicon dioxide is deposited by a plasma CVD process on the insulating interlayer 203a. Then, an anti-reflective coating layer 204 and a photoresist layer 205 are sequentially coated on the mask insulating layer 203b. Then, the photoresist layer 205 is patterned by a photolithography process, so that a groove 205a is formed in the photoresist layer 205.

Next, referring to FIG. 10B, the mask insulating layer 203b and the insulating interlayer 203a are etched by a dry etching process using the photoresist layer 205 as a mask.

Next, referring to FIG. 10C, the photoresist layer 205 and the anti-reflective layer 204 are ashed by a dry ashing process using $O_2$ gas plasma.

Next, referring to FIG. 10D, the etching stopper 202 is etched back by a dry etching process. Then, a wet stripping process is performed upon the mask insulating layer 203b and the insulating interlayer 203a and the insulating underlayer 201, so that residues of the dry etching process are completely removed.

Next, referring to FIG. 10E, an about 30 nm thick barrier metal layer 206 made of Ta on TaN and an about 100 nm thick seed copper layer 207a are sequentially deposited by a sputtering process on the entire surface. Then, an about 700 nm thick copper layer 207b is further deposited by an electroplating process using the seed copper layer 207a as a cathode electrode. Note that the copper layers 207a and 207b form a copper layer 207. Then, an annealing treatment is performed upon the copper layer 207 under a $N_2$ atmosphere to crystallize the copper layer 207 at a temperature of about 400° C. for about 30 minutes.

Next, referring to FIG. 10F, the copper layer 207 and the barrier metal layer 206 on the insulating interlayer 203b are removed by a CMP process.

Next, referring to FIG. 10G, the semiconductor device is cleaned and rinsed. In this case, since Cu oxide (not shown) is grown on the copper layer 207 by pure water, the Cu oxide is removed by a solution of oxalic acid. Then, the semiconductor device is immersed into a 1% diluted solution of benzotriazole (BTA). As a result, BTA reacts with the Cu oxide, so that a BTA layer 207a serving as an oxidation barrier layer is formed on the copper layer 207. Note that the step of removing the Cu oxide by oxalic acid can be deleted.

Next, referring to FIG. 10H, the semiconductor device is put into the plasma CVD apparatus of FIG. 4. Then, in the plasma CVD apparatus of FIG. 4, a heating process is performed upon the BTA layer 207a for 2 minutes under the following conditions:
 temperature: 250 to 400° C.
 $N_2$ gas: 0 to 5000 sccm
 processing pressure: 0 to 20 Torr (0 to 2666.4 Pa).

As a result, the BTA layer 207a is thermally decomposed and removed. In this case, the copper layer 207 includes no Cu silicide.

Subsequently, in the plasma CVD apparatus of FIG. 4, a heating process is performed upon the copper layer 207 under the following conditions:
 temperature: 250 to 400° C.
 $SiH_4$ gas: 10 to 1000 sccm
 $N_2$ gas: 0 to 5000 sccm
 processing pressure: 0 to 20 Torr (0 to 2666.4 Pa).

Thus, the copper layer 207 is converted into a silicon-diffused copper layer 221. Note that inorganic silane gas such as $Si_2H_6$ gas or $SiH_2Cl_2$ can be used instead of $SiH_4$ gas under the conditions that the temperature is 250 to 400° C. and the processing pressure is less than 20 Torr (2666 Pa), to decrease the processing time. Then, in the plasma CVD apparatus of FIG. 4, as occasion demands, a plasma process is further performed upon the silicon-diffused copper layer 221 and the mask insulating layer 203b for 3 seconds under the following conditions:
 $NH_3$ gas: 10 to 1000 sccm
 $N_2$ gas: 0 to 5000 sccm
 processing pressure: 0 to 20 Torr (0 to 2666.4 Pa)
 RF power: 50 to 500 W.

Thus, silicon (not shown) on the surfaces of the silicon-diffused copper layer 221 and the mask insulating layer 203b is nitrized. Note that the silicon on the surfaces can be etched by a plasma process using Ar gas.

Next, referring to FIG. 10I, in the plasma CVD apparatus of FIG. 4, a plasma process is carried out under the following conditions:
 $SiH(CH_3)_3$ gas: 10 to 1000 sccm
 $NH_3$ gas: 10 to 500 sccm
 He gas: 0 to 500 sccm
 processing pressure: 1 to 20 Torr (199.9 to 2666.4 Pa)
 RF power: 50 to 500 W.

Thus, an about 50 nm thick copper diffusion barrier layer 208 made of SiCN is deposited on the entire surface. In this case, the silicon on an upper side of the silicon-diffused copper layer 221 diffuses deeply thereinto. As a result, the Si component distribution within the silicon-diffused copper layer 221 is shown in FIG. 6 where an insulating underlayer ($SiO_2$) is in direct contact with a silicon-diffused copper layer without a barrier metal layer. That is, the deeper the location of the silicon-diffused copper layer 221, the smaller the concentration of Si. As a result, the contact characteristics between the silicon-diffused copper layer 221 and the copper diffusion barrier layer 208 can be improved. Also, the ratio of silicon component to copper component is caused to be lower than 8 atoms %, so that no Cu silicide having a large resistance is generated (see Cu—Si phase diagram of FIG. 7).

Next, referring to FIG. 10J, an about 400 nm thick insulating interlayer 209 made of silicon dioxide and an about 50 nm thick etching stopper 210 made of SiCN are deposited on the copper diffusion barrier layer 208. Then, an about 300 nm thick insulating interlayer 211a made of a low-k material such as SiOF, SiOC, organic material or inorganic material such as ladder-type hydrogen siloxane having a lower dielectric constant than that of silicon dioxide is coated on the etching stopper 210. Then, an about 100 nm thick mask insulating layer 211b made of silicon dioxide is deposited by a plasma CVD process on the insulating interlayer 211a. Then, an anti-reflective layer 212 and a photoresist layer 213 are sequentially coated on the insulating interlayer 211b. Then, the photoresist layer 213 is patterned by a photolithography process, so that a via hole 213a is formed in the photoresist layer 213.

Next, referring to FIG. 10K, the mask insulating layer 211b, the insulating interlayer 211a, the etching stopper 210 and the insulating interlayer 209 are etched by a dry etching process using the photoresist layer 213 as a mask. In this case, since the copper diffusion-barrier layer 208 is an incomplete etching stopper, the copper diffusion barrier layer 208 may be also etched as indicated by X.

Next, referring to FIG. 10L, the photoresist layer 213 and the anti-reflective layer 212 are ashed by a dry ashing process using $O_2$ gas plasma. In this case, since the silicon concentration of the silicon-diffused copper layer 221 on the surface thereof is high, and the electronegativity of Si is larger than that of Cu, the Si component of the exposed portion of the silicon-diffused copper layer 221 is oxidized, so that a silicon oxide layer 221a is grown in the silicon-diffused copper layer 221 in self-alignment with the via hole 213a. The silicon oxide layer 221a serves as a copper oxidation barrier layer.

Next, referring to FIG. 10M, an anti-reflective layer 214 and a photoresist layer 215 are sequentially coated on the entire surface. Then, the photoresist layer 215 is patterned by a photolithography process so that a groove 215a is formed in the photoresist layer 215. In this case, the anti-reflective layer 214 is buried in the via hole 213a.

Next, referring to FIG. 10N, the mask insulating layer 211b, the insulating interlayer 211a and the etching stopper 210 are etched by a dry etching process using CF based gas plasma and using the photoresist layer 215 as a mask.

Next, referring to FIG. 10O, the photoresist layer 215 and the anti-reflective layer 214 are ashed by a dry ashing process using $O_2$ gas plasma. In this case, since the silicon oxide layer 221a serves as an oxidation barrier layer, the silicon-diffused copper layer 221 is hardly oxidized.

Next, referring to FIG. 10P, the copper diffusion barrier layer 208 is etched back by a dry etching process. Then, a wet stripping process is performed upon the mask insulating layer 211b, the insulating interlayer 211a, the etching stopper 210, the insulating interlayer 209, and the copper diffusion barrier layer 208, so that residues of the dry etching process is completely removed.

Note that the process as illustrated in FIG. 10P can be carried out before the process as illustrated in FIG. 10O.

Next, referring to FIG. 10Q, the silicon oxide layer 221a is etched by a plasma etching process.

Next, referring to FIG. 10R, an about 30 nm thick barrier metal layer 216 made of Ta on TaN and an about 100 nm thick seed copper layer 217a are sequentially deposited by a sputtering process on the entire surface. Then, an about 700 nm thick copper layer 217b is further deposited by an electroplating process using the seed copper layer 217a as a cathode electrode. Note that the copper layers 217a and 217b form a copper layer 217. Then, an annealing treatment is performed upon the copper layer 217 under a $N_2$ atmosphere to crystallize the copper layer 217 at a temperature of about 400° C. for about 30 minutes.

Next, referring to FIG. 10S, the copper layer 217 and the barrier metal layer 216 on the insulating interlayer 110 are removed by a CMP process.

Next, referring to FIG. 10T, the semiconductor device is cleaned and rinsed. In this case, since Cu oxide (not shown) is grown on the copper layer 217 by pure water, the Cu oxide is removed by a solution of oxalic acid. Then, the semiconductor device is immersed into a 1% diluted solution of benzotriazole (BTA). As a result, BTA reacts with the Cu oxide, so that a BTA layer 217a serving as an oxidation barrier layer is formed on the copper layer 217. Note that the step of removing the Cu oxide by oxalic acid can be deleted.

Next, referring to FIG. 10U, the semiconductor device is put into the plasma CVD apparatus of FIG. 4. Then, in the plasma CVD apparatus of FIG. 4, a heating process is performed upon the BTA layer 217a for 2 minutes under the following conditions:
    temperature: 250 to 400° C.
    $N_2$ gas: 0 to 5000 sccm
    processing pressure: 0 to 20 Torr (0 to 2666.4 Pa).

As a result, the BTA layer 217a is thermally decomposed and removed. In this case, the copper layer 217 includes no Cu silicide.

Subsequently, in the plasma CVD apparatus of FIG. 4, a heating process is performed upon the copper layer 217 for 120 seconds under the following conditions:
    temperature: 250 to 400° C.
    $SiH_4$ gas: 10 to 1000 sccm
    $N_2$ gas: 0 to 4000 sccm
    processing pressure: 0 to 20 Torr (0 to 2666.4 Pa).

Thus, the copper layer 217 is converted into a silicon-diffused copper layer 222. Note that inorganic silane gas such as $Si_2H_6$ gas or $SiH_2Cl_2$ can be used instead of $SiH_4$ gas under the conditions that the temperature is 250 to 400° C. and the processing pressure is less than 20 Torr (2666 Pa), to decrease the processing time. Then, in the plasma CVD apparatus of FIG. 4, as occasion demands, a plasma process is further performed upon the silicon-diffused copper layer 222 and the mask insulating layer 211b for 3 seconds under the following conditions:
    $NH_3$ gas: 10 to 1000 sccm
    $N_2$ gas: 0 to 5000 sccm
    processing pressure: 0 to 20 Torr (0 to 2666.4 Pa)
    RF power: 50 to 500 W.

Thus, silicon (not shown) on the surfaces of the silicon-diffused copper layer 222 and the mask insulating layer 211b is nitrized. Note that the silicon on the surfaces can be etched by a plasma process using Ar gas.

Finally, referring to FIG. 10V, in the plasma CVD apparatus of FIG. 4, a plasma process is carried out under the following conditions:
    $SiH(CH_3)_3$ gas: 10 to 1000 sccm
    $NH_3$ gas: 10 to 500 sccm
    He gas: 0 to 5000 sccm
    processing pressure: 1 to 20 Torr (199.9 to 2666.4 Pa)
    RF power: 50 to 500 W.

Thus, an about 50 nm thick copper diffusion barrier layer 218 made of SiCN is deposited on the entire surface. In this case, the silicon on an upper side of the silicon-diffused copper layer 222 diffuses deeply thereinto. As a result, the Si component distribution within the silicon-diffused copper layer 222 is shown in FIG. 6. That is, the deeper the location of the silicon-diffused copper layer 222, the smaller the concentration of Si. As a result, the contact characteristics between the silicon-diffused copper layer 222 and the copper diffusion barrier layer 218 can be improved. Also, the ratio of silicon component to copper component is caused to be lower than 8 atoms %, so that no Cu silicide having a large resistance is generated (see Cu—Si phase diagram of FIG. 7).

Note that the copper diffusion barrier layers 208 and 218 can be made of SiC, SiCN, SiOC or organic material such as benzocrycrobutene by a plasma process in the plasma CVD apparatus of FIG. 4. Also, each of the copper diffusion barrier layers 208 and 218 can be a multiple layer of SiC, SiCN, SiOC and the above-mentioned organic material.

In the method as illustrated in FIGS. 10A through 10V, the etching stopper 210 can be deleted.

Even in the method as illustrated in FIGS. 10A through 10V, since the three processes for each of the silicon-diffused copper layers 221 and 222 are sequentially carried out in the plasma CVD apparatus of FIG. 4 without exposing the semiconductor device to the air, no oxide is grown between the silicon-diffused copper layers 221 and 222 and the copper diffusion barrier layers 208 and 218.

Figure 11:
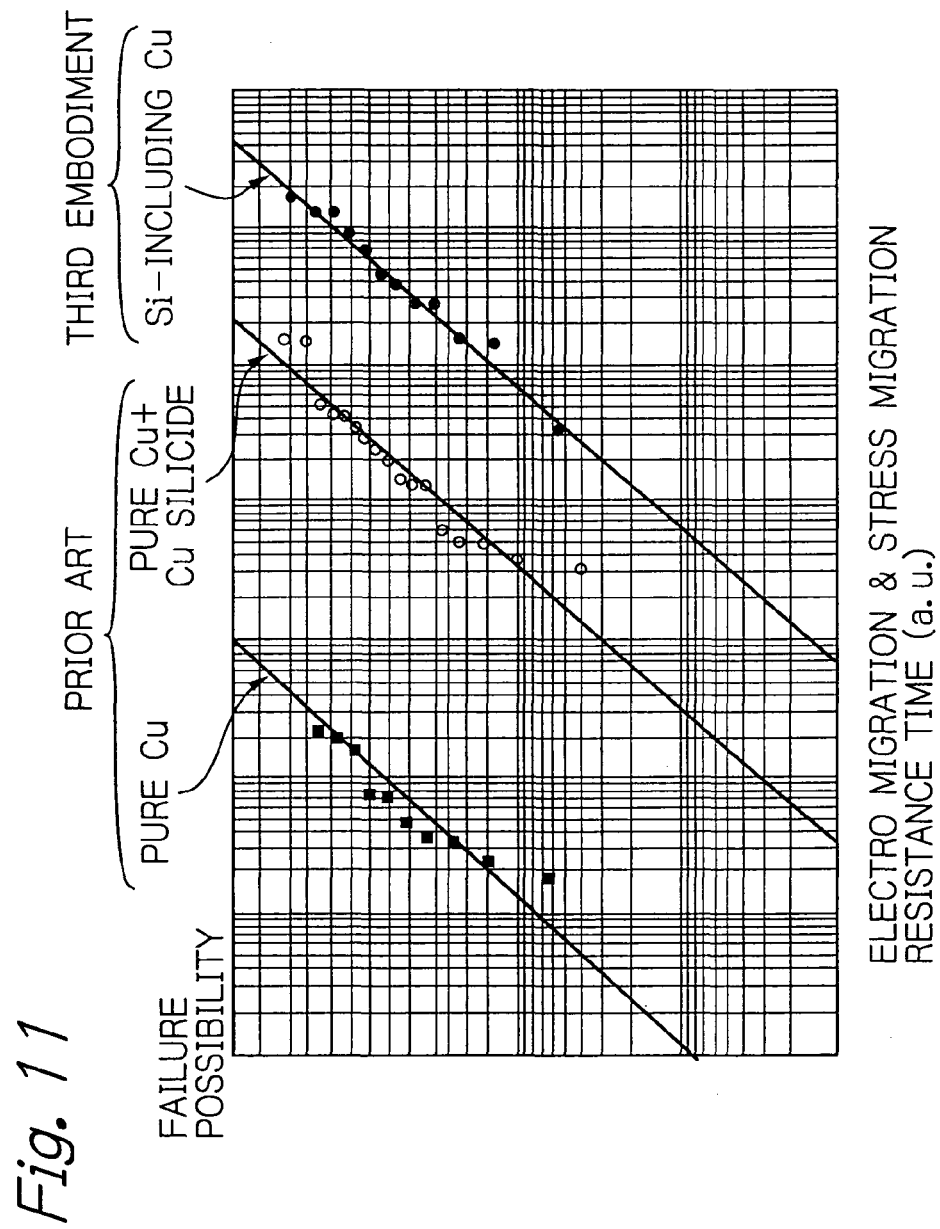
FIG. 11 is a graph showing the failure possibility characteristics of the semiconductor device obtained by the method as illustrated in FIGS. 10A through 10V.
Figure 12:
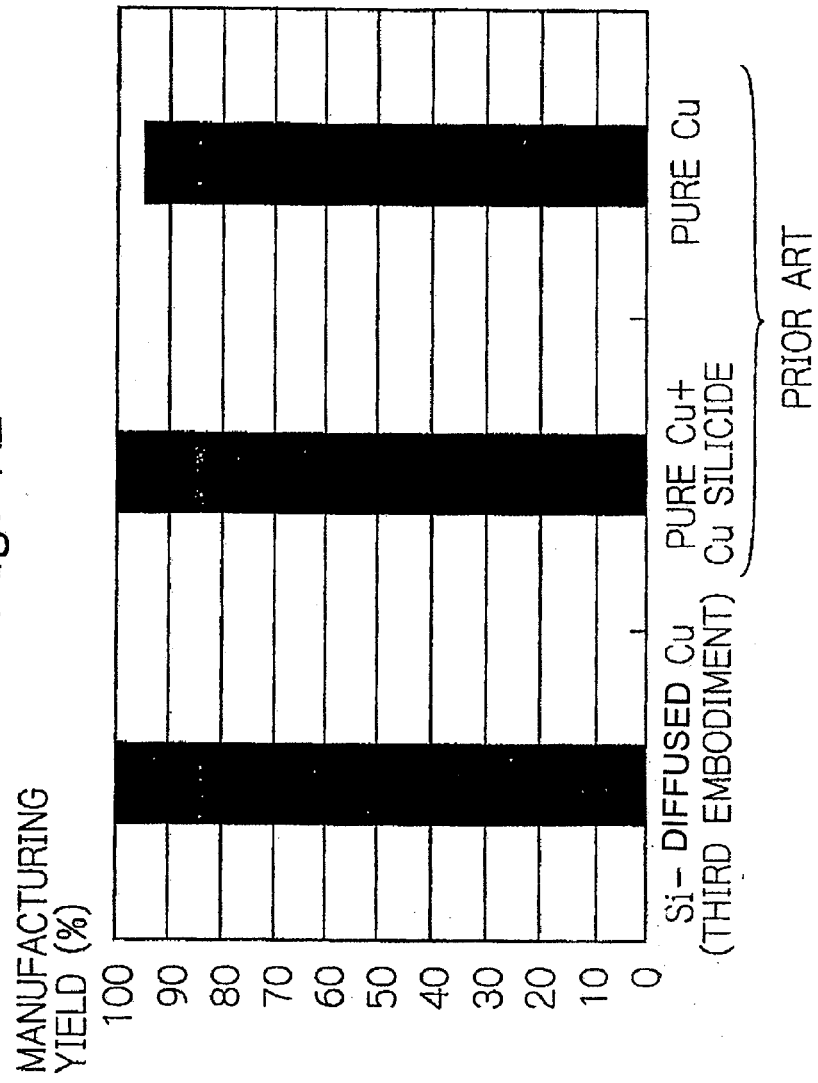
FIG. 12 is a graph showing the manufacturing yield characteristics of the semiconductor device obtained by the method as illustrated in FIGS. 10A through 10V.

Also, since silicon is diffused into the entirety of the silicon-diffused copper layers 221 and 222, the migration of copper atoms within the silicon-diffused copper layer 221 and 222 can be suppressed. Additionally, since the total amount of silicon in the silicon-diffused copper layers 221 and 222 is smaller than the total amount of silicon in the Cu silicide layer 108 of FIG. 1H, the increase of resistance in the wiring layer, i.e., the silicon-diffused copper layers 221 and 222 can be suppressed. As a result, as shown in FIG. 11, the electromigration and stress migration resistance time was improved as compared with cases where the layers 221 and 222 are made of pure Cu or pure Cu plus Cu silicide. Further, the oxidation of the silicon-diffused copper layers 221 and 222 is suppressed, which would increase the manufacturing yield as shown in FIG. 12.

The modification as illustrated in FIGS. 8A and 8B using a solution of oxalic acid and a solution of benzotriazole (BTA) can also be applied to the method as illustrated in FIGS. 10A through 10V.

FIGS. 13A through 13F are cross-sectional views for explaining a fourth embodiment of the method for manufacturing a semiconductor device according to the present invention. In this case, a two-layer middle first type dual-damascene structure is formed.

First, the processes as illustrated in FIGS. 10A through 10I are carried out.

Next, referring to FIG. 13A, a photoresist layer 213 is coated on the etching stopper 210. Then, the photoresist layer 213 is patterned by a photolithography process, so that a via hole 213a is formed in the photoresist layer 213.

Figure 13B:
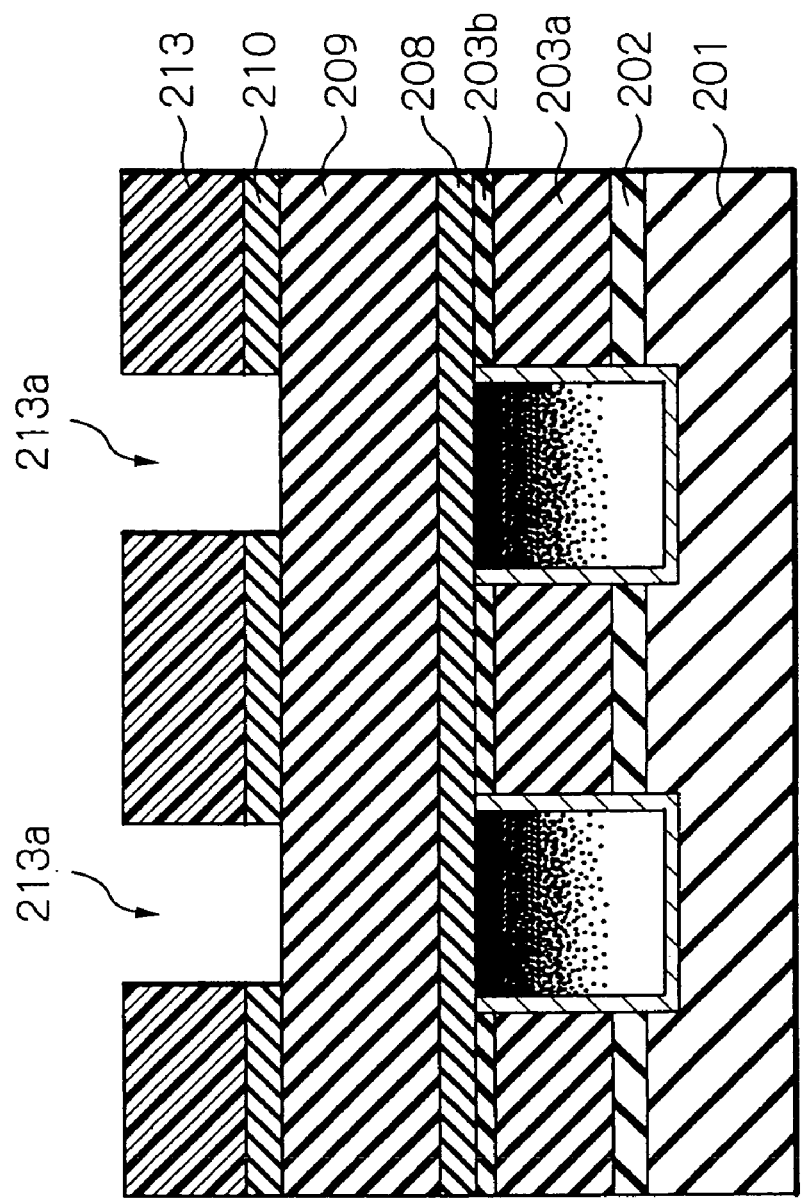

Next, referring to FIG. 13B, the etching stopper 210 is etched by a dry etching process using the photoresist layer 213 as a mask.

Next, referring to FIG. 13C, the photoresist layer 213 and the anti-reflective layer 212 are ashed by a dry ashing process using $O_2$ gas plasma.

Figure 13D:
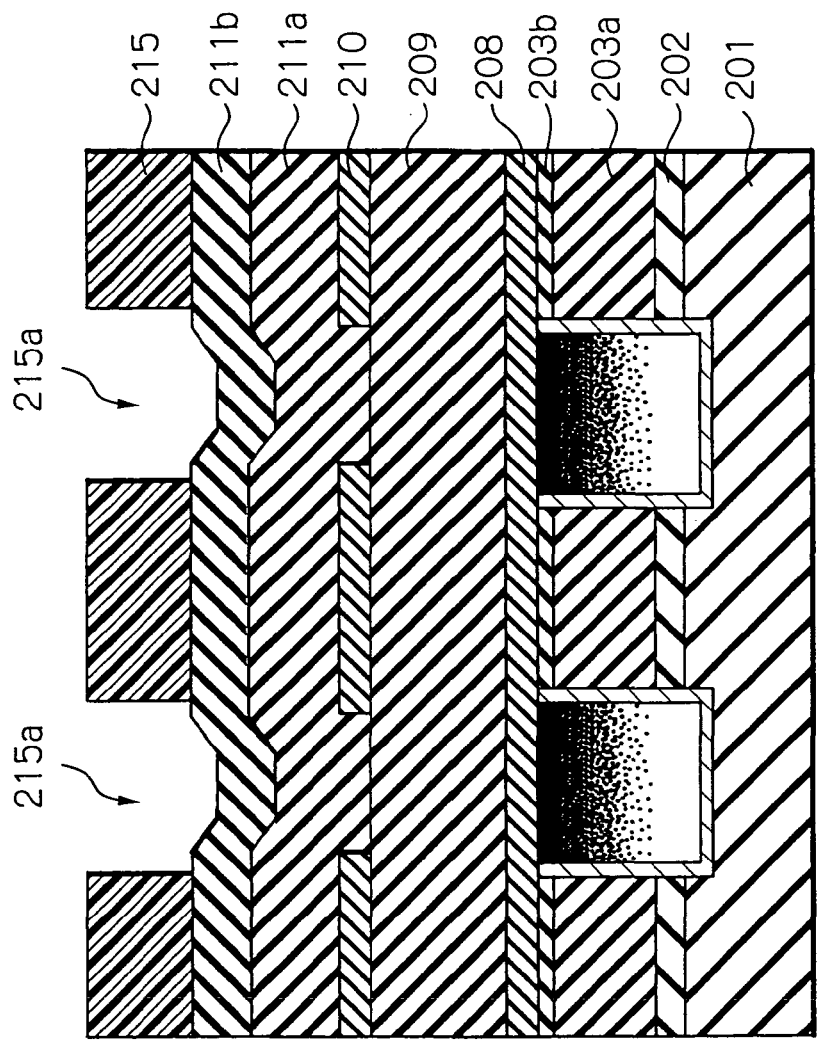

Next, referring to FIG. 13D, an about 300 nm thick insulating interlayer 211a made of a low-k material such as SiOF, SiOC, organic material or inorganic material such as ladder-type hydrogen siloxane having a lower dielectric constant than that of silicon dioxide is coated on the etching stopper 210. Then, an about 100 nm thick mask insulating layer 211b made of silicon dioxide is deposited by a plasma CVD process on the insulating interlayer 211a. Then, a photoresist layer 215 is coated on the entire surface. Then, the photoresist layer 215 is patterned by a photolithography process so that a groove 215a is formed in the photoresist layer 215.

Next, referring to FIG. 13E, the mask insulating layer 211b, the insulating interlayer 211a, the etching stopper 210 and the copper diffusion barrier layer 208 are etched by a dry etching process using CF based gas plasma and using the photoresist layer 215 as a mask. In this case, since the copper diffusion barrier layer 208 is an incomplete etching stopper, the copper diffusion barrier layer 208 may be also etched as indicated by X.

Next, referring to FIG. 13F, the photoresist layer 215 is ashed by a dry ashing process using $O_2$ gas plasma. In this case, since the silicon oxide layer 221a serves as an oxidation barrier layer, the silicon-diffused copper layer 221 is hardly oxidized.

After that, the processes as illustrated in FIGS. 10P, 10Q, 10R, 10S, 10T, 10U and 10V are carried out. In this case, the process as illustrated in FIG. 10P can be carried out before the process as illustrated in FIG. 13F.

In the method as illustrated in FIGS. 10A through 10I, FIGS. 13A through 13F and FIGS. 10P through 10V, the etching stopper 210 can be deleted.

Even in the method as illustrated in FIGS. 10A through 10I, FIGS. 13A through 13F and FIGS. 10P through 10V, since the three processes for each of the silicon-diffused copper layers 221 and 222 are sequentially carried out in the plasma CVD apparatus of FIG. 4 without exposing the semiconductor device to the air, no oxide is grown between the silicon-diffused copper layers 221 and 222 and the copper diffusion barrier layers 208 and 218.

Also, since silicon is diffused into the entirety of the silicon-diffused copper layers 221 and 222, the migration of copper atoms within the silicon-diffused copper layer 221 and 222 can be suppressed. Additionally, since the total amount of silicon in the silicon-diffused copper layers 221 and 222 is smaller than the total amount of silicon in the Cu silicide layer 108 of FIG. 1H, the increase of resistance in the wiring layer, i.e., the silicon-diffused copper layers 221 and 222 can be suppressed. As a result, as shown in FIG. 11, the electromigration and stress migration resistance time was improved as compared with cases where the layers 221 and 222 are made of pure Cu or pure Cu plus Cu silicide. Further, the oxidation of the silicon-diffused copper layers 221 and 222 is suppressed, which would increase the manufacturing yield as shown in FIG. 12.

The modification as illustrated in FIGS. 8A and 8B using a solution of oxalic acid and a solution of benzotriazole (BTA) can also be applied to the method as illustrated in FIGS. 10A through 10I, FIGS. 13A through 13F and FIGS. 10P through 10V.

In FIG. 13A, the photoresist layer 213 is coated directly on the etching stopper 210 made of SiCN without an anti-reflective layer. This is because the etching stopper 210 is hydrophilic so that the wettability of an anti-reflective layer to the etching stopper 210 deteriorates, thus inviting an unevenness of the anti-reflective layer. Additionally, when the anti-reflective layer is removed, the etching stopper 210 may be damaged. On the other hand, the photoresist layer 215 is coated directly on the insulating interlayer 211b made of silicon dioxide without an anti-reflective layer. This is because the insulating interlayer 211b has a large recess in which a large amount of the anti-reflective layer may be filled, thus failing in the dry etching process as illustrated in FIG. 13E.

Figure 14:
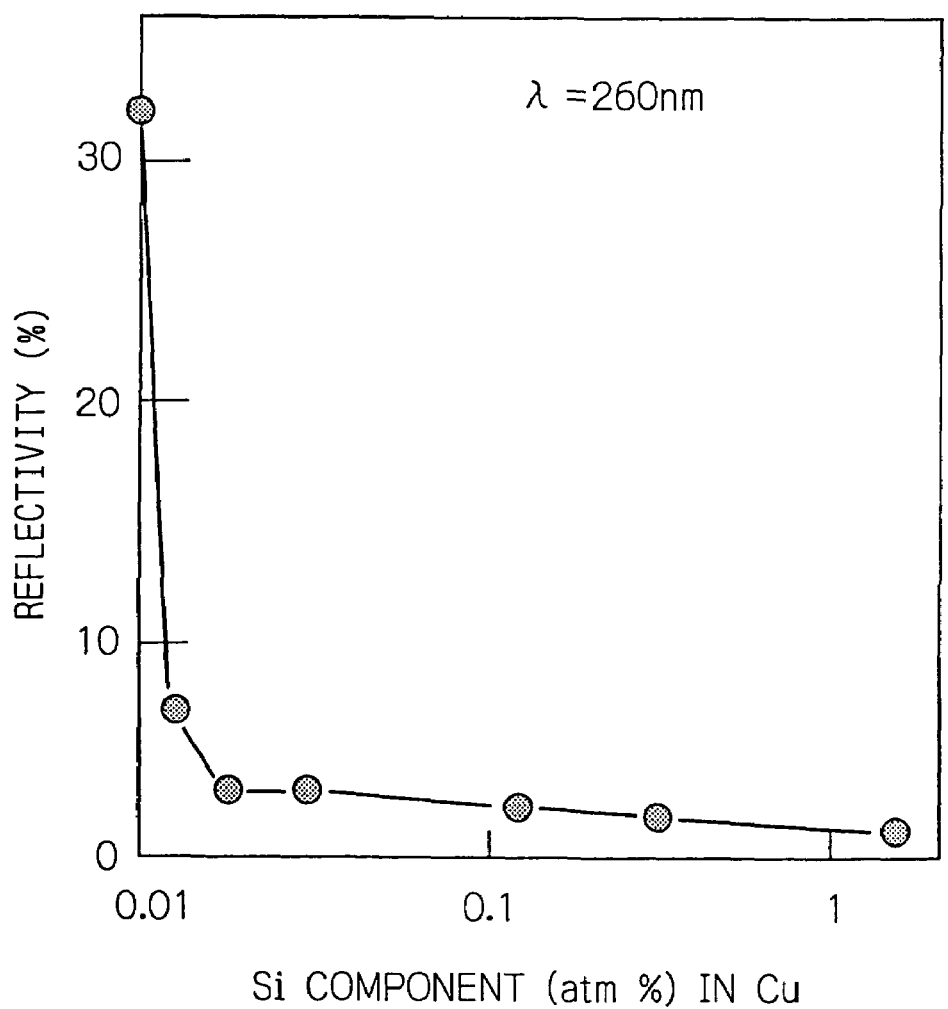
FIG. 14 is a graph showing reflectivity characteristics of pure Cu and silicon-diffused Cu.

The absence of such anti-reflective layers can be compensated for by the silicon-diffused copper layer 211 which has a low reflectivity characteristics as shown in FIG. 14, where pure Cu has a reflectivity of 32%, while silicon-diffused Cu has a reflectivity of less than 2%.

Thus, the improved photolithography processes can improve the manufacturing yield and the reliability.

FIGS. 15A through 15F are cross-sectional views for explaining a fifth embodiment of the method for manufacturing a semiconductor device according to the present invention. In this case, a two-layer trench first type dual-damascene structure is formed.

First, the processes as illustrated in FIGS. 10A through 10I are carried out.

Next, referring to FIG. 15A, an about 400 nm thick insulating interlayer 209 made of silicon dioxide and an about 50 nm thick etching stopper 210 made of SiCN are deposited on the copper diffusion barrier layer 208. Then, an about 300 nm thick insulating interlayer 211a made of a low-k material such as SiOF, SiOC, organic material or organic material such as ladder-type hydrogen siloxane having a lower dielectric constant than that of silicon dioxide is coated on the etching stopper 210. Then, an about 100 nm thick mask insulating layer 211b made of silicon dioxide is deposited by a plasma CVD process on the insulating interlayer 211a.

Next, referring to FIG. 15A, an anti reflective layer 214 and a photoresist layer 215 are sequentially coated on the insulating interlayer 211b. Then, the photoresist layer 215 is patterned by a photolithography process, so that a trench (groove) 215a is formed in the photoresist layer 215.

Figure 15B:
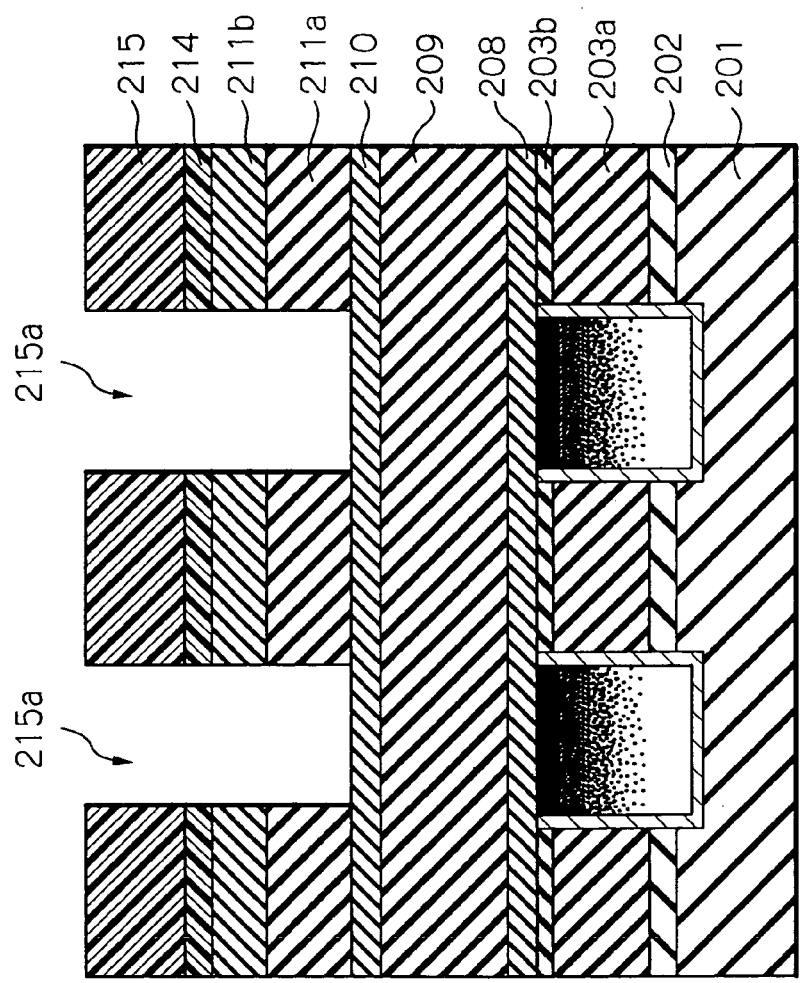

Next, referring to FIG. 15B, the anti-reflective layer 214, the mask insulating layer 211b and the insulating interlayer 211a are etched by a dry etching process using the photoresist layer 215 as a mask.

Next, referring to FIG. 15C, the photoresist layer 215 and the anti-reflective layer 214 are ashed by a dry ashing process using $O_2$ gas plasma.

Figure 15D:
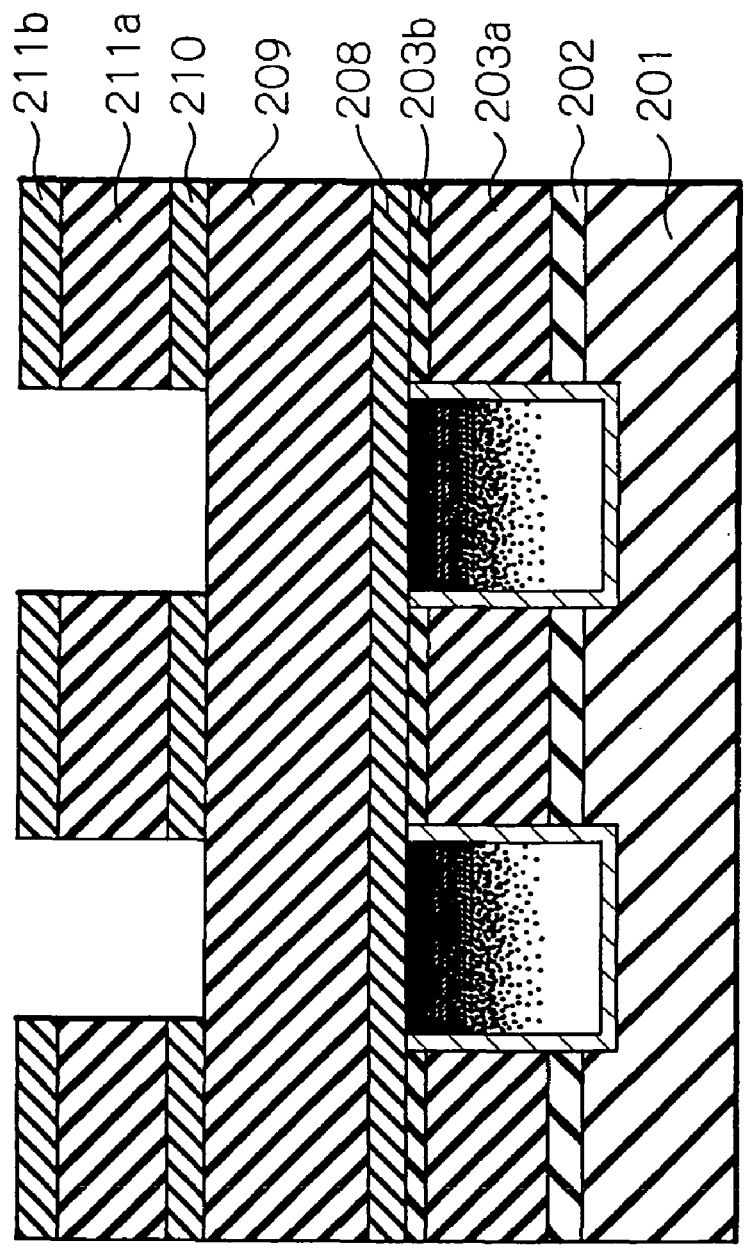

Next, referring to FIG. 15D, the etching stopper 210 is etched back by a dry etching process.

Note that the process as illustrated in FIG. 15D can be carried out before the process as illustrated in FIG. 15C.

Figure 15E:
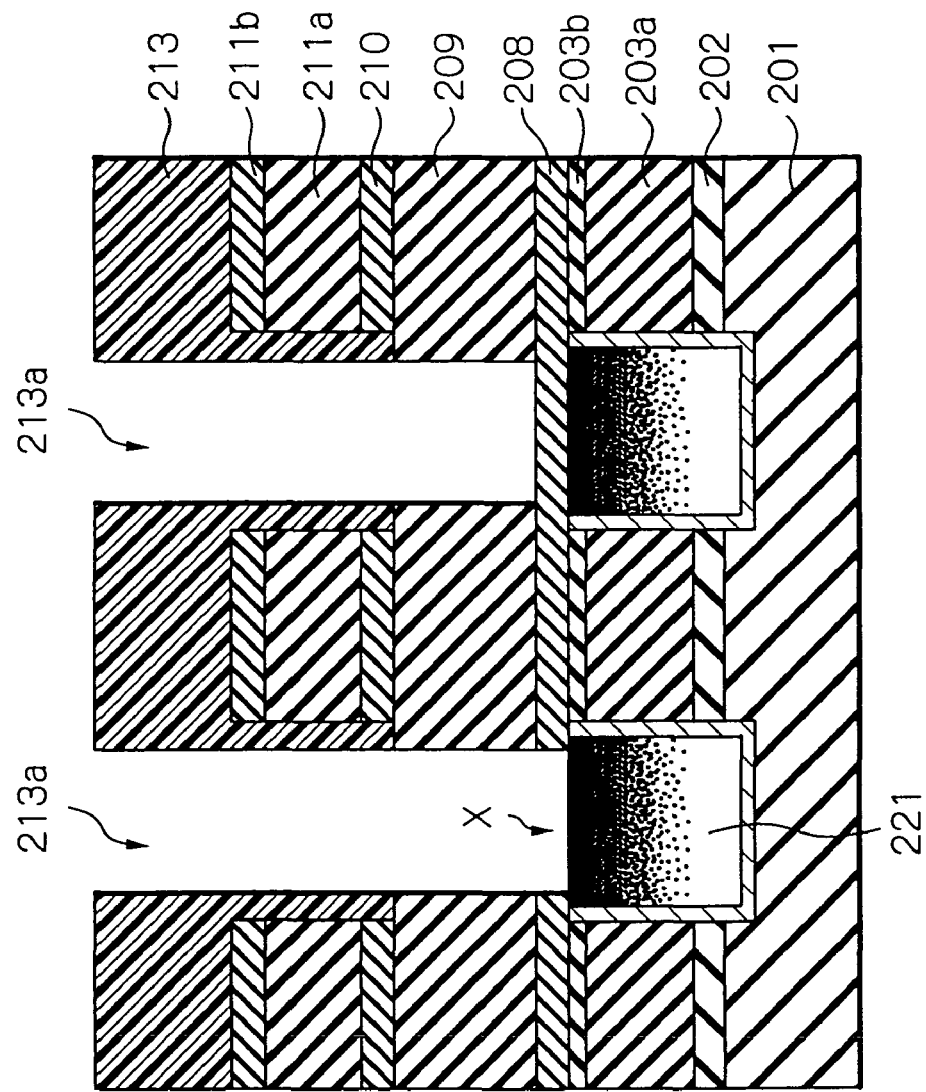

Next, referring to FIG. 15E, a photoresist layer 213 is coated on the entire surface. Then, the photoresist layer 213 is patterned by a photolithography process, so that a via hole 213a is formed in the photoresist layer 213.

Figure 15F:
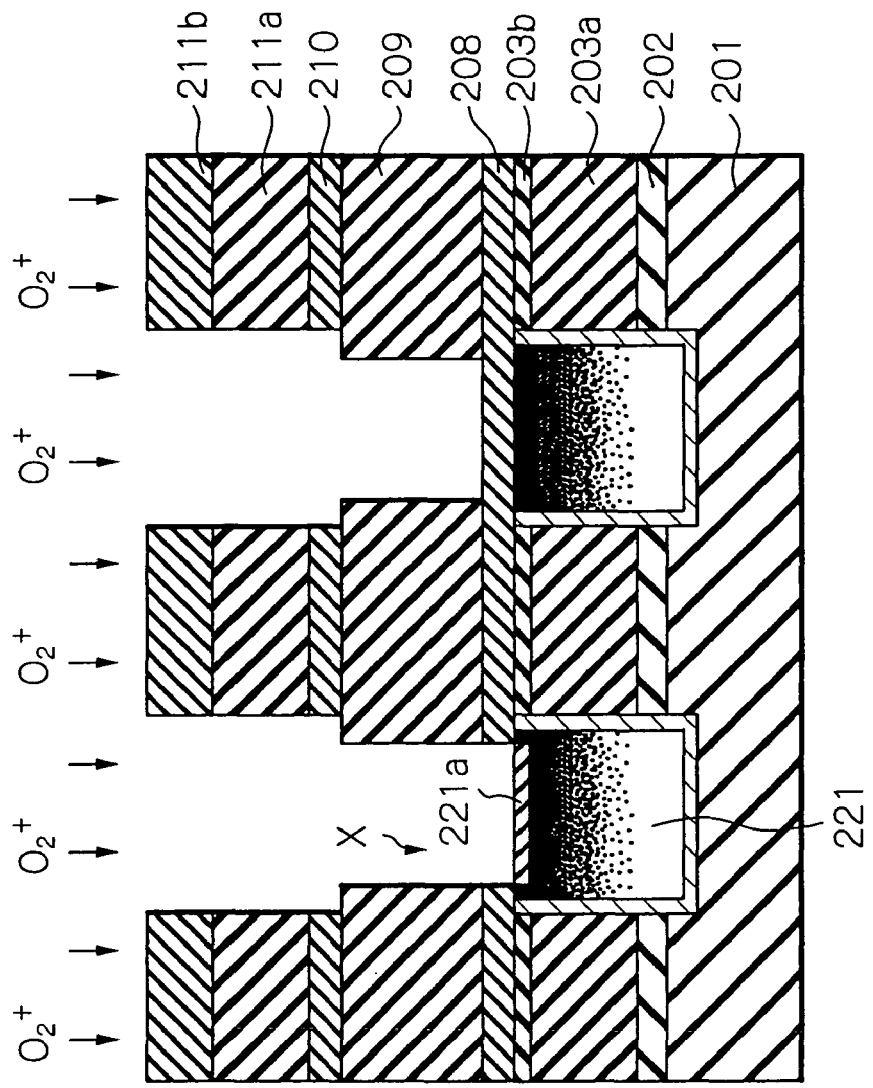

Next, referring to FIG. 15F, the insulating interlayer 209 is etched by a dry etching process using CF based gas plasma and using the photoresist layer 213 as a mask. In this case, the copper diffusion barrier layer 208 is an incomplete etching stopper, the copper diffusion barrier layer 208 may be also etched as indicated by X.

Next, referring to FIG. 15F, the photoresist layer 213 is ashed by a dry ashing process using $O_2$ gas plasma. In this case, the silicon oxide layer 221a serves as an oxidation barrier layer, the silicon-diffused copper layer 221 is hardly oxidized.

After that, the processes as illustrated in FIGS. 10P, 10Q, 10R, 10S, 10T, 10U and 10V are carried out. In this case, the process as illustrated in FIG. 10P can be carried out before the process as illustrated in FIG. 15F.

In the method as illustrated in FIGS. 10A through 10I, FIGS. 15A through 15F and FIGS. 10P through 10V, the etching stopper 210 can be deleted.

Even in the method as illustrated in FIGS. 10A through 10I, FIGS. 15A through 15F and FIGS. 10P through 10V, since the three processes for each of the silicon-diffused copper layers 221 and 222 are sequentially carried out in the plasma CVD apparatus of FIG. 4 without exposing the semiconductor device to the air, no oxide is grown between the silicon-diffused copper layers 221 and 222 and the copper diffusion barrier layers 208 and 218.

Also, since silicon is diffused into the entirety of the silicon-diffused copper layers 221 and 222, the migration of copper atoms within the silicon-diffused copper layer 221 and 222 can be suppressed. Additionally, since the total amount of silicon in the silicon-diffused copper layers 221 and 222 is smaller than the total amount of silicon in the Cu silicide layer 108 of FIG. 1H, the increase of resistance in the wiring layer, i.e., the silicon-diffused copper layers 221 and 222 can be suppressed. As a result, as shown in FIG. 11, the electromigration and stress migration resistance time was improved as compared with cases where the layers 221 and 222 are made of pure Cu or pure Cu plus Cu silicide. Further, the oxidation of the silicon-diffused copper layers 221 and 222 is suppressed, which would increase the manufacturing yield as shown in FIG. 12.

The modification as illustrated in FIGS. 8A and 8B using a solution of oxalic acid and a solution of benzotriazole (BTA) can also be applied to the method as illustrated in FIGS. 10A through 10I, FIGS. 15A through 15F and FIGS. 10P through 10V.

In the above-described embodiments, the silicon-diffused copper layers can be made of Cu alloys including at least one of Al, Ag, W, Mg, Fe, Ni, Zn, Pd, Cd, Au, Hg, Be, Pt, Zr, Ti and Sn.

Also, in the above-described embodiments, some of the insulating interlayers are made of silicon dioxide; however, such insulating interlayers can be made of a low-k material having a lower dielectric constant than that of silicon dioxide. In this case, a mask insulating layer can be formed thereon. Also, the mask insulating layer such as 203b can be made of SiC, SiCN or SiOC which has a high resistance characteristic against the $O_2$ dry ashing process and its subsequent wet removing process.

Also, in the above-described embodiments, the insulating interlayers made of a low-k material having a lower dielectric constant than that of silicon dioxide are preferably made of ladder-type hydrogen siloxane. The ladder-type hydrogen siloxane is also referred to as L-Ox™ (trademark of NEC Corporation). The ladder-type hydrogen siloxane has a structure as illustrated in FIG. 16A and characteristics as illustrated in FIG. 16B.

Figure 16A:
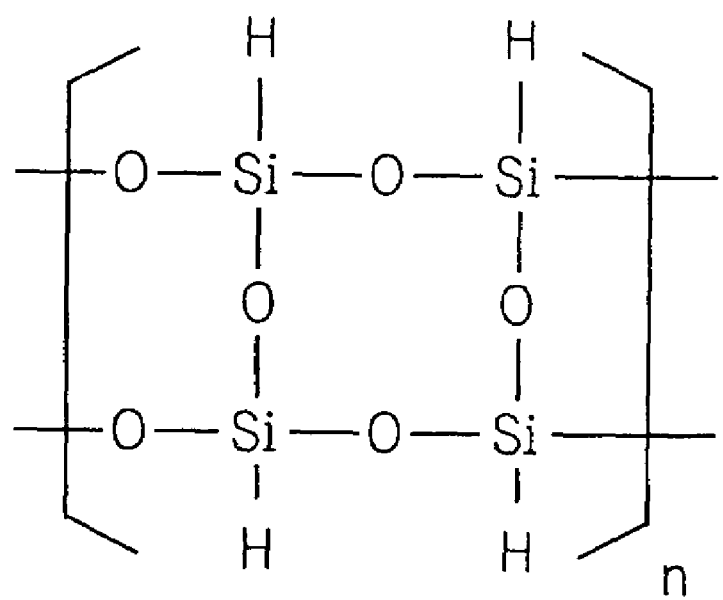
FIG. 16A is a diagram showing a chemical structure of ladder-type hydrogen siloxane.
Figure 16C:
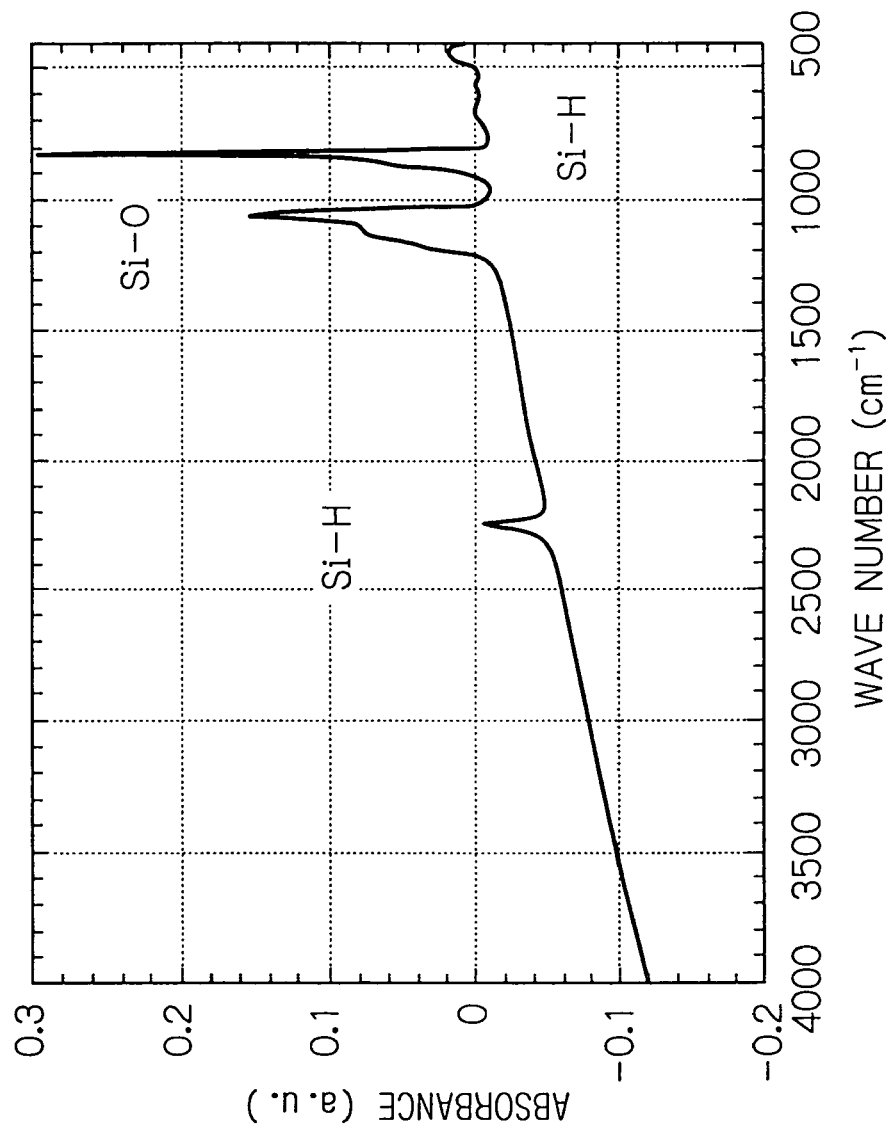
FIG. 16C is a graph showing the absorbance characteristics of the ladder-type hydrogen siloxane of FIG. 16A.

As illustrated in FIG. 16A, hydrogen atoms are two-dimensionally and partly located on the periphery in the ladder-type hydrogen siloxane. As a result, as illustrated in FIG. 16C which shows the absorbance characteristics of the ladder-type hydrogen siloxane, a sharp spectrum is observed at 830 $nm^{-1}$ and a weak spectrum is observed at 870 $nm^{-1}$, which shows the two-dimensional arrangement of hydrogen atoms.

Figure 16D:
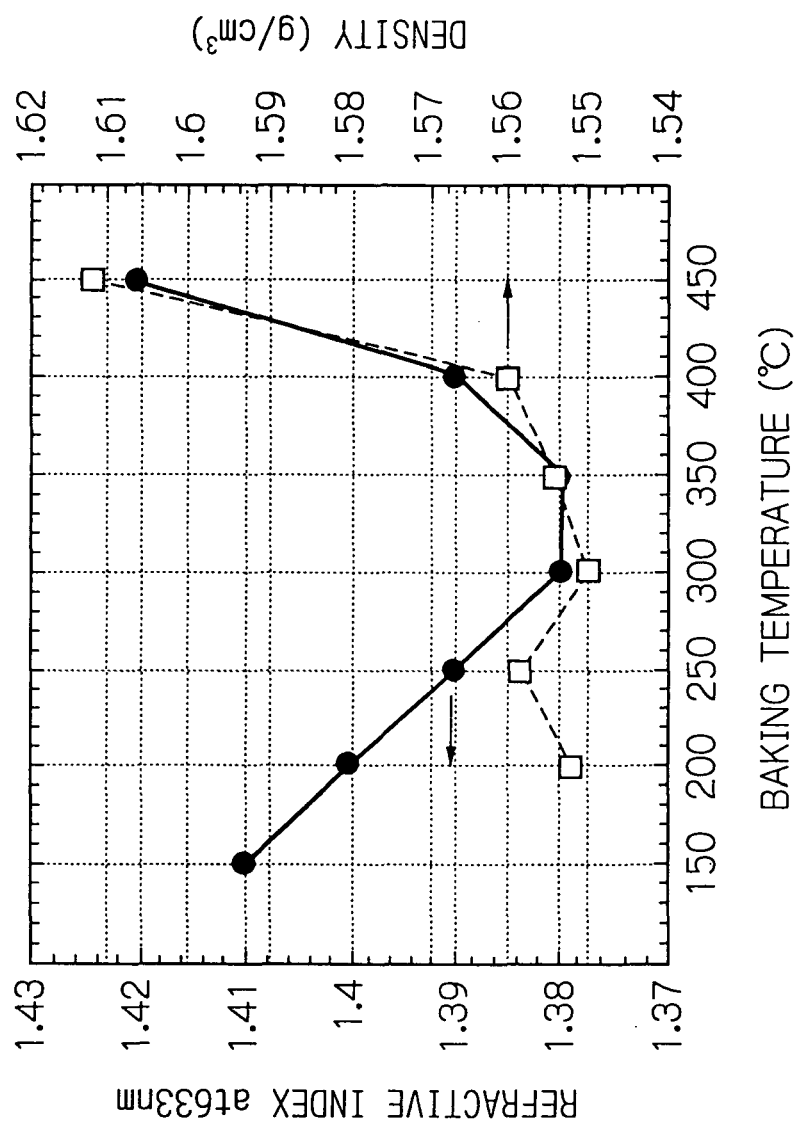
FIG. 16D is a graph showing the density and infractive index characteristics of the ladder-type hydrogen siloxane of FIG. 16A.

As illustrated in FIG. 16D which shows the density and refractive index characteristics of the ladder-type hydrogen siloxane, the density and refractive index characteristics are changed in accordance with the baking temperature. That is, when the baking temperature was smaller than 200° C. and larger than 400° C., the refractive index was larger than 1.40. Also, when the baking temperature was between 200° C. and 400° C., the refractive index was about 1.38 to 1.40. On the other hand, when the baking temperature was smaller than 200° C., the density could not be observed. When the baking temperature was larger than 400° C., the density was much larger than 1.60 $g/cm^3$. Also, when the baking temperature was 200° C. and 400° C., the density was about 1.50 to 1.58 $g/cm^3$. Note that when the baking temperature is smaller than 200° C., a spectrum by a bond of Si—O at 3650 $cm^{-1}$ was also observed.

Note that the refractive index directly affects the dielectric constant. In view of this, the ladder-type hydrogen siloxane used in the above-described embodiments preferably has a density of about 1.50 to 1.58 $g/cm^3$ and preferably has a refractive index of about 1.38 to 1.40.

Figure 17:
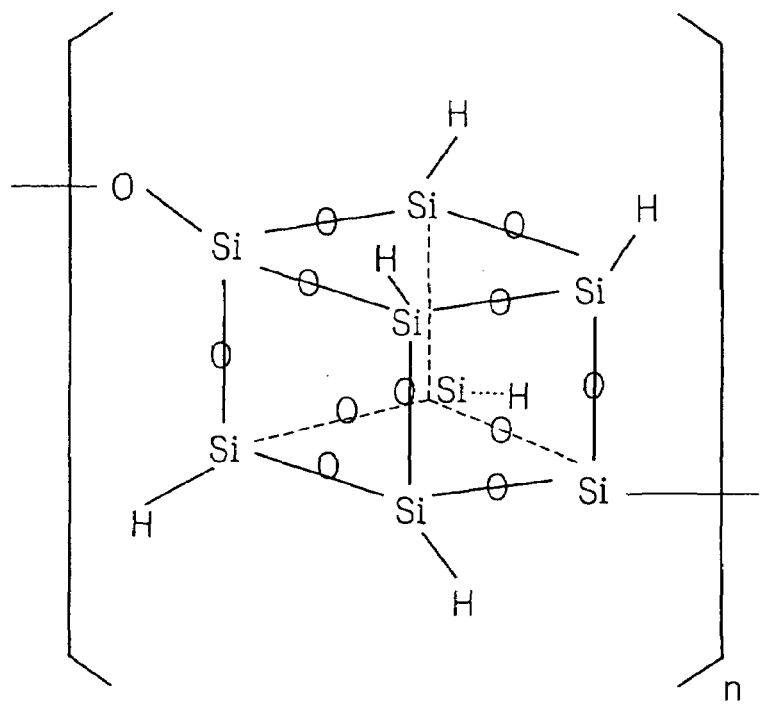
FIG. 17 is a diagram showing a chemical structure of hydrogen silsesquioxane (HSQ)

The features of the ladder-type hydrogen siloxane are explained next as compared with conventional cage type hydrogen silsesquioxane (HSQ) whose structure is illustrated in FIG. 17 (see: A. Nakajima, "Coating Layers", Semiconductor Technology Outlook, p. 432, FIG. 2, 1998), with reference to FIGS. 18, 19 and 20. Note that hydrogen atoms are partly located on the periphery of the ladder-type hydrogen siloxane, while hydrogen atoms are mostly located on the periphery of HSQ. Therefore, the hydrogen atoms in HSQ are considered to be reactive as compared with the hydrogen atoms in the ladder-type hydrogen siloxane, which may affect the features thereof.

First, samples were prepared by coating ladder-type hydrogen siloxane or HSQ on 300 nm thick semiconductor wafers and annealing them in a $N_2$ atmosphere at a temperature of about 400° C. for about 30 minutes.

Next, the inventors performed experiments upon the above-mentioned samples in the plasma CVD apparatus of FIG. 4 under the following conditions for converting Cu into silicon-diffused Cu:

temperature: 250 to 400° C.
    $SiH_4$ gas: 10 to 1000 sccm
    $N_2$ gas: 0 to 5000 sccm
    pressure: 0 to 20 Torr (0 to 2666.4 Pa).

Figure 18:
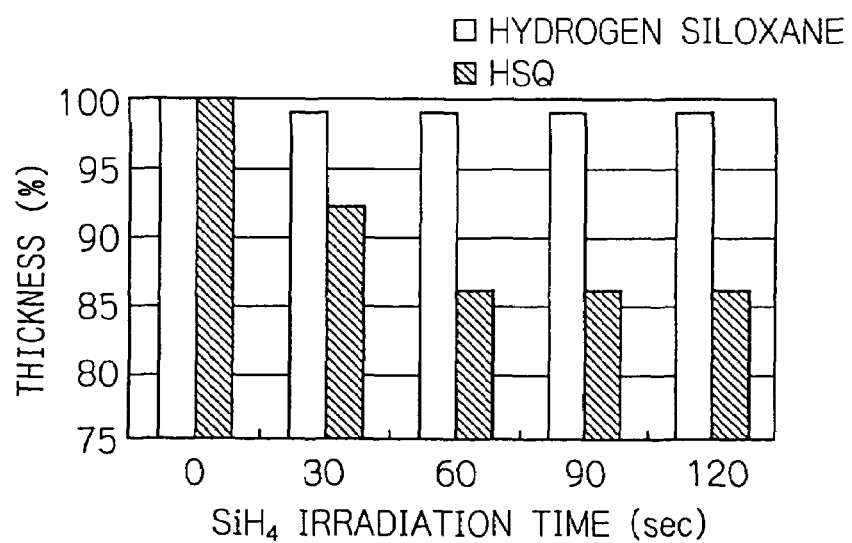

As illustrated in FIG. 18, when the SiH$_4$ gas irradiation time was increased, the thickness of HSQ was remarkably decreased. On the other hand, even when the SiH$_4$ gas irradiation time was increased, the thickness of ladder-type hydrogen siloxane was not decreased.

Figure 19:
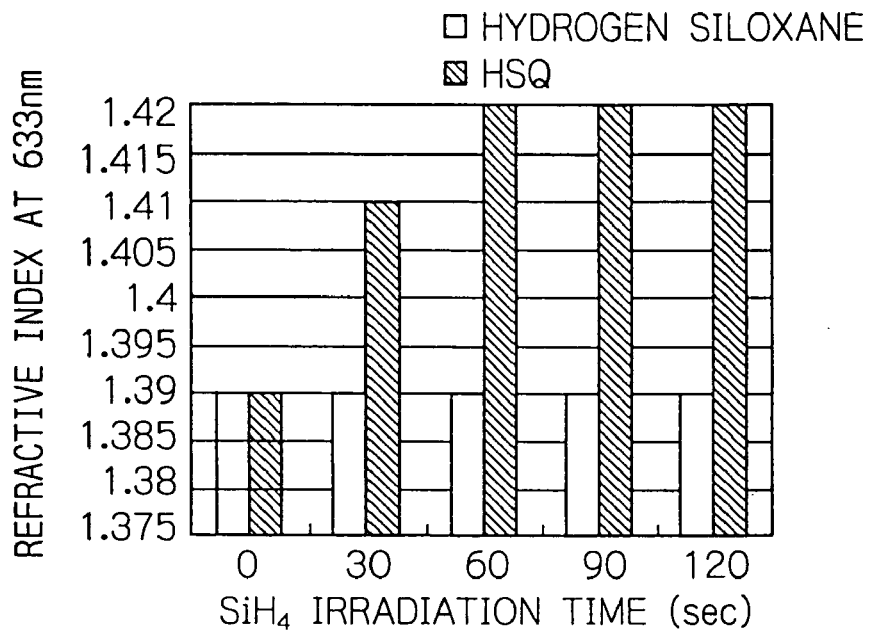
Figure 20:
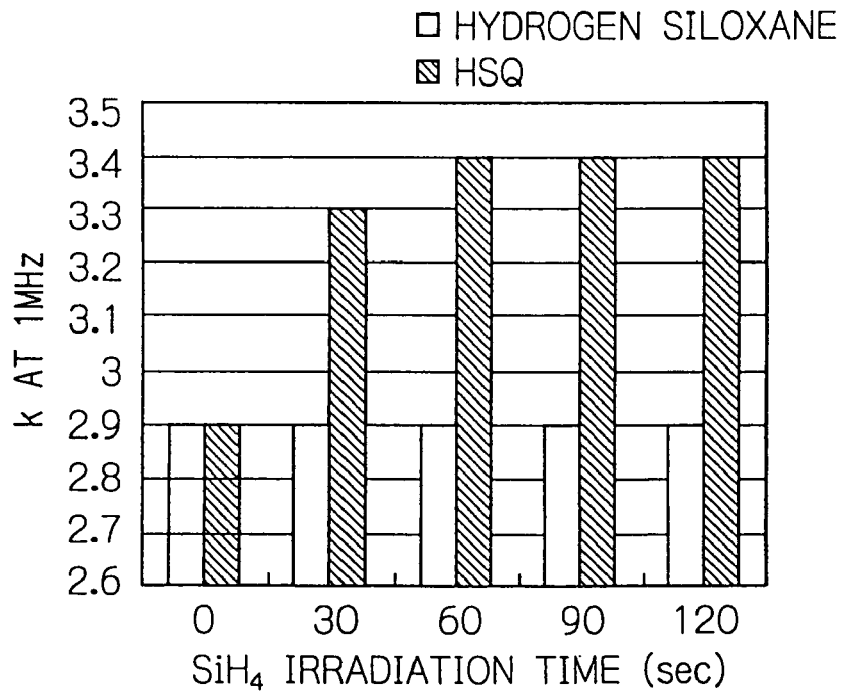

As illustrated in FIG. 19, when the SiH$_4$ gas irradiation time was increased, the refractive index of HSQ was remarkably increased. On the other hand, even when the SiH$_4$ gas irradiation time was increased, the refractive index of ladder-type hydrogen siloxane was not increased.

Figure 20:
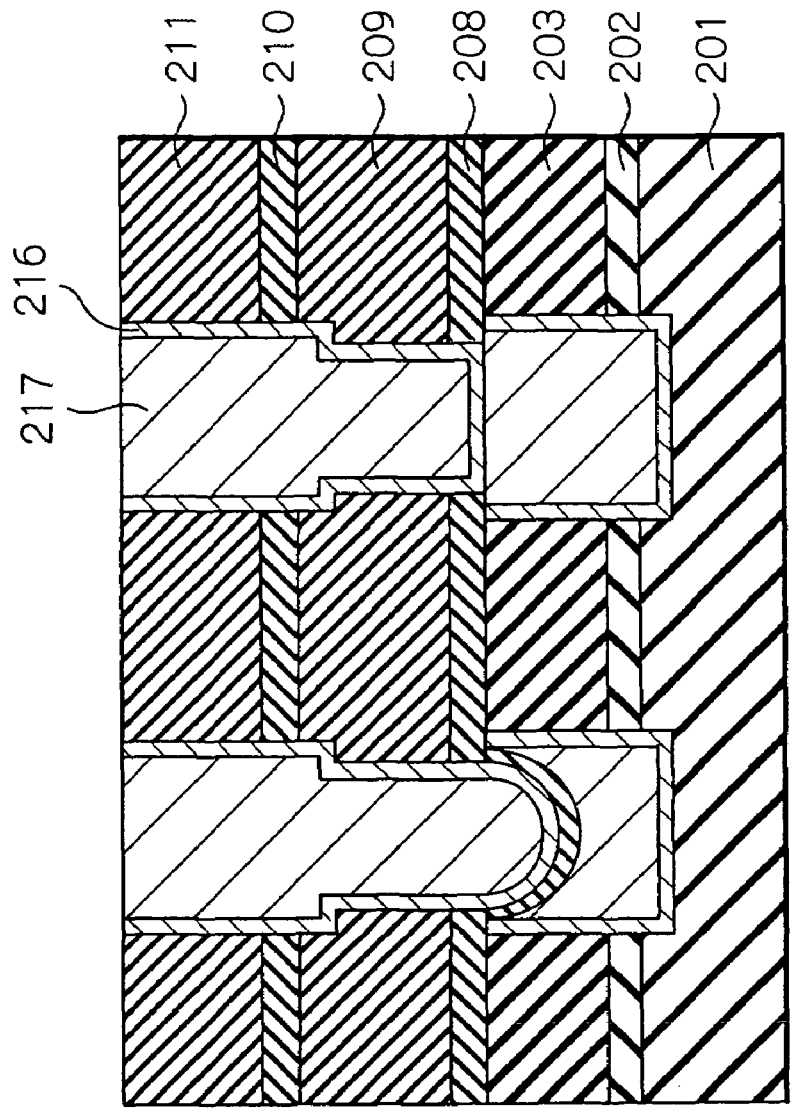
FIGS. 18, 19 and 20 are graphs showing the characteristics of the ladder-type hydrogen siloxane according to the present invention and hydrogen silsesquioxane (HSQ)

As illustrated in FIG. 20, when the SiH$_4$ gas irradiation time was increased, the relative dielectric constant of HSQ was remarkably increased. On the other hand, even when the SiH$_4$ gas irradiation time was increased, the relative dielectric constant of ladder-type hydrogen siloxane was not increased.

Porous ladder-type hydrogen siloxane had the same tendency as ladder-type hydrogen siloxane. Thus, porous ladder-type hydrogen siloxane can be used instead of ladder-type hydrogen siloxane.

Figures 21A, 21B:
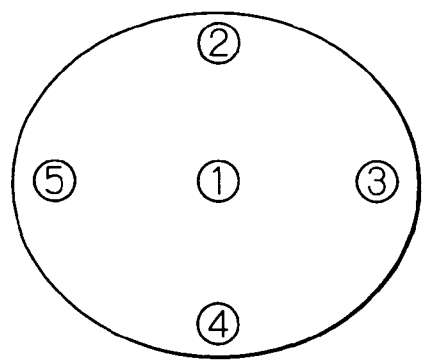
FIG. 21A is a diagram of a semiconductor wafer.
FIG. 21B is a table showing the etching amounts of the ladder-type hydrogen siloxane and HSQ on the semiconductor wafer of FIG. 21A.

Further, the above-mentioned ladder-type hydrogen siloxane has an excellent resistant for chemicals such as fluoric ammonium or diluted fluoric hydrogen (HF), as compared with HSQ. For example, when immersing a semiconductor device of FIG. 21A coated with ladder-type hydrogen siloxane or HSQ into a solution of fluoric ammonium or diluted fluoric hydrogen for a definite time, the etching amounts of the ladder-type hydrogen siloxane and HSQ were obtained as illustrated in FIG. 21B.

In the above-described embodiments, the mask insulating layers such as 203b on the insulating interlayers such as 203a made of a low-k material are made thin, so that the insulating interlayers such as 203a are actually exposed to SiH$_4$ gas. The inventors found that the parasitic capacitance of an insulating interlayer made of HSQ between two adjacent wiring layers at a line/space ratio of 0.2 μm/0.2 μm was decreased by 2 to 3% as compared with a case where the insulating interlayer was made of silicon dioxide. On the other hand, the parasitic capacitance of an insulating interlayer made of ladder-type hydrogen siloxane between two adjacent wiring layers at a line/space ratio of 0.2 μm/0.2 μm was decreased by 8 to 12% as compared with a case where the insulating interlayer was made of silicon dioxide. Also, the parasitic capacitance of an insulating interlayer made of porous ladder-type hydrogen siloxane between two adjacent wiring layers at a line/space ratio of 0.2 μm/0.2 μm was decreased by 15 to 20% as compared with a case where the insulating interlayer was made of silicon dioxide.

Further, when an insulating interlayer was made of methyl silsesquioxane or organic polymer including carbon atoms, Cu oxide was grown between a Cu (silicon-diffused copper) layer and its upper copper diffusion barrier layer. This is because such material including carbons atoms by the heat of the plasma CVD apparatus of FIG. 4 generates hydrocarbon gas rather than hydrogen gas so that the surface of Cu or silicon-diffused Cu is hardly reduced. On the other hand, when an insulating interlayer was made of ladder-type hydrogen siloxane or porous ladder-type hydrogen siloxane, no Cu oxide was grown between a Cu (silicon-diffused copper) layer and its upper copper diffusion barrier layer. This is because such material including carbons atoms by the heat of the plasma CVD apparatus of FIG. 4 generates much hydrogen gas so that the surface of Cu or silicon-diffused Cu is sufficiently reduced.

Additionally, each of the barrier metal layers can be a single layer or a multiple layer made of Ta, TaN, Ti, TiN, TaSiN and TiSiN.

Further, in the above-described embodiments, it is preferable that the copper layers 107, 134, 142, 207 and 217 include hydrogen. That is, at a step for depositing the copper diffusion barrier layers 109, 136, 144, 208 and 218 in the plasma CVD apparatus of FIG. 4, if there is a residual oxygen therein, oxidation occurs at the grain boundaries of Cu of the silicon-diffused copper layers 111, 135, 143, 221 and 222, thus creating Cu oxide. As a result, at a heating step using SiH$_4$ gas, the Cu oxide is easily converted into Cu silicide. On the other hand, when the copper layers 107, 134, 142, 207 and 217 include hydrogen so that the silicon-diffused copper layers 111, 135, 143, 221 and 222 include hydrogen, at a step for depositing the copper diffusion barrier layers 109, 136, 144, 208 and 218 in the plasma CVD apparatus of FIG. 4, even if there is a residual oxygen therein, oxidation hardly occurs at the grain boundaries of Cu of the silicon-diffused copper layers 111, 135, 143, 221 and 222, thus creating no Cu oxide. As a result, at a heating step using SiH$_4$ gas, no Cu silicide is created.

The hydrogen included in the copper layers 107, 134, 142, 207 and 217 was recognized by a thermal desorption spectroscopy (TDS) method or a secondary ion mass spectroscopy (SIMS) method.

Further, in order to improve the buried characteristics of the copper layers 107, 134, 142, 207 and 217, an electroplating process for depositing the copper layers 107, 134, 142, 207 and 217 uses a Cu plating solution including an organic component, so that the copper layers 107, 134, 142, 207 and 217 include carbon.

As explained hereinabove, according to the present invention, since no oxide is grown between a silicon-diffused metal layer and its upper metal diffusion barrier layer, the resistance of wiring layers can be decreased and the manufacturing yield can be increased.

The invention claimed is:

1. A semiconductor device comprising:
    an insulating underlayer;
    a first insulating interlayer formed on said insulating underlayer, said first insulating interlayer having a groove;
    a first metal layer having silicon atoms diffused within said first metal layer, and wherein said first metal layer is buried in said groove; and
    a first metal diffusion barrier layer formed on said first metal layer and said first insulating interlayer, wherein
    said first insulating interlayer comprises at least one layer selected from the group consisting of a SiO$_2$ layer, a SiOF layer, a SiOC layer, a ladder-type hydrogen siloxane layer and a porous ladder-type hydrogen siloxane layer.

2. The device as set forth in claim 1, wherein said ladder-type hydrogen siloxane layer comprises an L-OxTM layer.

3. The device as set forth in claim 1, wherein said ladder-type hydrogen siloxane layer has a density of about 1.50 g/cm$^3$ to 1.58 g/cm$^3$.

4. The device as set forth in claim 1, wherein said ladder-type hydrogen siloxane layer has a refractive index of about 1.38 to 1.40 at a wavelength of about 633 nm.

5. The device as set forth in claim 1, further comprising a mask insulating layer made of silicon dioxide formed on the one of said ladder-type hydrogen siloxane layer and said porous ladder-type hydrogen siloxane layer.

6. A semiconductor device comprising:
    an insulating underlayer;
    a first insulating interlayer formed on said insulating underlayer, said first insulating interlayer having a groove;

a first metal layer having silicon atoms diffused within said first metal layer, and wherein said first metal layer is buried in said groove; and a first metal diffusion barrier layer formed on said first metal layer and said first insulating interlayer, wherein said first metal diffusion barrier layer comprises at least one of a SiCN layer, a SiC layer, a SiOC layer and an organic material layer.

7. A semiconductor device comprising:

an insulating underlayer;

a first insulating interlayer formed on said insulating underlayer, said first insulating interlayer having a groove;

a first metal layer having silicon atoms diffused within said first metal layer, and wherein said first metal layer is buried in said groove;

a first metal diffusion barrier layer formed on said first silicon-diffused metal layer and said first insulating interlayer; and a first etching stopper between said insulating underlayer and said first insulating interlayer.

8. The device as set forth in claim 7, wherein said first etching stopper is a SiCN layer.

9. A semiconductor device comprising:

an insulating underlayer;

an insulating interlayer formed on said insulating underlayer, said insulating interlayer having a groove;

a barrier metal layer made of at least one of Ta, TaN, Ti, TiN, TaSiN and TiSiN formed within said groove;

a silicon-diffused copper layer including no copper silicide formed thereon and buried in said groove on said barrier metal layer, said silicon-diffused copper layer having a silicon component of less than 8 atoms %; and a copper diffusion barrier layer made of at least one of SiCN, SiC, SiOC and organic material and formed on said silicon-diffused copper layer and said insulating interlayer.

10. A semiconductor device comprising:

an insulating underlayer;

a first insulating interlayer formed on said insulating underlayer, said first insulating interlayer having a groove;

a first metal layer having silicon atoms diffused within said first metal layer, and wherein said first metal layer is buried in said groove; and a first metal diffusion barrier layer formed on said first metal layer and said first insulating interlayer, wherein said first silicon-diffused metal layer has a larger silicon concentration near an upper side thereof than near a lower side thereof.

11. A semiconductor device comprising:

an insulating underlayer;

a first insulating interlayer formed on said insulating underlayer, said first insulating interlayer having a groove;

a first metal layer having silicon atoms diffused within said first metal layer, and wherein said metal layer is buried in said groove; and a first metal diffusion barrier layer formed on said first metal layer and said first insulating interlayer, wherein said first metal diffusion barrier layer comprises at least one of a SiCN layer, a SiC layer, a SiOC layer and an organic material layer.

12. A semiconductor device comprising:

an insulating underlayer;

a first insulating interlayer formed on said insulating underlayer, said first insulating interlayer having a groove;

a first metal layer having silicon atoms diffused within said first metal layer, and wherein said metal layer is buried in said groove; and a first metal diffusion barrier layer formed on said first metal layer and said first insulating interlayer, further comprising a first etching stopper between said insulating underlayer and said first insulating interlayer.

13. A semiconductor device comprising:

an insulating underlayer;

a first insulating interlayer formed on said insulating underlayer, said first insulating interlayer having a groove;

a first metal layer having silicon atoms diffused within said first metal layer, and wherein said metal layer is buried in said groove; and a first metal diffusion barrier layer formed on said first metal layer and said first insulating interlayer, further comprising a first etching stopper between said insulating underlayer and said first insulating interlayer, wherein said first etching stopper layer is a SiCN layer.

* * * * *

UNITED STATES PATENT AND TRADEMARK OFFICE
CERTIFICATE OF CORRECTION

| | | |
|---|---|---|
| PATENT NO. | : 7,687,917 B2 | Page 1 of 1 |
| APPLICATION NO. | : 10/650193 | |
| DATED | : March 30, 2010 | |
| INVENTOR(S) | : Koichi Ohto et al. | |

It is certified that error appears in the above-identified patent and that said Letters Patent is hereby corrected as shown below:

On the title page, Item -56-, under FOREIGN APPLICATION PRIORITY DATA, delete "May 5, 2003" and insert -- May 8, 2003 --

Signed and Sealed this
Fifteenth Day of April, 2014

Michelle K. Lee
*Deputy Director of the United States Patent and Trademark Office*